United States Patent
Barna et al.

(10) Patent No.: US 7,224,566 B2
(45) Date of Patent: May 29, 2007

(54) INTERFACES BETWEEN SEMICONDUCTOR CIRCUITRY AND TRANSPINNOR-BASED CIRCUITRY

(75) Inventors: Arpad Barna, deceased, late of Santa Cruz, CA (US); by David Green Baskin, legal representative, Santa Cruz, CA (US); Stephen J. Nuspl, Fridley, MN (US); Richard Spitzer, Berkeley, CA (US); E. James Torok, Shoreview, MN (US); Edward Wuori, Saint Paul, MN (US)

(73) Assignee: Integrated Magnetoelectronics Corporation, Berkeley, CA (US)

( * ) Notice: Subject to any disclaimer, the term of this patent is extended or adjusted under 35 U.S.C. 154(b) by 824 days.

(21) Appl. No.: 10/419,282

(22) Filed: Apr. 17, 2003

(65) Prior Publication Data

US 2004/0075152 A1    Apr. 22, 2004

Related U.S. Application Data

(60) Provisional application No. 60/374,438, filed on Apr. 19, 2002.

(51) Int. Cl.
*H01H 47/00* (2006.01)
(52) U.S. Cl. .................................... 361/143
(58) Field of Classification Search ............... 361/143
See application file for complete search history.

(56) References Cited

U.S. PATENT DOCUMENTS

| | | | |
|---|---|---|---|
| 2,911,627 A | 11/1959 | Kilburn et al. |
| 3,972,786 A | 8/1976 | Ballard |
| 4,751,677 A | 6/1988 | Daughton et al. |
| 4,780,848 A | 10/1988 | Daughton et al. |
| 4,829,476 A | 5/1989 | Dupuis et al. |
| 5,051,695 A | 9/1991 | Hunter et al. |
| 5,173,873 A | 12/1992 | Wu et al. |
| 5,251,170 A | 10/1993 | Daughton et al. |
| 5,432,734 A | 7/1995 | Kawano et al. |
| 5,442,508 A | 8/1995 | Smith |

(Continued)

FOREIGN PATENT DOCUMENTS

EP    1 132 917 A2    3/2000

(Continued)

OTHER PUBLICATIONS

Jaquelin K. Spong, et al., "Giant Magnetoresistive Spin Valve Bridge Sensor", Mar. 1996, *IEEE Transactions on Magnetics*, vol. 32, No. 2, pp. 366-371.

(Continued)

*Primary Examiner*—Stephen W. Jackson
(74) *Attorney, Agent, or Firm*—Beyer Weaver & Thomas, LLP

(57) ABSTRACT

Electronic systems are described including semiconductor circuitry characterized by first signals and all-metal circuitry characterized by second signals and comprising a plurality of transpinnors. Each transpinnor includes a network of thin-film elements. At least one thin-film element in each transpinnor exhibits giant magnetoresistance. Each transpinnor includes a conductor inductively coupled to the at least one thin-film element for controlling operation of the transpinnor. Interface circuitry connects the semiconductor circuitry to the all-metal circuitry and converts between the first signals and the second signals.

42 Claims, 41 Drawing Sheets

U.S. PATENT DOCUMENTS

| | | | |
|---|---|---|---|
| 5,477,143 A | 12/1995 | Wu | |
| 5,477,482 A | 12/1995 | Prinz | |
| 5,515,314 A | 5/1996 | Kouhei et al. | |
| 5,561,368 A | 10/1996 | Dovek et al. | |
| 5,565,236 A | 10/1996 | Gambino et al. | |
| 5,585,986 A | 12/1996 | Parkin | |
| 5,587,943 A | 12/1996 | Torok et al. | |
| 5,640,343 A | 6/1997 | Gallagher et al. | |
| 5,640,754 A | 6/1997 | Lazzari et al. | |
| 5,650,889 A | 7/1997 | Yamamoto et al. | |
| 5,650,958 A | 7/1997 | Gallagher et al. | |
| 5,652,445 A | 7/1997 | Johnson | |
| 5,654,566 A | 8/1997 | Johnson | |
| 5,661,449 A | 8/1997 | Araki et al. | |
| 5,686,837 A | 11/1997 | Coehoorn et al. | |
| 5,793,697 A | 8/1998 | Scheuerlein | |
| 5,852,574 A | 12/1998 | Naji | |
| 5,892,708 A | 4/1999 | Pohm | |
| 5,903,708 A | 5/1999 | Kano et al. | |
| 5,929,636 A | 7/1999 | Torok et al. | |
| 5,969,978 A | 10/1999 | Prinz | |
| 5,989,406 A | 11/1999 | Beetz et al. | |
| 6,031,273 A | 2/2000 | Torok et al. | |
| 6,134,138 A | 10/2000 | Lu et al. | |
| 6,166,944 A | 12/2000 | Ogino | |
| 6,169,292 B1 | 1/2001 | Yamazaki et al. | |
| 6,278,594 B1 | 8/2001 | Engel et al. | |
| 6,292,336 B1 | 9/2001 | Horng et al. | |
| 6,483,740 B1 | 11/2002 | Spitzer et al. | |
| 6,738,284 B2 * | 5/2004 | Torok et al. | 365/158 |
| 6,919,608 B2 * | 7/2005 | Gregg | 257/423 |
| 6,992,919 B2 * | 1/2006 | Andrei et al. | 365/158 |
| 2002/0024842 A1 | 2/2002 | Spitzer et al. | |

FOREIGN PATENT DOCUMENTS

| | | |
|---|---|---|
| JP | 4-273486 | 9/1992 |
| WO | WO 02/05268 A2 | 1/2002 |

OTHER PUBLICATIONS

Mark Johnson, "The All-Metal Spin Transistor", May 1994, *IEEE Spectrum*, pp. 47-51.

Mark Johnson, "Bipolar Spin Switch", Apr. 16, 1996, *Science*, vol. 260, pp. 320-323.

J.M. Daughton, "Magnetoresistive Memory Technology," Jul. 28-Aug. 2, 1991, *Int'l Workshop on Science and Technology of Thin Films for the 21st Century*, vol. 216, pp. 162-168.

K.T.M. Ranmuthu et al., "New Low Current Memory Modes with Giant Magneto-Resistance Materials," Apr. 13, 1993, *Digests of International Magnetics Conference*, 2 pages.

J.L. Brown, "1-Mb Memory Chip Using Giant Magnetoresistive Memory Cells," Sep. 1994, *IEEE Transactions on Components, Packaging, and Manufacturing Technology*, Part A, vol. 17, No. 3, pp. 373-379.

Torok et al., "Measurement of the Easy-Axis and Hk Probability Density Functions for Thin Ferromagnetic Films Using the Longitudinal Permeability Hysteresis Loop", *Journal of Applied Physics*, 33, No. 10, Oct. 1962, pp. 3037-3041.

Lenssen, et al, "Expectations of MRAM in Comparison With Other Non-Volatile Memory Technologies", Phillips Research Laboratories, pp. 26-30.

Torok, et al, "Longitudinal Permeablility in Thin Permalloy Films", *Journal of Applied Physics*, 34, No. 4, (Part 2), Apr. 1963, pp. 1064-1066.

Paul a. Packan, "*Pushing The Limits*", Sep. 24, 1999. science Mag, vol. 285, pp. 2079-2081.

Pratt, W.P., et al., "Perpendicular Giant Magnetoresistances of Ag/Co Multilayers", *Physical Review Letters*, 66 (23): 3060-3063 (Jun. 1991).

Parkin, S.S.P, et al., "Oscillatory Magnetic Exchange Coupling through Thin Copper Layers", *Physical Review Letters*, 66(16): 2152-2155 (Apr. 1991).

Jones, K., "Texas Instruments Plans Large Expansion", *The New York Times* (Aug. 20, 1993).

Callaby, D.R. et al., Solid State Memory Study Final Report, Technical Report No. RE-0013, National Media Lab, St. Paul, MN (Feb. 1994).

National Media Laboratory Spring Review on Solid-State Memory Technologies, Proc. 1994 Spring Conference on Solid-State Memory Technologies, Pasadena, CA, (May 23-25, 1994), pp. 3-8, 97, 121, 123-133.

Harrison, R.W., "Laser Scanning Surface Profilomete", *IBM Technical Disclosure Bullentin*, 13(3): 789-790 (Aug. 1970).

Hylton, T.L., et al, "Giant Magnetoresistance at Low Fields in Discontinuous NiFe-Ag Multilayer Thin Films", *Science*, 261:1021-1024 (Aug. 1993).

Xiao, et al., "Giant Magnetoresistance in Nonmulitlayer Magnetic Systems", *Physical Review Letters*, vol. 68, No. 25, Jun. 22, 1992, pp. 3749-3752.

Zhang, S., "Theory of Giant Magnetoresistance in Magnetic Granular Films", *Appl. Phys. Lett.*, 61(15): 1855-1857 (Oct. 1992).

* cited by examiner

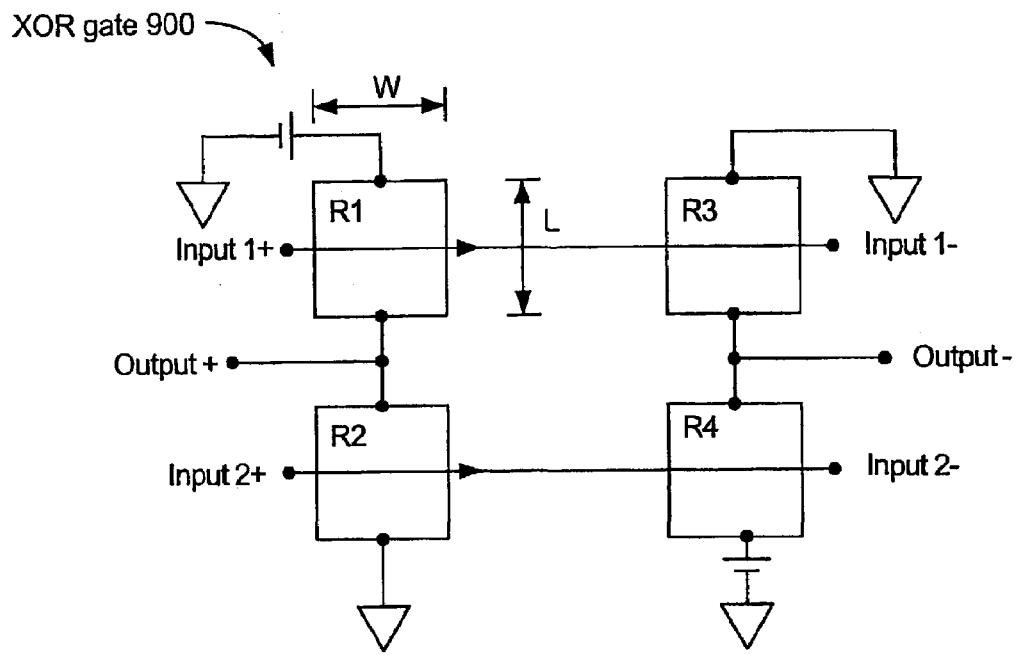
FIG. 9
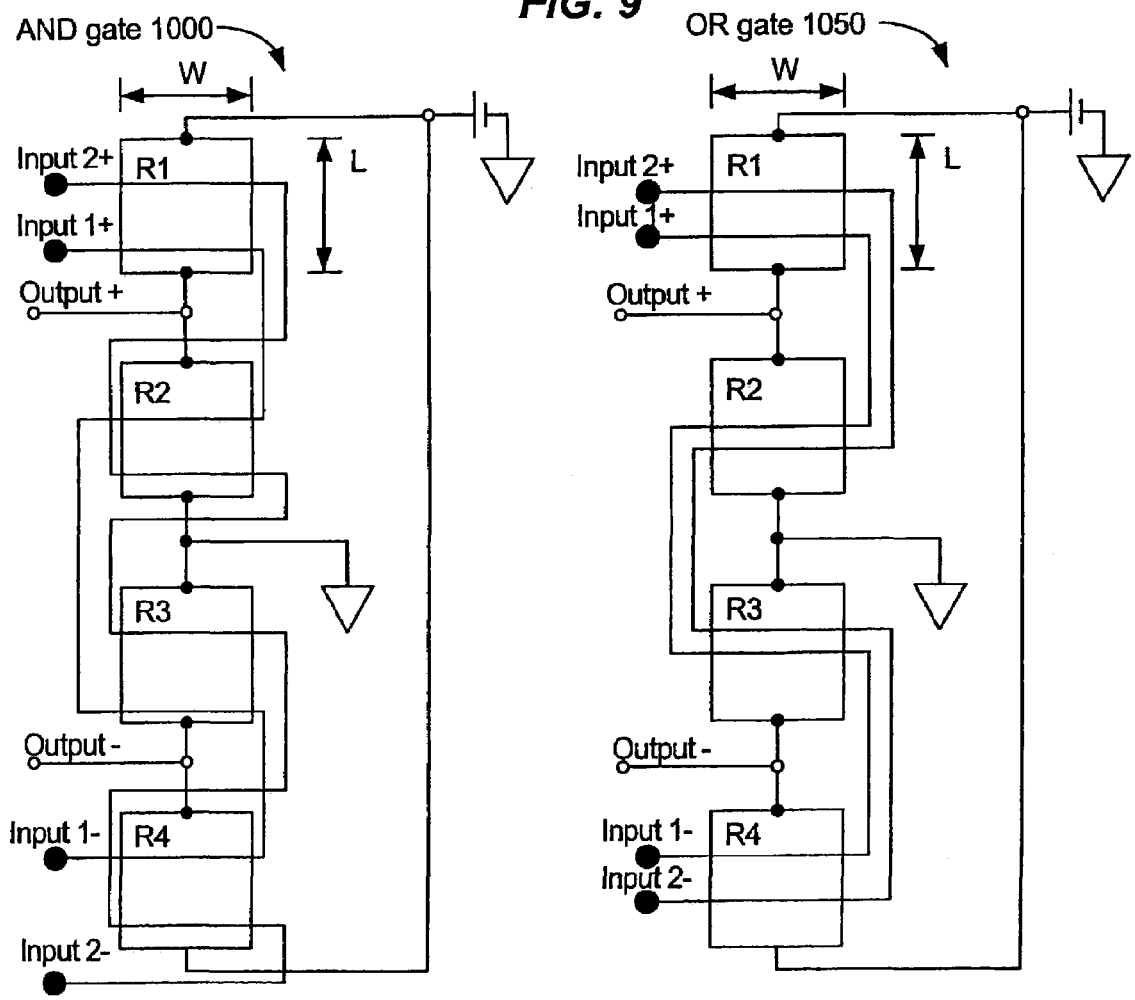
FIG. 10A
FIG. 10B

Table 1. Characteristics of Interfacing Families.
(SC = Short circuit load, OC = Open circuit load)

| As Source | As Load | Logic Levels Logical 0 | Logic Levels Logical 1 | Operating Speed | Propagation Delay | Effect of Interconnect Lines Resistance | Effect of Interconnect Lines Capacitance | Interferences With Analog Circuits |
|---|---|---|---|---|---|---|---|---|
| Transpinnor SC | | | | | | | | |
| | On-chip | < -1ma | > +1ma | > 1GHz | < 0.5ns | Usually Very Minimal | | Greatly Reduced From CMOS - Ground Noise |
| | Between Chips | < -1ma | > +1ma | > 1GHz | < 0.5ns | | Minimal | |
| | CMOS | | | | | | | |
| | On-chip | [0, 1.5]V | [3.5, 5]V | > 1GHz | < 0.1 ns | | Significant | Separate Analog & Digital Grounds Rq'd |
| | Between Chips | [0, 1.5]V | [3.5, 5]V | > 100 MHz | [1, 6.5]ns | | Very Significant | |
| Transpinnor SC | | | | | | | | |
| | On-chip | < -1ma | > +1ma | > 1GHz | < 0.5ns | Usually Very Minimal | | Separate Grounds Critical in CMOS portion |
| | Between Chips | < -1ma | > +1ma | > 1GHz | < 0.5ns | | Minimal | |
| Transpinnor OC | | | | | | | | |
| | CMOS | | | | | | | |
| | On-chip | > -50mv | > +50mv | About 500 MHz | About 1ns | | Significant | Separate Grounds Critical in CMOS portion |
| | Between Chips | > -50mv | > +50mv | About 100 MHz | About 1ns | | Significant | |
| CMOS Transpinnor | | | | | | | | |
| | On-chip | [0, 0.4]V | [3, 5]V | > 1GHz | < 0.1 ns | | Significant | Separate Grounds Critical in CMOS portion |
| | Between Chips | [0, 0.4]V | [3, 5]V | < 100 MHz | > 5 ns | | Very Significant | |
| Older Logic Families (Reference Only) | | | | | | | | |
| | TTL | [0, 0.4]V | [2.7, 5]V | 250 MHz | [1, 5]ns | Minimal | Moderate | Ground Structures Critical |
| | ECL | [-1.83, -1.475]V | [-1.165, -0.87]V | 500 MHz | [0.4, 1.8]ns | Minimal | Minimal | |

Assumes CMOS supply voltage of 5V, TTL supply of 5V, and ECL supply voltage of -5V.

References:
1. The CMOS "Between Chips" data was obtained from the Fairchild Semiconductor Data Sheet for the 74VHC04 Inverter.
2. The TTL data was obtained from the Texas Instruments Data Sheet for the 74AS04 Inverter.
3. The ECL data was obtained from the National Semiconductor Data Sheet for the 100321 Inverter.
4. The Transpinnor data was obtained from internal sources.
5. Other CMOS speed data was obtained from AMD 0.8 micron process specifications and hand calculations.
6. Other CMOS logic levels used 1. Above.
7. A CMOS universal interface chip was assumed when a CMOS load was needed.

Fig. 21

INTERFACES BETWEEN SEMICONDUCTOR CIRCUITRY AND TRANSPINNOR-BASED CIRCUITRY

RELATED APPLICATION DATA

The present application claims priority from U.S. Provisional Patent Application No. 60/374,438 for INTERFACES BETWEEN SEMICONDUCTOR CIRCUITRY AND TRANSPINNOR-BASED CIRCUITRY filed on Apr. 19, 2002 the entire disclosure of which is incorporated herein by reference for all purposes.

BACKGROUND OF THE INVENTION

The present invention relates to circuits and systems incorporating solid-state devices referred to herein as "transpinnors" and described in U.S. Pat. Nos. 5,929,636 and 6,031,273, the entire disclosures of which are incorporated herein by reference for all purposes. More specifically, the present application describes interface circuitry for transmitting signals between semiconductor circuitry and transpinnor-based circuitry.

The vast majority of electronic circuits and systems manufactured and sold today are based on semiconductor technology developed over the last half century. Semiconductor processing techniques and techniques for manufacturing integrated circuits have become increasingly sophisticated resulting in ever smaller device size while increasing yield and reliability. However, the precision of such techniques appears to be approaching its limit, making it unlikely that systems manufactured according to such technique will be able to continue their historical adherence to Moore's Law which postulates a monotonic increase in available data processing power over time.

In addition, as the techniques for manufacturing semiconductor integrated circuits have increased in sophistication, so have they correspondingly increased in cost. For example, current state-of-the-art integrated circuits require a large number of processing steps to integrate semiconductor circuitry, metal layers, and embedded circuits, an issue which is exacerbated by the varied nature of the materials being integrated. And the demand for higher levels of complexity and integration continue to grow. The technical difficulties facing the semiconductor industry are well summarized by P. Packan in the Sep. 24th, 1999, issue of *Science* magazine beginning at page 33, incorporated herein by reference in its entirety for all purposes.

Finally, there are some applications for which conventional semiconductor integrated circuit technology is simply not well suited. An example of such an application is spacecraft systems in which resistance to external radiation is extremely important. Electronic systems aboard spacecraft typically require elaborate shielding and safeguards to prevent loss of information and/or system failure due to exposure to any of the wide variety of forms of radiation commonly found outside earth's atmosphere. Not only are these measures costly in terms of dollars and weight, they are not always completely effective, an obvious drawback given the dangers of space travel.

In view of the foregoing, it is desirable to provide electronic systems which facilitate higher levels of integration, reduce manufacturing complexity, and provide a greater level of reliability in a wider variety of operating environments. As described in the aforementioned U.S. patents, such electronic systems are made possible by the advent of the all-metal, multi-purpose circuit element referred to as the "transpinnor." However, given the infancy of the transpinnor and transpinnor-based systems, and the still ubiquitous nature of semiconductor technology, it is desirable to provide interfaces for transmitting signals between these different domains.

SUMMARY OF THE INVENTION

According to the present invention, techniques and circuitry are provided by which electronic signals may be transmitted between semiconductor circuitry and transpinnor-based circuitry. More specifically, the present invention provides an electronic system including semiconductor circuitry characterized by first signals and all-metal circuitry characterized by second signals and comprising a plurality of transpinnors. Each transpinnor includes a network of thin-film elements. At least one thin-film element in each transpinnor exhibits giant magnetoresistance. Each transpinnor further includes a conductor inductively coupled to the at least one thin-film element for controlling operation of the transpinnor. Each transpinnor generates an output signal which is a function of a resistive imbalance among the thin-film elements and which is proportional to a power current in the network of thin-film elements. Interface circuitry connects the semiconductor circuitry to the all-metal circuitry and converts between the first signals and the second signals.

A further understanding of the nature and advantages of the present invention may be realized by reference to the remaining portions of the specification and the drawings.

BRIEF DESCRIPTION OF THE DRAWINGS

FIG. 1b shows a typical resistance curve for a GMR film such as the one shown in FIG. 1a.

FIGS. 2c and 2d show two alternative structures for the multilayer GMR film of FIG. 2a.

FIG. 4 shows a transpinnor with a closed-flux configuration which is substantially the same schematically as the transpinnor of FIG. 3a.

FIG. 5 shows a transpinnor with an open-flux configuration which is substantially the same schematically as the transpinnor of FIG. 3a.

FIG. 9 is a circuit diagram of a transpinnor XOR gate.

FIGS. 10a and 10b show transpinnors to operate as an AND gate and an OR gate, respectively.

FIGS. 19–42 illustrate various aspects of circuits for interfacing between transpinnor-based and semiconductor circuitry according to various embodiments of the invention.

DETAILED DESCRIPTION OF SPECIFIC EMBODIMENTS

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In addition, well known process operations have not been described in detail in order not to unnecessarily obscure the present invention.

"Giant magnetoresistance" (GMR) refers to the difference in the resistance that conduction electrons experience in passage through magnetic multilayer films which is dependent on the relative orientation of the magnetization in successive magnetic layers. For ferromagnetic materials, this difference occurs because the energy level for conducting electrons in a ferromagnetic layer is lower (by a few electron microvolts) for electrons with spin parallel to the magnetization rather than antiparallel. A GMR film is a composite structure comprising one or more multilayer periods, each period having at least two magnetic thin-film layers separated by a nonmagnetic conducting layer. A large change in resistance can occur in a GMR structure when the magnetizations in neighboring magnetic layers change between parallel and antiparallel alignments.

Figure 1A:
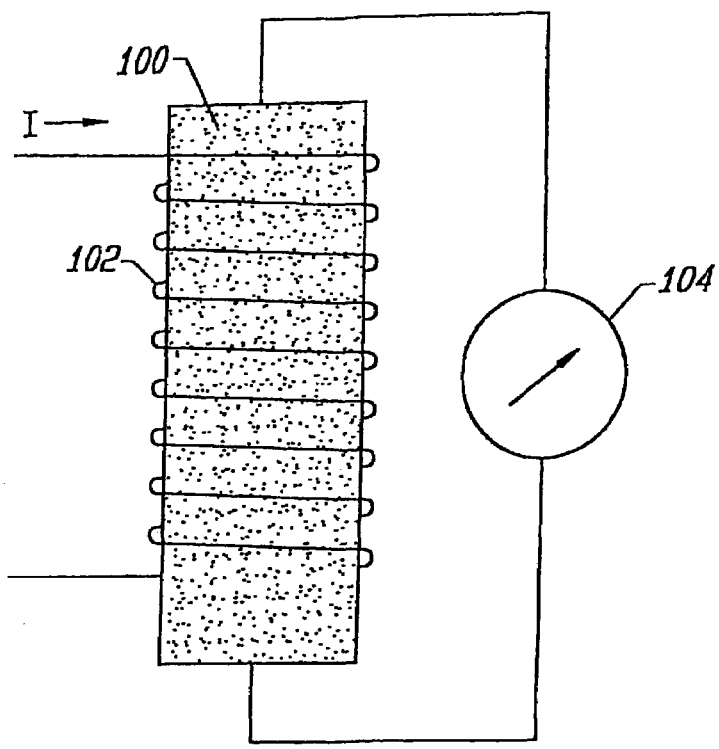
FIG. 1a shows a multilayer GMR film.

The property of giant magnetoresistance may be understood with reference to FIG. 1a which shows a multilayer GMR film 100 with a field coil 102 for supplying a magnetic field to GMR film 100. GMR film 100 contains magnetic layers of different coercivities separated by non-magnetic conducting layers (not shown). An ohmmeter 104 measures the resistance of GMR film 100 which changes as the input current I changes (see FIG. 1b); the dotted line represents the saturation of the high-coercivity film in the opposite direction to the solid line. As discussed above, if the magnetization direction of the magnetic layers of the first coercivity is parallel to the magnetization direction of the magnetic layers of the second coercivity, the resistance of the film is low. If the magnetization directions are antiparallel, the resistance is high.

Figure 1B:
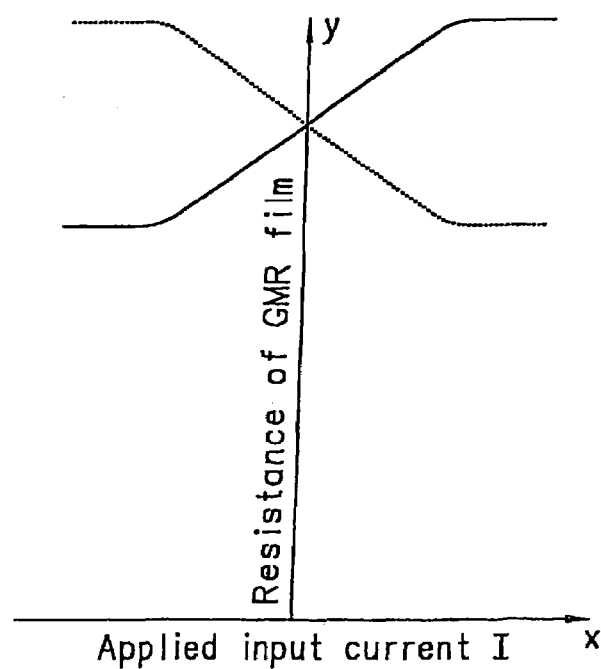

GMR film 100 may be formed of one or more periods, each period having, for example, a cobalt layer characterized by a moderate coercivity, a copper layer, a permalloy layer characterized by a lower coercivity than the cobalt layer, and another copper layer. The different coercivities of the alternating magnetic layers make it possible to achieve an antiparallel orientation of the respective magnetization directions. The copper layers physically separate the magnetic layers, which otherwise would be tightly coupled by exchange forces. Consequently, it is possible to switch the magnetization in the low coercivity film without switching the magnetization in the high coercivity film. FIG. 1b shows a hypothetical resistance curve for an input current I which is not sufficient to reverse the polarity of the higher coercivity cobalt layer. As the current is increased, more of the low coercivity film switches, thus increasing the resistance. When the entire low coercivity film is switched there is no further change in resistance and the resistance curve levels off.

Figure 2A:
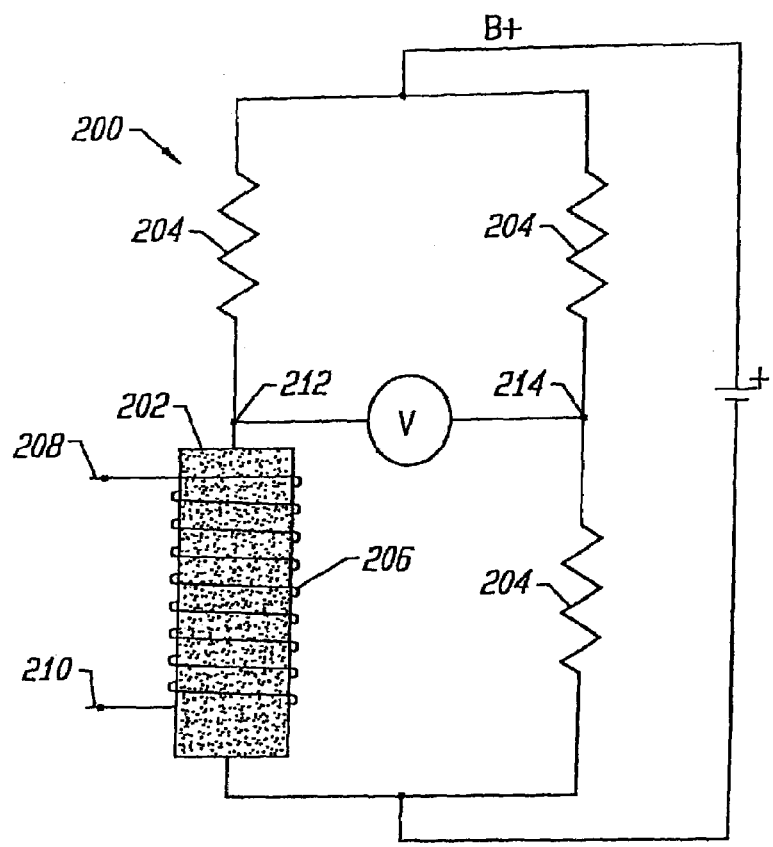
FIG. 2a is a schematic diagram of a first transpinnor configuration.
Figure 2B:
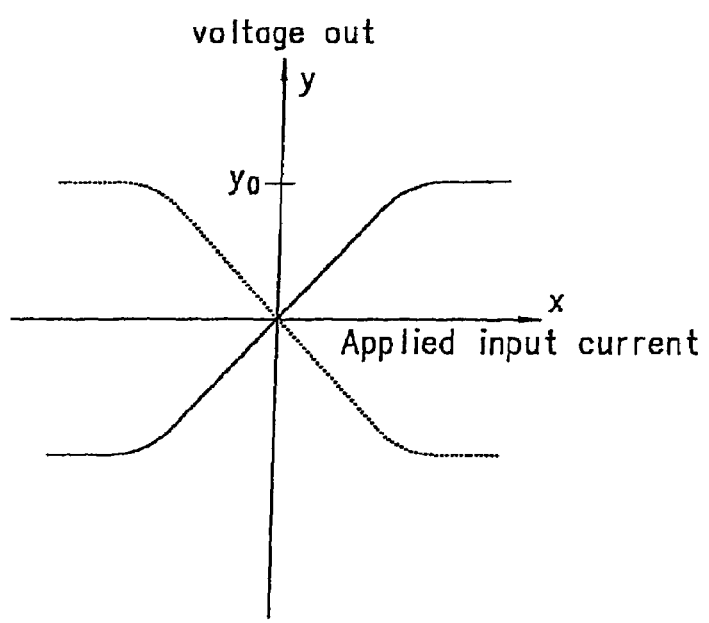
FIG. 2b shows a plot of the output voltage of the transpinnor of FIG. 2a as a function of input current.
Figure 2D:
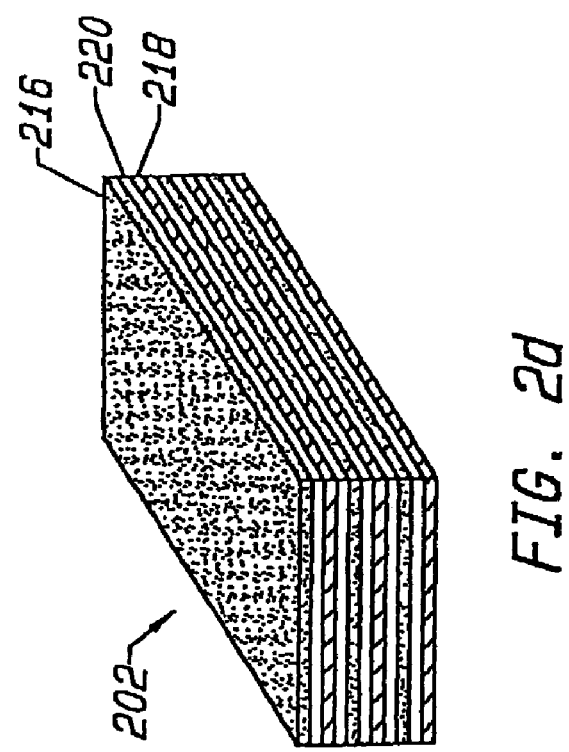
Figure 2C:
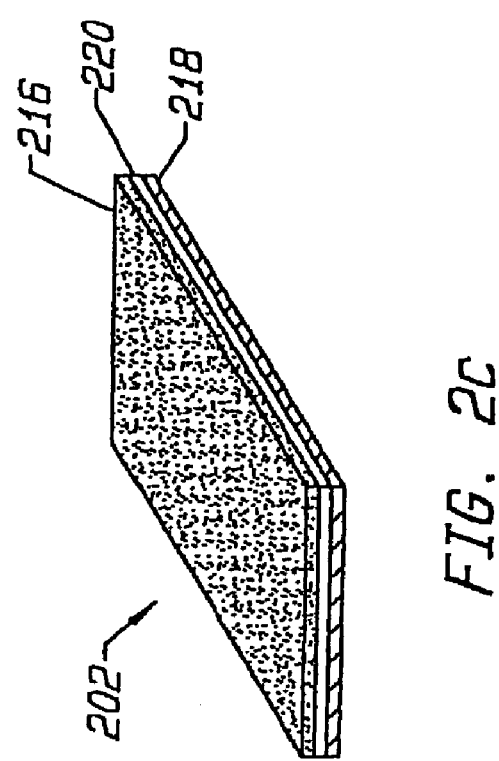

FIG. 2a shows a schematic diagram of a transpinnor 200 in which a GMR multilayer thin-film strip 202 is disposed in a bridge configuration with three resistive elements 204. A conductor 206 is wound around GMR film 202 for supplying a magnetic field thereto. An input signal is applied at terminals 208 and 210. Output terminals 212 and 214 give the output voltage, as indicated by a voltmeter. This configuration allows the output voltage to be zero as well as positive and negative. As is readily apparent, the input (between terminals 208 and 210) is completely isolated resistively from the output (between nodes 212 and 214) even for a DC input current I. The magnitude of the output is proportional to the applied B+ voltage and is limited only by the current carrying capacity of GMR film 202. FIG. 2b shows the output voltage of transpinnor 200 as a function of input current. If the values of resistors 204 are chosen correctly, the output voltage does not have a pedestal. That is, the curve crosses the y axis at y=0, and is not raised as in FIG. 1b. If the high coercivity film is reversed by either a strong input current or an external field, the polarity of the output is reversed, as shown by the dotted line in FIG. 2b. A single-period GMR film 202 and a three-period GMR film 202 are shown in FIGS. 2c and 2d, respectively, each having permalloy (216), cobalt (218) and copper (220) layers. The GMR films of FIGS. 2c and 2d illustrate that various transpinnor configurations may employ single period and multi-period structures.

As mentioned, the output of transpinnor 200 changes as the resistance of GMR film 202 changes and is proportional to the voltage drop across GMR film 202 as the current passes through it. The output can be bipolar or unipolar, depending on the ratios of resistances chosen for the other legs (i.e., the bias can be positive, negative, or zero). Also, depending on the squareness of the B-H loop, the output can either be linear or a threshold step function. In addition, if the GMR film 202 is constructed symmetrically about the center, the net magnetic field from the current passing through the film will be zero. Therefore, the only limits on magnitude of the current are the heating of GMR film 202 and/or electromigration. The GMR films may employ metals having high electromigration thresholds, such as copper, cobalt, nickel and iron.

Figure 3A:
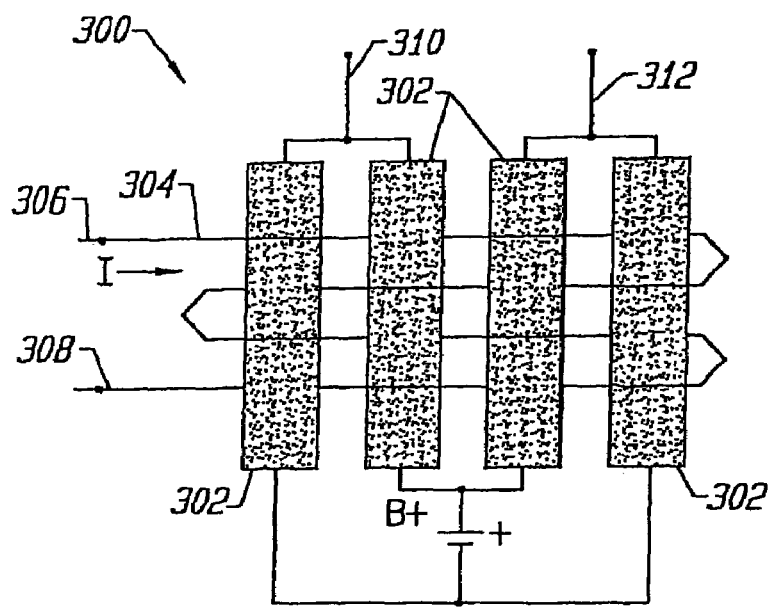
FIG. 3a is a schematic diagram of a second transpinnor configuration.
Figure 3B:
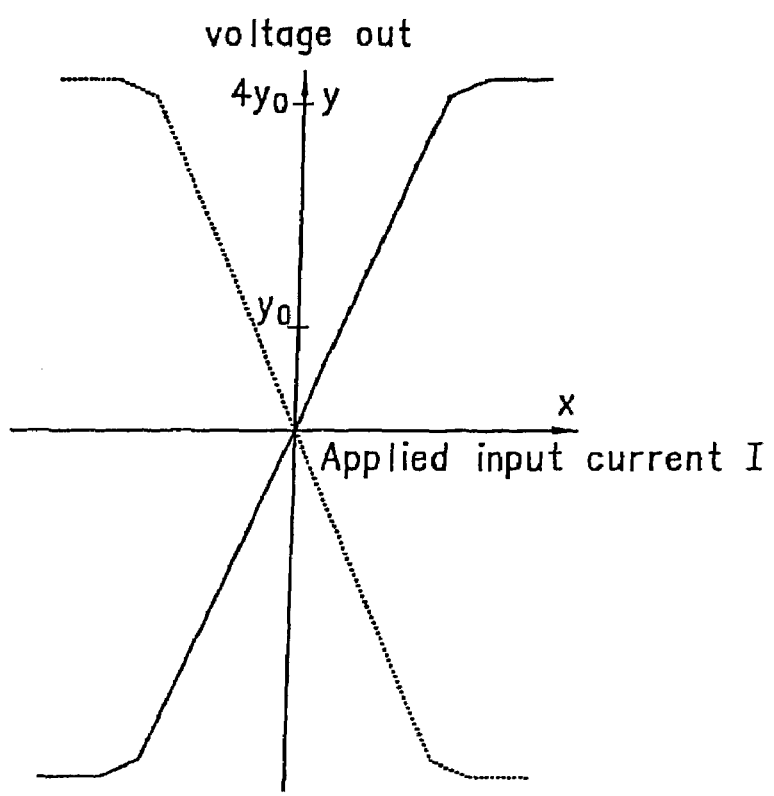
FIG. 3b shows a plot of the output voltage of the transpinnor of FIG. 3a as a function of input current.

FIG. 3a shows a schematic diagram of another transpinnor 300 having a different configuration. Instead of only one GMR film, transpinnor 300 employs four GMR films 302 arranged in a bridge configuration with conductor 304 wound through them for supplying a magnetic field thereto. As with transpinnor 200, the input of the device (between terminals 306 and 308) is isolated resistively from the output (between nodes 310 and 312) even with a DC input current. Also, the output voltage of transpinnor 300 is determined by the magnitude of B+ and the current carrying capacity of GMR films 302. As shown in FIG. 3b, transpinnor 300 has four times the output of transpinnor 200. Transpinnor 300 also has the advantage that the bridge is balanced to zero offset if all four films are identical.

Figure 4:
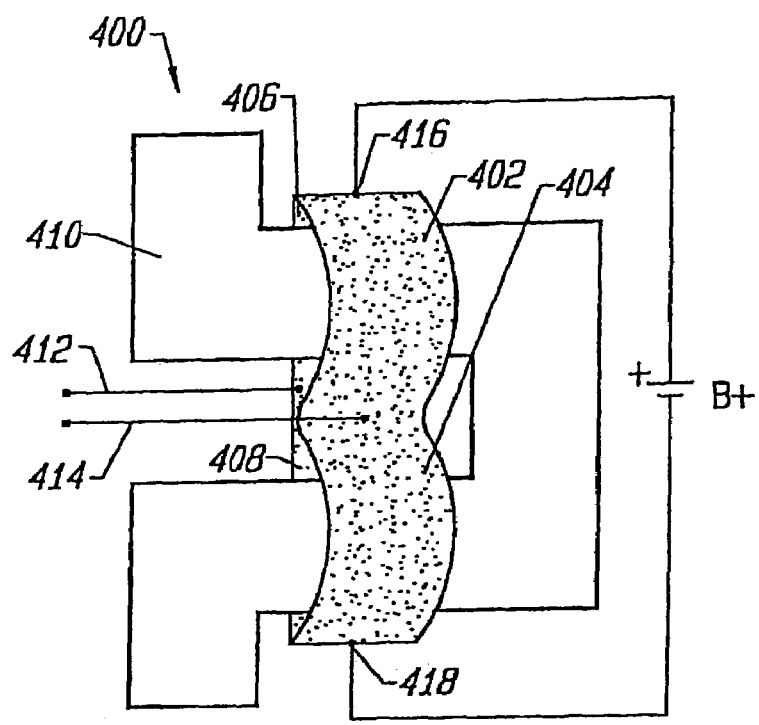

FIG. 4 shows a transpinnor 400 with a closed-flux geometry which is substantially the same schematically as transpinnor 300. There is insulation (not shown) in the middle of transpinnor 400 where top GMR films 402 and 404 nearly touch bottom GMR films 406 and 408. The four GMR films form a Wheatstone bridge in which the resistance of each is variable. Input conductor 410 supplies the magnetic field and the output voltage is provided by output conductors 412 and 414. A bias voltage B+ is applied between nodes 416 and 418.

Figure 5:
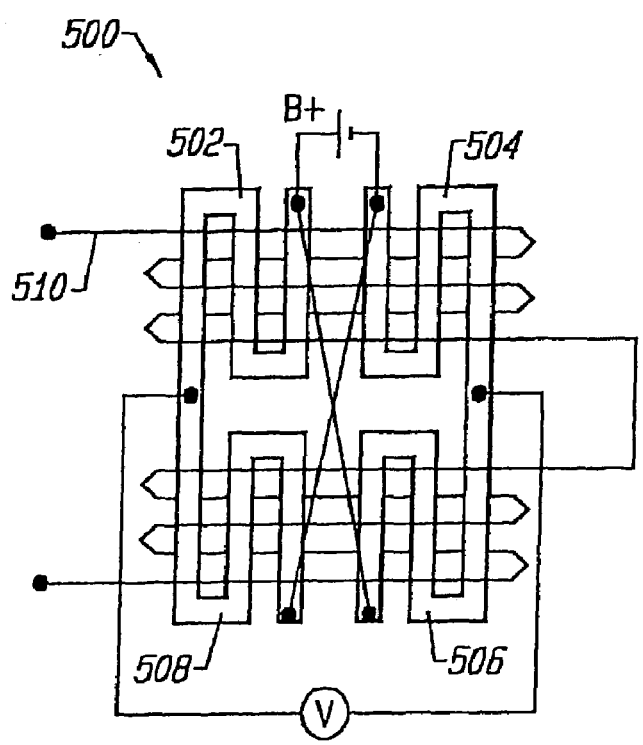

FIG. 5 shows a transpinnor 500 with an open-flux configuration which is substantially the same schematically as transpinnor 300. GMR film elements 502, 504, 506 and 508 form a Wheatstone bridge arrangement which requires only a single GMR deposition (i.e. the GMR layers are deposited in a single pump-down, with no patterning required between deposition of layers). Input conductor 510 was wound as a single layer of magnet wire. The closed-flux structure of FIG. 4 gives superior performance, especially for small-size devices, but involves multiple GMR depositions and patterning.

Figure 6:
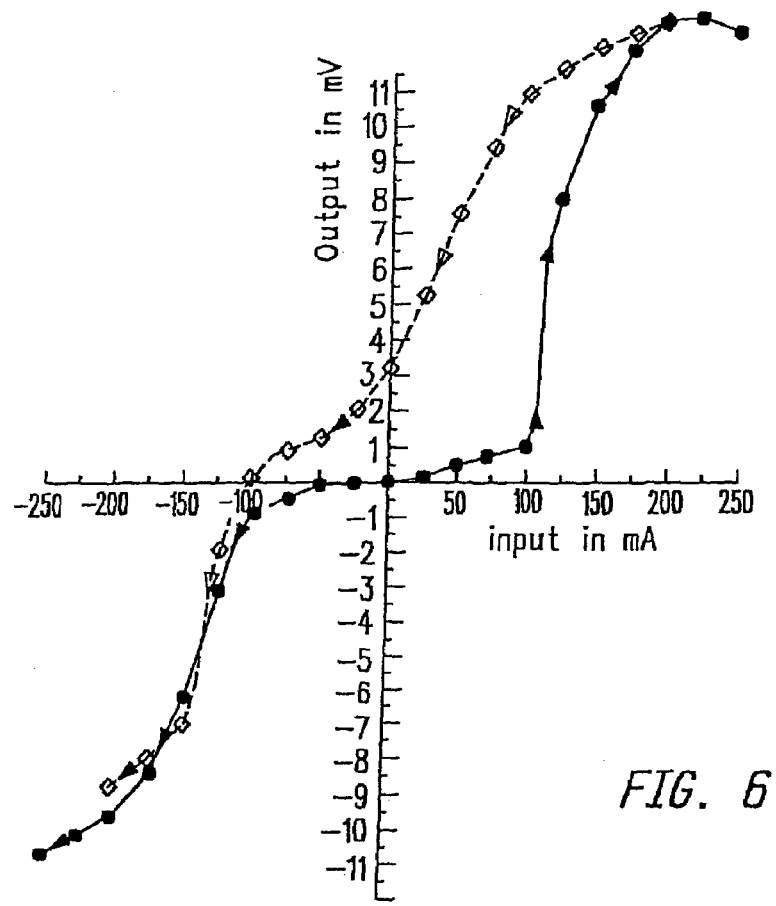
FIG. 6 illustrates the relationship between input current and output voltage for an all-metal GMR transpinnor.

FIG. 6 illustrates the relationship between input current and output voltage for the all-metal GMR transpinnor shown in FIG. 5. The transpinnor was first initialized by saturating its four GMR film elements along the easy axes (i.e., parallel to the direction of film strips) with a magnet, and then applying input current until the magnetization direction of the permalloy layers in two of the elements switch completely (i.e., for maximum output from a Wheatstone bridge two resistors must be in the high resistance state and two in the low resistance state). After initialization in this manner, the data for the curve of FIG. 6 were taken. The solid curves, both positive and negative, were taken starting from the initialized state. The dashed curve is the remagnetization curve in which the applied field is made more negative (starting from the state of maximum output) in order to reestablish the initial magnetization state.

The solid curve of FIG. 6 shows a flat portion near the origin, then a rapid climb in output voltage when the input current reaches a threshold. It will be understood that this flat portion and threshold are desirable for digital applications, such as logic or selection matrices. The flat portion of the curve is largely due to the exchange bias between the permalloy and the cobalt layers. For linear applications, this portion of the curve can be removed either by the application of a small external bias, or by creating a symmetrical spin valve structure in which two cobalt layers are magnetized in opposite directions.

Figure 7:
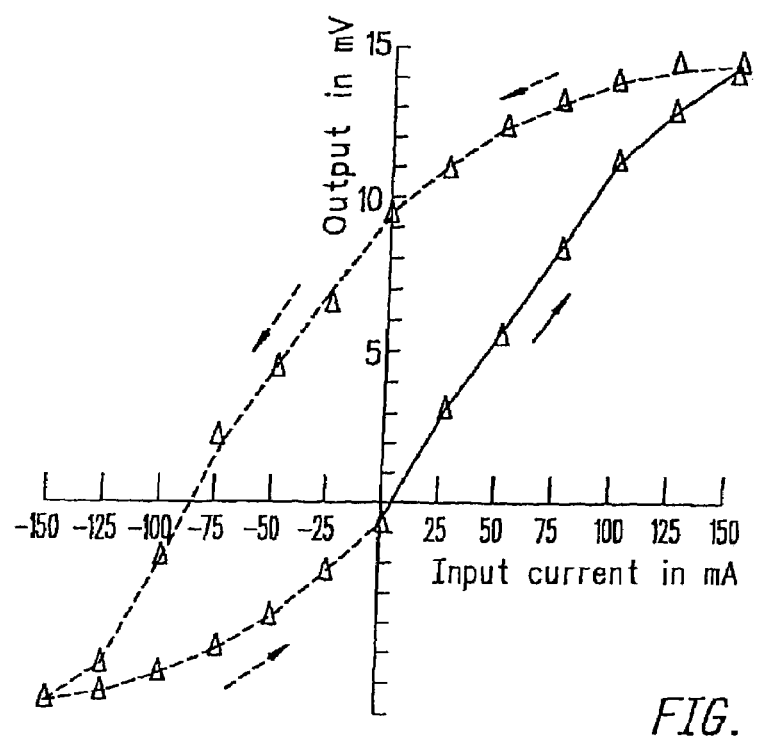
FIG. 7 shows output voltage vs. input current for the GMR transpinnor of FIG. 6 with a small external bias applied.

FIG. 7 shows an output voltage vs. input current curve for the GMR transpinnor of FIG. 6 but with a small external bias (e.g., 1.5 Oe) applied with a magnet in the easy direction (i.e., parallel to the film strips). As is evident, the exchange bias plateau around the origin has been essentially eliminated. As with FIG. 6, the solid lines begin with the initialized state, and the dashed line is the remagnetization curve. The finite hysteresis makes this transpinnor better suited for digital than for linear applications.

The GMR transpinnor of FIG. 6 has a rather large hysteresis in the permalloy of 1 Oe. However, permalloy coercivities of an order of magnitude smaller are found. This is of interest because the voltage and current gain of the GMR transpinnor are inversely proportional to the permalloy coercivity, and the power gain is inversely proportional to the square of the permalloy coercivity. The permalloy coercivity found in multi-period GMR films is routinely much lower than single-period GMR films. The reason is that the domain walls form in pairs in the closely spaced films of the multi-period devices, greatly reducing the magnetostatic energy of the walls. This is beneficial for linear applications because it increases the gain of the transpinnor. Unfortunately, a corresponding reduction in the coercivity of the cobalt layers is also found. This reduction is undesirable because at some point the magnetization direction of the cobalt layers begin to switch at a lower threshold than the magnetization direction of some of the permalloy layers. Obviously, the proper balance between these two parameters must be found for the particular application.

It is desirable in particular applications for the GMR transpinnor to have a gain greater than unity. The low-frequency gain of GMR transpinnors is a function of their fundamental parameters. Referring again to FIG. 5, input line 510 of transpinnor 500 is completely isolated from the output circuit. For the purpose of calculating the gain of transpinnor 500, let the input current be i, the input voltage be v, and the resistance of the input line be r. Furthermore, let the output voltage of transpinnor 500 be V, the resistance of the output circuit (including the GMR film) be R, and the current be I. Let us also introduce a variable to express the ratio of the percentage change in resistance caused by a small applied magnetic field. Where the shear is unimportant compared to the coercivity, this quantity, which we call the resistibility, X, is given by $$X = GMR/(100 H_c) \tag{1}$$

where $H_c$ represents the coercivity of the permalloy in the GMR film. The voltage gain of the GMR transpinnor of the present invention is proportional to the resistibility, and the power gain is proportional to the square of the resistibility.

The input line of the transpinnor produces a field. The ratio of field to the current by which it is produced is referred to herein as the coil efficiency, E. Generally speaking, the value of E increases dramatically as the size of the transistor decreases. If other parameters (including the resistance of the input line) stay the same, the voltage amplification is proportional to E, and the power amplification is proportional to the square of E.

Given the definitions of the various parameters of the transpinnor, the voltage amplification is given by $$A_{voltage} = (R/r) I\, E\, X \tag{2}$$

and the power amplification is given by $$A_{power} = (R/r) I^2\, E^2\, X^2 \tag{3}$$

From (1) and (3) it becomes evident that the power amplification of transpinnor 500 is proportional to the square of the current, to the square of the GMR, to the square of the drive line efficiency, and inversely proportional to the square of the coercivity of the GMR film.

Some numerical examples of power amplification may be instructive. According to a first example, the input resistance is 0.8 Ohms, the resistance of the GMR film elements is 120

Ohms, the resistibility is 0.011/Oe, and the coil efficiency is 20 Oe/amp. If an input current of 500 mA is used, according to (3), the power amplification is 1.8. This is not a particularly good film.

According to a second example, the parameters are the same as for the first example above, except that the resistibility is 0.19/Oe. Now the power amplification is 541. This is higher than desirable for a logic tree, but may be reduced to a desirable value by appropriately decreasing the current.

According to a third example, a miniaturized transpinnor is configured as shown in FIG. 4, with the width of its features being on the order of one micron. The copper input conductor is 1 micron thick and 3 microns long. The input resistance is 0.05 ohms, the output resistance is 8 ohms, the coil efficiency is 6000 Oe/amp, the resistibility is 0.19/Oe, and the current is 1 mA. The power amplification is then 208.

The conclusion is that substantial power amplification can be achieved with GMR transpinnors using existing GMR film configurations. Additionally, amplification factors in the hundreds can be obtained regardless of whether the transpinnors are large or so small as to be at the limits of conventional lithography because the power amplification factor is independent of the size of the device. However, although GMR transpinnors scale so their power amplification doesn't degrade when the devices are miniaturized, the power handling capability of the devices diminishes, of course, as the device size diminishes. GMR transpinnors can be designed to give either high output current and low output voltage, or high output voltage and low output current. These parameters are determined by the aspect ratio of the GMR film. If the GMR film is a long narrow conductor, the output is high voltage and low current. If the GMR film is a short wide conductor, the output is low voltage and high current. The power amplification is relatively independent of the aspect ratio.

To get high power amplification, the following may be done:

(1) Make the input stripline as thick as possible in order to lower the resistance r. The power amplification depends only linearly on r, so this is less critical than the other steps.

(2) Make the resistibility as high as possible, either by raising the GMR or by lowering the coercivity of the permalloy.

(3) Make the GMR films as thick as possible to allow higher current without electromigration problems. This means many periods (e.g., 15 periods have been employed to obtain GMR of 15%).

Although low GMR films with very low coercivity can be used to construct GMR transpinnors with high power amplification, the resulting device may be inefficient. If overall power consumption is a consideration, one should use high GMR films. It is possible, for example, to make GMR films with GMR of more than 22%.

There are a wide range of applications for which the transpinnor represents a significant advance. For example, transpinnors may be employed to implement nonvolatile logic gates, i.e., gates which maintain their states when power is removed. Additionally, because all-metal films exhibit much greater resistance to damage by radiation than semiconductors, transpinnors may be employed to implement intrinsically radiation-hard electronics.

The curve shown in FIG. 7 exhibits hysteresis. Although this is not harmful (and may indeed be useful) for logic devices, for linear transpinnor performance, the hysteresis loop needs to be closed and straightened in a finite operating region; additionally, films with very low-coercivity should be used. In general, the shape of the hysteresis loop of thin films depends on the direction of the applied fields. Different approaches to achieve anhysteretic GMR films for transpinnor operation in the linear region based on three methods of eliminating hysteresis and distortion from GMR films are described. One approach is the application of a transverse (i.e., perpendicular to the easy direction) bias field having a magnitude slightly larger than the anisotropy field of the low coercivity element; the signal to be amplified is applied as a varying easy-axis magnetic field. This bias field can be supplied by an external coil or magnet, by individually deposited magnets on each amplifier, or by a current in a stripline. The effect of the bias is to eliminate the hysteresis and to greatly increase the longitudinal permeability, as described in two publications, *Longitudinal Permeability in Thin Permalloy Films*, E. J. Torok and R. A. White, Journal of Applied Physics, 34, No. 4, (Part 2) pp. 1064–1066, April 1963, and *Measurement of the Easy-Axis and $H_k$ Probability Density Functions for Thin Ferromagnetic Films Using the Longitudinal Permeability Hysteresis Loop*, E. J. Torok et al., Journal of Applied Physics, 33, No. 10, pp. 3037–3041, October, 1962, the entire disclosures of which are incorporated herein by reference for all purposes. The mathematics in these publications can be used to show that when a GMR film of resistance R, having one or more low coercivity layers (e.g. permalloy) with anisotropy field $H_k$, is biased with a hard axis field $H_T > H_k$, and to which a small easy axis field $dH_L$ is applied, the film will have a corresponding resistance change, dR, given by $$dR/dH_L = (GMR)R/(H_T - H_k) \qquad (4)$$

where GMR is the maximum resistance change, and $H_T$ must be larger than the maximum $H_k$ of any region of the film. This differential resistance change can be quite large if the inhomogeneity of the film is small, and the corresponding amplification can be large. This is a sensitive method of achieving anhysteretic GMR films by a transverse-biased permeability. It results in an analog signal with a linear response within a certain range.

In another approach to eliminating the hysteresis, the permalloy layer in the transpinnor is driven and sensed in the hard direction. The cobalt layer is deposited so that its easy axis is parallel to the hard axis of the permalloy, this is accomplished by saturating the cobalt layer during its deposition at 90 degrees from the easy axis of the permalloy. This method does not generally require a bias field during operation; the exchange bias between the high coercivity layer(s) and the permalloy layer is normally sufficient to prevent the hard-axis loop from opening. The sensitivity of the hard-axis-driven film is not as good as in the approach based on the transverse-biased permeability (described above), but the linearity extends over a broader range and this method is easier to implement in that it avoids biasing in the hard direction and driving in the easy direction.

Yet another approach involves a sampling method. A pulse is applied to the transpinnor between each data sample. The pulse is of sufficient amplitude to saturate the permalloy layers in the transpinnor to an initial state that is the same regardless of whatever signal was applied in between. The frequency of the applied pulse should be higher than the highest frequency of interest in the signal to be amplified. The result of using narrow pulses to reinitialize the magnetic material before each data sample is to erase the magnetic history and to eliminate the hysteresis in the output. The output can be sensed either with sampling techniques or as an analog output with a low-pass filter.

It is generally understood that all possible electronic circuits, analog and digital, can be implemented using active components, e.g., transistors, in combination with four basic passive components, i.e., resistors, capacitors, inductors and transformers. It is also well known that neither inductors nor transformers are available in semiconductor bipolar technology. By contrast, the GMR transpinnors can be employed to provide both of these components. In fact, they are well suited to provide the basis of a variety of analog, digital and mixed general-purpose all-metal circuits, subsystems and systems. Since capacitance and resistance can be implemented with the same metal technology as that used for the passive transformer and the transpinnor, all these components can be combined very effectively on the same substrate to produce a comprehensive variety of all-metal circuits. Unlike semiconductor chips, whose performance suffers below a critical size, the characteristics of GMR devices improve as the dimensions are decreased.

Biased in the appropriate operating region, GMR transpinnors can be used as basic building blocks of logic gates, thereby providing the foundation for GMR-based digital electronics. While logic elements can be made with combinations of transpinnors, just as with transistors, there is another alternative. Various logic operations can be implemented with a single transpinnor. These transpinnors have more than one input line. Examples of such transpinnors are shown in FIGS. 8 and 9.

Figure 8:
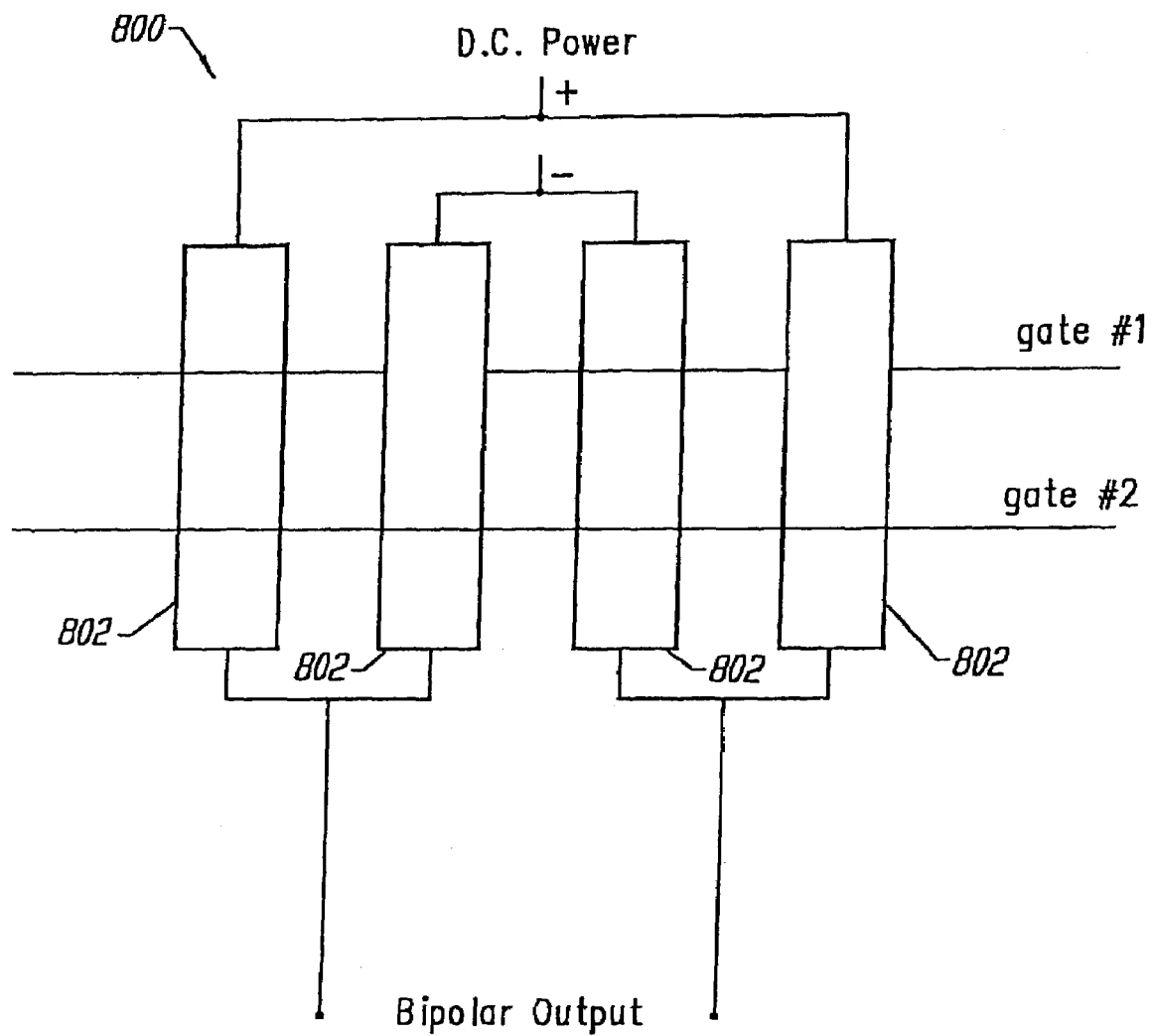
FIG. 8 shows a multiple-input transpinnor configuration.

FIG. 8 shows one such all-metal GMR transpinnor 800 and two drive lines. Four GMR films 802 are tied together in a folded Wheatstone bridge configuration. Each GMR film 802 is shown as a rectangular strip with its easy axis oriented in the long direction. Flux closure is also along the easy axis, but is not shown. The two drive lines (gates #1 and #2) are deposited conductor strips. The application of current on gate #2 tends to magnetize all four GMR films in the same direction. The application of current on gate #1 tends to magnetize adjacent GMR films oppositely. With the proper pulse combinations one can use half-select pulses to magnetize the high-coercivity layers positively or negatively in one direction, or to magnetize alternate strips in alternate directions.

As mentioned above, when a transpinnor is balanced, its output is zero. An input current which exceeds the threshold for switching a lower-coercivity layer in one or more of the GMR films can change the film resistance, thus unbalancing the transpinnor, resulting in an output signal. Particular types of logic gates can be realized from the basic transpinnor by specific configurations of input lines and by suitable choices of input current values. Additional characteristics affecting the operation of transpinnor logic gates include the choice of resistors through which a given input current passes, the current polarities in selected resistors, and the direction of the magnetic field produced by the input current relative to the magnetization of the lower-coercivity layers in the transpinnor.

Two procedures are useful in implementing logic gates with a single transpinnor. One involves setting the transpinnor threshold which is determined by the coercivity of the low-coercivity layers in the GMR film. Various ways of establishing the coercivity of a thin film are known in the art. Thus, the threshold is set by choosing or adjusting the coercivity of at least one of the low-coercivity layers in the GMR films of the transpinnor. The other procedure involves switching the polarity of the GMR films which is determined by the magnetization orientation of all the film layers. The polarity of the transpinnor is thus switched by reversing the direction of magnetization of all layers of all GMR films in the transpinnor.

According to various embodiments, the balancing of transpinnor GMR elements is accomplished using a technique known as magnetoresistive trimming in which the magnetization of selected GMR elements are manipulated to achieve the desired balance. Magnetoresistive trimming techniques are described in U.S. Pat. No. 6,469,927 for MAGNETORESISTIVE TRIMMING OF GMR CIRCUITS published Oct. 22, 2002, the entire disclosure of which is incorporated herein by reference for all purposes.

Logic operations which can be implemented with a single transpinnor include the following:

AND gate: A transpinnor will not switch unless the sum of fields from the input lines exceeds the switching threshold. An AND gate is defined as one that yields no output unless all of its inputs are logical "1"s. If the transpinnor has n input lines, and the amplitude of each input pulse is $(1/n)^{th}$ of the threshold, then the transpinnor is an AND gate.

NAND gate: This is the inverse of the AND gate and gives an output if and only if all inputs are zero. A transpinnor NAND gate is made similarly as the AND gate, by reversing the magnetization of all elements so that the gate will just switch if all n inputs are logical "0"s and not switch if one or more are a logical "1".

OR gate: The definition of an OR gate is one that gives an output if one or both inputs are a "1". This can be made by setting the threshold of a transpinnor such that a single input is sufficient to switch the film.

A practical problem is presented by the fact that different switching thresholds are required for different single transpinnor logic gates. There are, however, a variety of ways in which these thresholds may be adjusted for different types of gates on the same substrate. These include manipulation of the order of deposition because the order strongly influences the coercivity of both the low and high coercivity films. This method involves additional deposition steps. Another method of adjusting the switching threshold for a particular transpinnor is derived from the fact that the magnetic field from a current carrying stripline depends on the width of the strip line.

NOR gate: The definition of a NOR gate is one that gives an output if one or both inputs are a "0". This is merely the inverse of an OR. This can be done by reversing the polarity of the GMR films as in the above case of a NAND.

NOT gate: A NOT gate is an inverter that changes the polarity of an input pulse from positive to negative and vice versa. This is easily done with a transpinnor by reversing the polarity of the input winding, or by interchanging the power terminals.

Exclusive OR (XOR) gate: This is a gate that gives an output if one and only one of the inputs is a "1". This can be done with a transpinnor such that one input is sufficient to switch the low-coercivity element, yielding an output, while two or more pulse inputs yield a field large enough to switch the high-coercivity element as well, yielding zero output. The gate must be reset after each use.

A circuit diagram of a transpinnor-based XOR gate 900 is shown in FIG. 9. As shown, input current 1 goes through resistors R1 and R3 and input current 2 goes through resistors R2 and R4. If the currents in both inputs are less than the switching threshold, the output is zero. If the current in one and only one of the two input currents is above this threshold, then the resistance of either pair of resistors changes, the transpinnor becomes unbalanced, and an output signal is generated. If both input currents are above the switching threshold, all four resistors change equally (if properly trimmed), the transpinnor remains balanced, and the output signal is zero.

A circuit diagrams for other transpinnor configurations are shown in FIGS. 10a and 10b which, according to various embodiments, are used to implement AND and OR gates. Unlike XOR gate 900 in which one input goes through GMR elements R1 and R3 where the other goes through R2 and R4, both inputs for AND gate 1000 and OR gate 1050 go through all four elements. Referring now to FIG. 10a, AND gate 1000 is configured to function as an AND gate by selecting the current polarities such that the current from input 1 runs opposite to the current in input 2 through R2 and R4, and in the same direction through R1 and R3. If the currents in both inputs are less than half the switching currents, all four GMR elements remain unchanged, the transpinnor remains balanced, and the output of gate 1000 is zero.

If the current in one, and only one, input is above the switching threshold, all four GMR elements change equally, the transpinnor remains balanced, and the output of gate 1000 is zero. If, on the other hand, the currents in both inputs are above the switching threshold (and thus the net current through R2 and R4 is below the switching threshold), the transpinnor becomes unbalanced and gate 1000 produces an output signal.

Referring now to FIG. 10b, operation of gate 1050 as an OR gate is achieved because the input lines generate magnetic fields in GMR elements R1 and R3 opposing the directions of the magnetization vectors in the lower-coercivity layers of these elements, and magnetic fields in R2 and R4 in the same directions as the magnetization vectors in the lower-coercivity layers of these elements. With such a configuration, a sufficiently large current through R1 and R3 will change their resistances but not the resistances of R2 and R4, unbalancing the transpinnor and thereby producing an output.

If currents in both inputs are less than half the switching current, all four GMR elements remain unchanged, the transpinnor remains balanced, and the output of OR gate 1050 is zero. However, if the current in either or both of the inputs are above the switching current, the resistances of elements R1 and R3 change while those of R2 and R4 remain the same, the transpinnor becomes unbalanced, and OR gate 1050 generates an output signal. It will be understood that the net current through R2 and R4 should not be sufficient to produce a magnetic field which could switch the lower-coercivity layers of these elements.

For digital applications, transpinnors with sharp thresholds and square-pulse outputs are desirable. For analog applications, a linear response is better. Transpinnors operating in the linear region can be used to develop a full complement of basic analog circuits, sufficient to create general-purpose analog circuitry based on GMR films.

A specific example of a transpinnor operating in the linear region for application to signal amplification illustrates some of the unique advantages of the dual functionality of the transpinnor over silicon technology. Differential amplifiers are typically used to eliminate common-mode signal and common-mode noise within the frequency range of their operation. As discussed above, the range of operation of the transpinnor in its transformer function extends from (and including) dc to the high-frequency cutoff limit. The GMR transpinnor can advantageously be utilized in its transformer function to remove common-mode signal in the differential-input mode, as well as in its transistor function to amplify a low signal in the single-ended output mode. In low-signal amplification, GMR transpinnors have the additional advantage of eliminating the problem of offset voltage at the input that is so troublesome in silicon integrated circuits. It should be noted that a high premium is paid in silicon technology to achieve low-offset input voltage for integrated differential amplifiers. That is, low-offset input voltage is achieved in silicon circuits only at the expense of degrading other parameters. No such price is associated with the use of transpinnors because of their dual transformer/transistor properties. Specifically, the input signal is applied to a differential input having the properties of a transformer primary with an additional advantage of flat low-frequency response inclusive to dc. The output signal is amplified by an output having transistor properties. Transpinnors are thus especially well suited as differential amplifiers.

Figure 11:
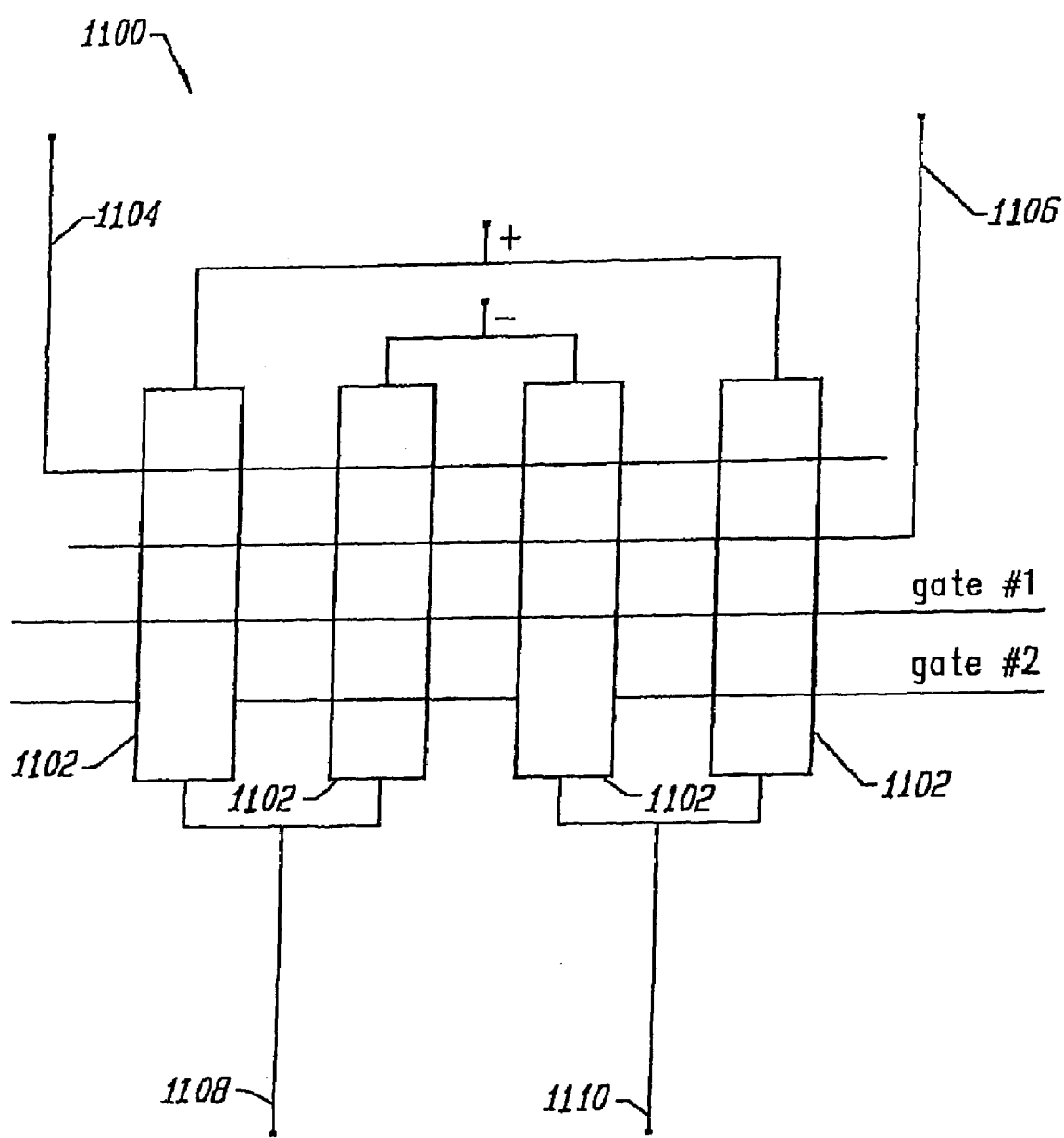
FIG. 11 shows a transpinnor configured as a gated GMR differential amplifier.

FIG. 11 shows a gated GMR differential amplifier 1100. Once again, four GMR films 1102 are arranged in a Wheatstone bridge configuration. Two input lines 1104 and 1106 supply a switching field to the permalloy layers in GMR films 1102. If the signals on lines 1104 and 1106 are identical, no switching takes place and the output (between nodes 1108 and 1110) is zero. Any common mode noise is thus rejected. All four lines (gate lines #1 and #2 and input lines 1104 and 1106) are electrically isolated, i.e., there is no electrical connection between them or to GMR films 1102 in gated differential amplifier 1100.

Since transpinnors are current driven devices, an important parameter is the output current of a given transpinnor for a given input current. This determines whether one transpinnor can switch another, for example, or how much amplification can be achieved. Of particular interest is the dependence of the amplification factor $A=i_{out}/i_{in}$ on the power supply to the transpinnor and on its parameters. This relationship is given by:

$$A = \pi\ 1000\ gmr\ VL/(H_c w^2 R_{sq}) \tag{5}$$

where V is the power supply voltage in volts, gmr is the fractional GMR value of the film (i.e., the GMR value is normally quoted as a percentage), $H_c$ is the coercivity in Oe, w and L are the GMR strip width and length in microns, and Rsq=r/(L/w) is the sheet resistivity in ohms per square of a GMR film with resistance r (ohms per square is a standard term in thin film technology because the resistance from edge to edge of a thin film square is independent of the size of the square).

The field H produced by $i_{in}$ in a stripline of width w is given by:

$$H = 2\pi\ i_{in}/w \tag{6}$$

and $i_{out}$ is given by:

$$i_{out} = 10^3\ gmr\ v/(2r) \tag{7}$$

where H is in Oe, $i_{in}$ and $i_{out}$ are in mA, w is in microns, and V is in volts.

Many transpinnor-based devices require one transpinnor to switch another transpinnor. Examples include a transpinnor shift register, a transpinnor selection matrix, and a transpinnor multistage amplifier. When a transpinnor is used to switch another transpinnor, the output current of the switching transpinnor becomes the input current of the transpinnor to be switched. A single transpinnor can readily switch multiple transpinnors as shown by the following numerical examples of the performance characteristics of several transpinnor-based devices:

1) shift register: In a transpinnor shift register, one transpinnor switches an identical transpinnor which, in turn, switches another identical transpinnor, an so on. An amplification factor of 1 is required. For w=L=5 microns, $H_c$=1 Oe, gmr=0.06, and $R_{sq}$=6 ohms per square, a power supply voltage of 0.168 is required (see equation (5)).

2) amplifier: For a power supply voltage of 3 volts on a chip, with the other parameters the same as for example 1 above, the amplification factor is 18.

3) branching logic: For the same parameters as in example 2, one transpinnor can switch a total of 18 other transpinnors.

4) smaller transpinnors: If, from the examples above, w and L were both reduced by a factor of 5 to 1 micron, the required voltage for an amplification factor of 1 would also be reduced by a factor of 5 to 33.6 mV. Thus, for a 3 volt supply, an amplification factor of 90 can be achieved.

5) different aspect ratios: For L=5 microns (as in example 1) and w=1 micron, the required voltage for an amplification factor of 1 is reduced to 6.7 mV.

6) single-transpinnor comparator design: a comparator is a high gain differential amplifier, easily saturated, e.g., FIG. 11; For L=10 microns, w=1 micron, V=0.2 volt, Hc=1 Oe, gmr=0.06, and Rsq=6 ohms/sq for the GMR films, the amplification factor is 63 according to equation (5), and the output current of the comparator is 0.1 mA according to equation (7). For decoder logic with w=0.5 micron, the magnetic field applied to the decoder logic is 1.26 Oe according to equation (6), large enough to drive the decoder logic.

7) comparator power dissipation: For the same parameters as in example 6, the resistance of each GMR element of the transpinnor is 60 ohms. This is the effective resistance between the power supply and ground of the transpinnor. For a supply voltage of 0.2 volt, the power dissipation of the comparator is $\{(0.2 \text{ volts})^2/60 \text{ ohms}\}$=0.67 mW.

The foregoing examples illustrate that even transpinnors with modest GMR values can achieve enough gain to perform the analog and logic functions required to implement a wide variety of circuits including, for example, a field programmable gate array (FPGA) and a field programmable system-on-a-chip (FPSOC) as will be described below.

Figure 12A:
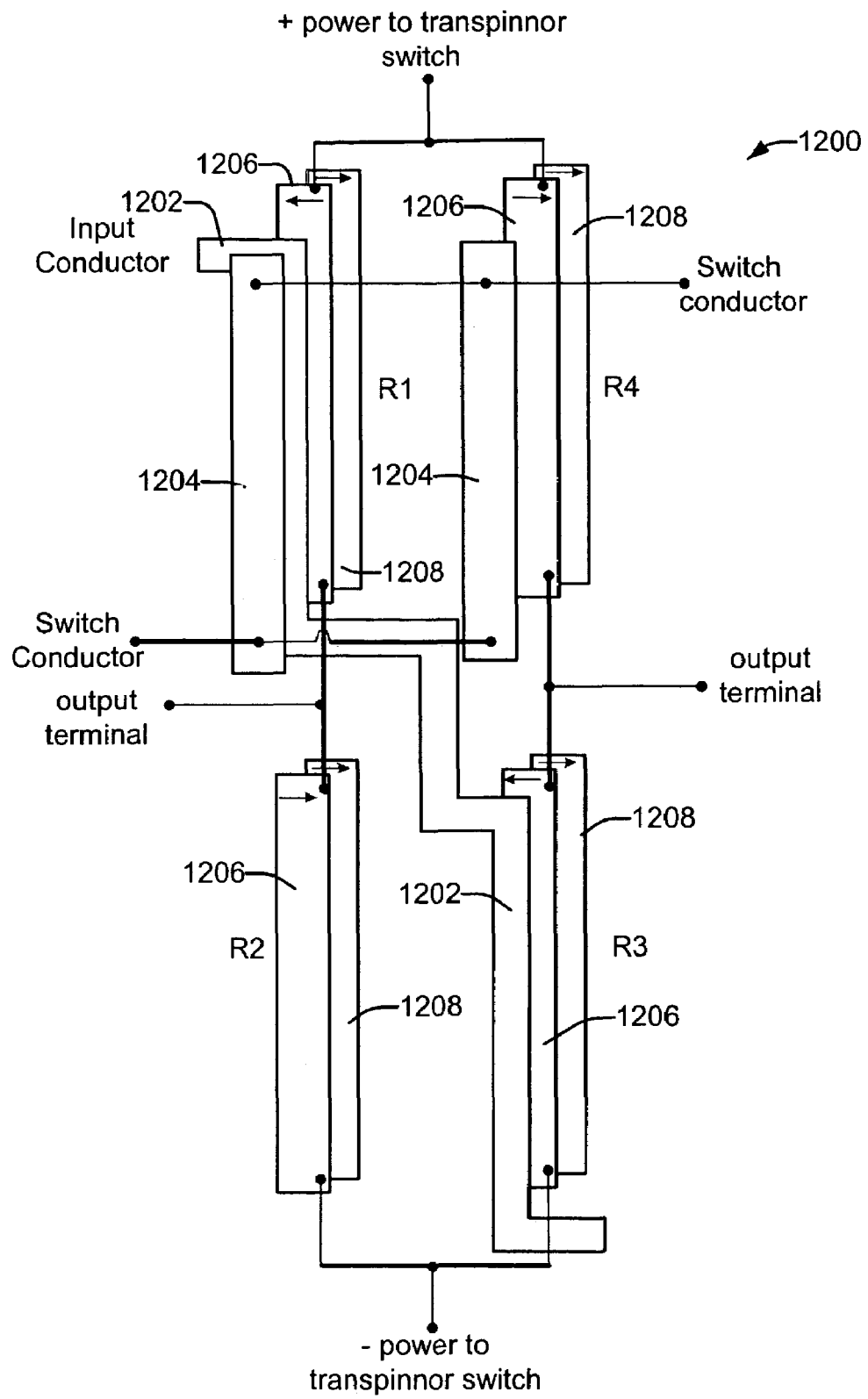
FIGS. 12a and 12b show a transpinnor configured as a switch according to a specific embodiment of the invention.
Figure 12B:
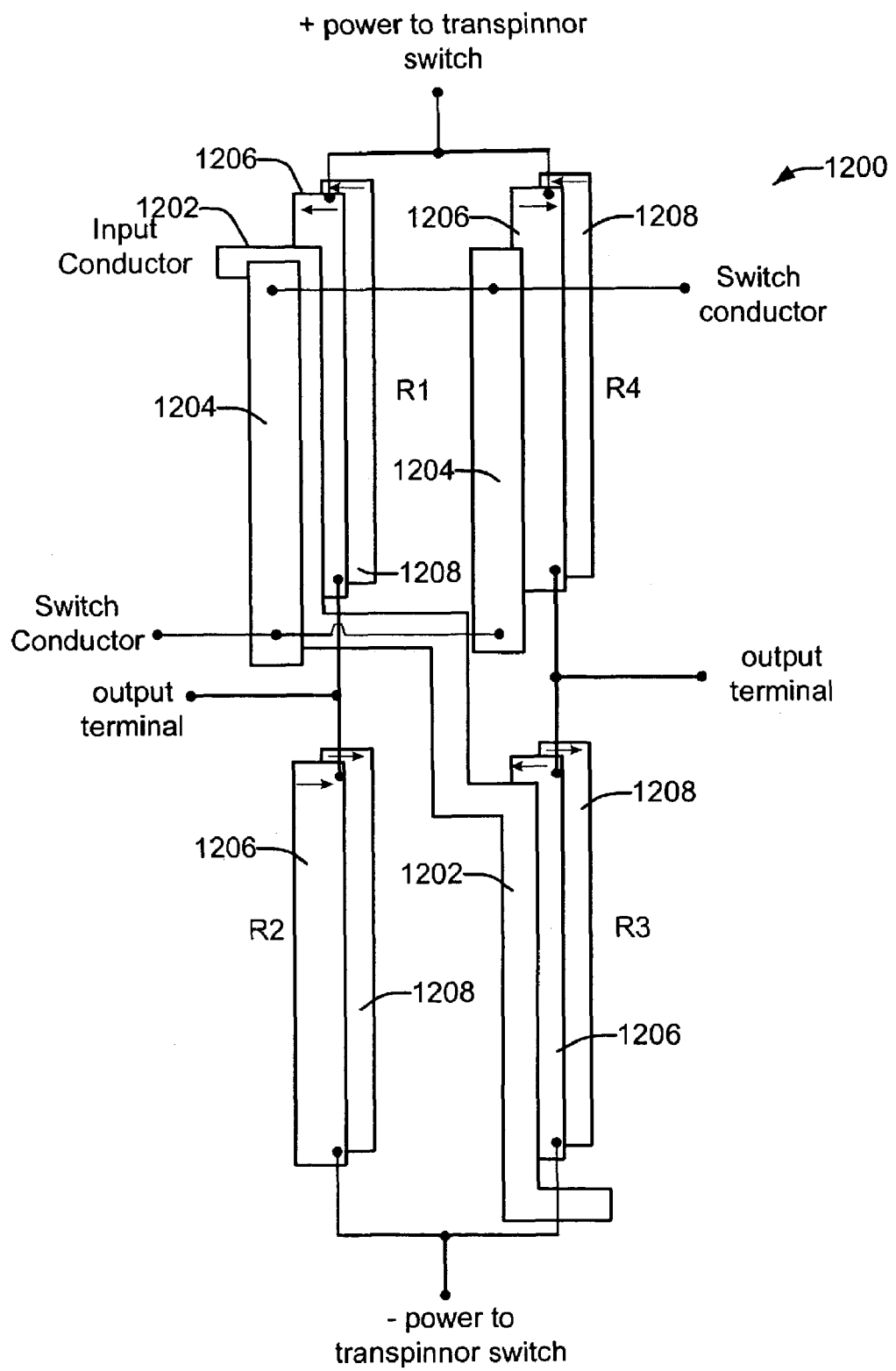

According to various embodiments of the invention, transpinnors may be configured to operate as switches that are nonvolatile like EEPROMs yet are characterized by the programming speed associated with SRAMs. FIGS. 12a and 12b show exploded views of a transpinnor switch 1200 designed according to one such embodiment. The nonmagnetic conductor layer in each GMR film separating the high coercivity layer 1208 (e.g., cobalt) and the low coercivity layer 1206 (e.g., permalloy) is not shown. The basic operation of switch 1200 involves the selective application of a large enough switching current on switch conductor 1204 to set the directions of the magnetization vectors of both the higher and lower-coercivity layers of GMR elements R1 and R4, while the magnitude of the input current on input conductor 1202 is only large enough to switch the lower-coercivity layers of R1 and R3.

As described above and generally speaking, transpinnor technology operates by impressing a specific magnetization direction on a lower-coercivity layer (e.g., permalloy). In digital applications, two opposing magnetizations of this layer correspond to two logic levels. By contrast, the higher-coercivity layer (e.g., cobalt) in such applications remains pinned to a particular magnetization.

As will be discussed, reconfigurability of a programmable SOC may be achieved through a transpinnor switch which includes two nonmagnetic, conductor layers inductively coupled to various ones of the GMR films of which the transpinnor is composed, e.g., FIG. 12. In general and as discussed above, the current in the input conductor of the transpinnor switch is large enough to set (reverse) the magnetization of the lower-coercivity layers of the GMR films to which the input conductor is coupled but not that of the higher-coercivity layers. By contrast, the current in the switch conductor can be large enough to set (reverse) the magnetization of both layers in the GMR films to which the switch conductor is coupled.

The basic idea of the transpinnor switch in digital applications is to use the switch current to control the magnetization of the higher-coercivity layers in selected GMR films of the transpinnor in such a way that the output is either a logic signal following the input, or zero irrespective of the input. It should be noted that there are various ways of configuring the transpinnor switch to realize this functionality. That is, non-magnetic conductors may be inductively coupled to various subsets of the GMR films to achieve this functionality and remain within the scope of the invention.

According to one embodiment shown in FIGS. 12a and 12b, each of the input conductor 1202 and the switch conductor 1204 are inductively coupled to two of the GMR films of the transpinnor 1200. That is, input conductor 1202 is coupled to GMR films R1 and R3, and switch conductor 1204 is coupled to R1 and R4. The nonmagnetic conductor layer between the cobalt and permalloy in each GMR film is not shown for simplicity.

Transpinnor switch 1200 is initialized with all magnetizations in all four films parallel to one another (not shown). In this initialized state the resistances in all four films are low and the transpinnor is balanced, so there is no output when a power voltage is applied. A current is then applied via input conductor 1202 to reverse the magnetization in the low coercivity layers 1206 in films R1 and R3, resulting in a magnetization which is antiparallel to that of high coercivity layers 1208 as shown in FIG. 12a. This increases the resistance of films R1 and R3, unbalances the bridge, and produces a current in the output terminals when power is applied. Thus, in this configuration switch 1200 is "on," i.e., an asserted logic signal on input conductor 1202 produces corresponding logic signal on the output.

To turn switch 1200 "off," a switch current is applied via switch conductor 1204 to set the magnetizations in the high and low coercivity layers of R1 and R4 in a direction opposite the previous magnetization state of the high coercivity layers. Then, a small current is applied via switch conductor 1204 to reverse the low coercivity (but not the high coercivity) magnetizations in R1 and R4. Finally, a current with the same polarity as that used to orient the low coercivity layers in R1 and R3 in FIG. 12a is applied via input conductor 1202. The result is that R1 and R2 are low, R3 and R4 are high, as shown in FIG. 12b, and the transpinnor switch is balanced. Now, when an input current of the same polarity as prior to the reversal of the high coercivity layers is applied, the bridge remains balanced and no output is generated, i.e., the switch is "off," irrespective of the asserted input logic level.

According to various embodiments, several transpinnor switches designed according to the invention may be connected in series to route a single input signal to a variety of circuits within a system. For example, a two-switch device may be configured with one switch "on" and the other "off" such that one of two circuits in a programmable system is enabled while another is disabled. As described above, the low coercivity layers in the "off" switch do not function, i.e., the output current is zero irrespective of which of the two logic levels is asserted at the input, while those in the "on"

switch do, i.e., the output signal corresponds to the input signal. However, when the high coercivity layers of the appropriate films in both switches are magnetized in the other direction, the roles of the low coercivity layers in the two switches are reversed. Reconfiguration is thus achieved by simultaneously turning the "on" switch "off" and vice versa.

It should be noted that, according to some embodiments, the transition between balanced and unbalanced transpinnor configurations—and hence between output and no output—can be realized by reversing the polarity of the input signal to set the magnetization of the soft layer alone. However, this would obviate the use of a signal of given polarity to operate the logic circuitry in a given configuration.

According to various embodiment of the invention, there are a variety of ways in which transpinnor switch 1200 may be reconfigured. For example, we have just discussed shutting off the switch by reversing the magnetization of the high coercivity layers in R1 and R4. This shuts off the switch regardless of the input to the low coercivity layers of the films with which the input conductor is associated. It should be understood that one could just as well reverse the high coercivity layers in R2 and R3 to achieve the same effect.

If one instead reverses the high coercivity layers in R1 and R3, this merely reverses the polarity of the output, i.e., the switch conducts with full output for one input polarity. The same is true for switching the high coercivity layers of R2 and R4.

If one reverses the high coercivity layer in only one of the films, the result is a switch with half the output. Reversing the magnetization of the low coercivity layers with an input current does not shut the switch off. Reversing the high coercivity layers in three of the GMR elements (e.g., R1, R2, and R3) also reduces the output by half.

In summary, the two schemes that turn switch 1200 off for both input polarities are either to reverse the magnetization of the high coercivity layers in R1 and R4 or to reverse the magnetization of the high coercivity layers in R2 and R3.

Figure 13A:
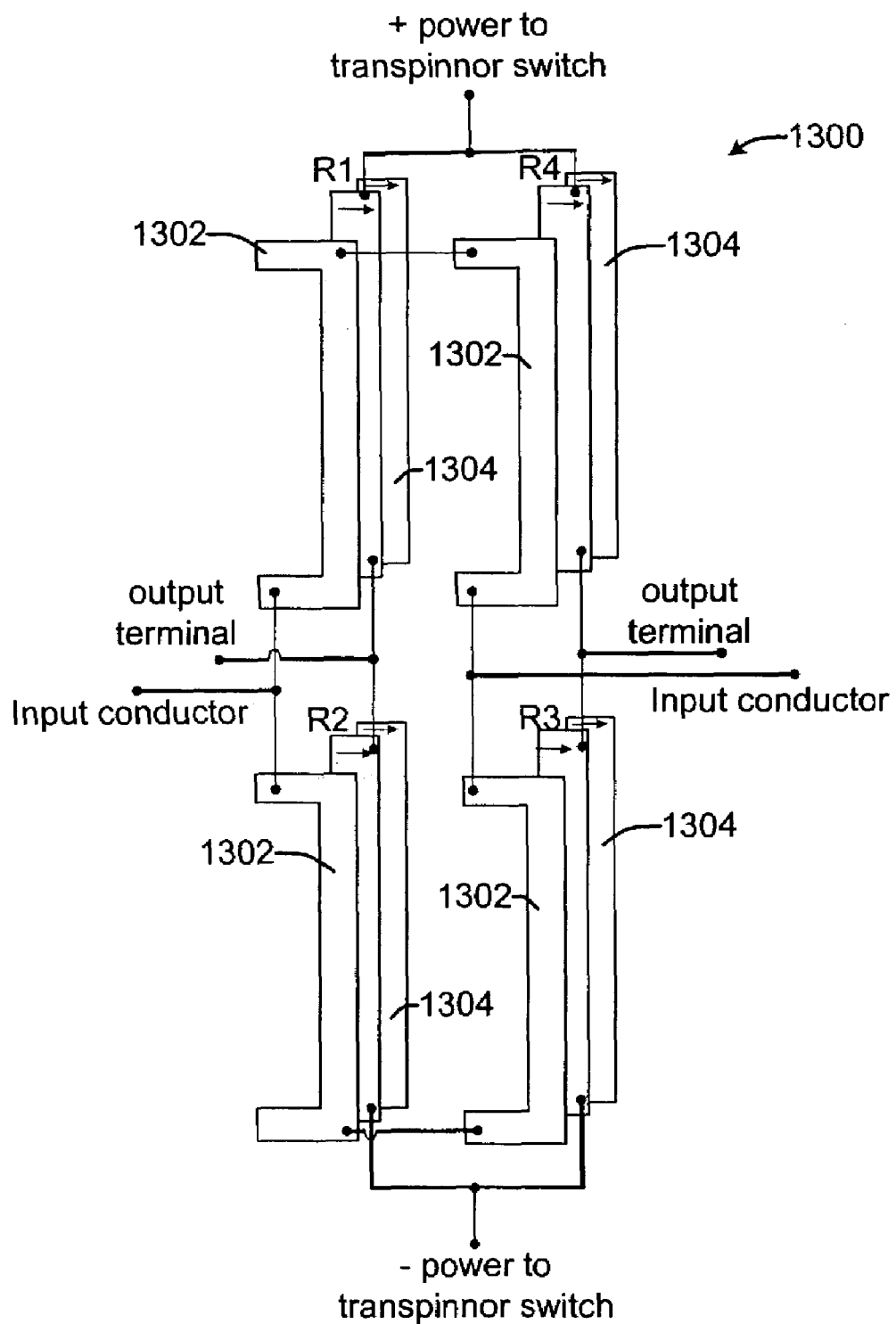
FIGS. 13a and 13b show another transpinnor configured as a switch according to another specific embodiment of the invention.

Transpinnor switch 1200 has an input conductor 1202 coupled to only two thin-film elements, i.e., R1 and R3. Transpinnor switches designed according to various other embodiments of the invention may have an input conductor over all four thin-film elements in the bridge. Such a switch 1300 is shown in FIG. 13*a*. Input conductor 1302 is coupled to R1–R4 and switch 1300 can be configured to pass input currents of both polarities. Transpinnor switch 1300 can be switched off by reversing the magnetization in high-coercivity layer 1304 of either R1 and R4, or R2 and R3. It should be noted that the switch conductor by which this reversing is accomplished is not shown in FIG. 13*a* for the sake of simplicity and because of the fact that it can be coupled to either combination of R1 and R4 or R2 and R3.

Figure 13B:
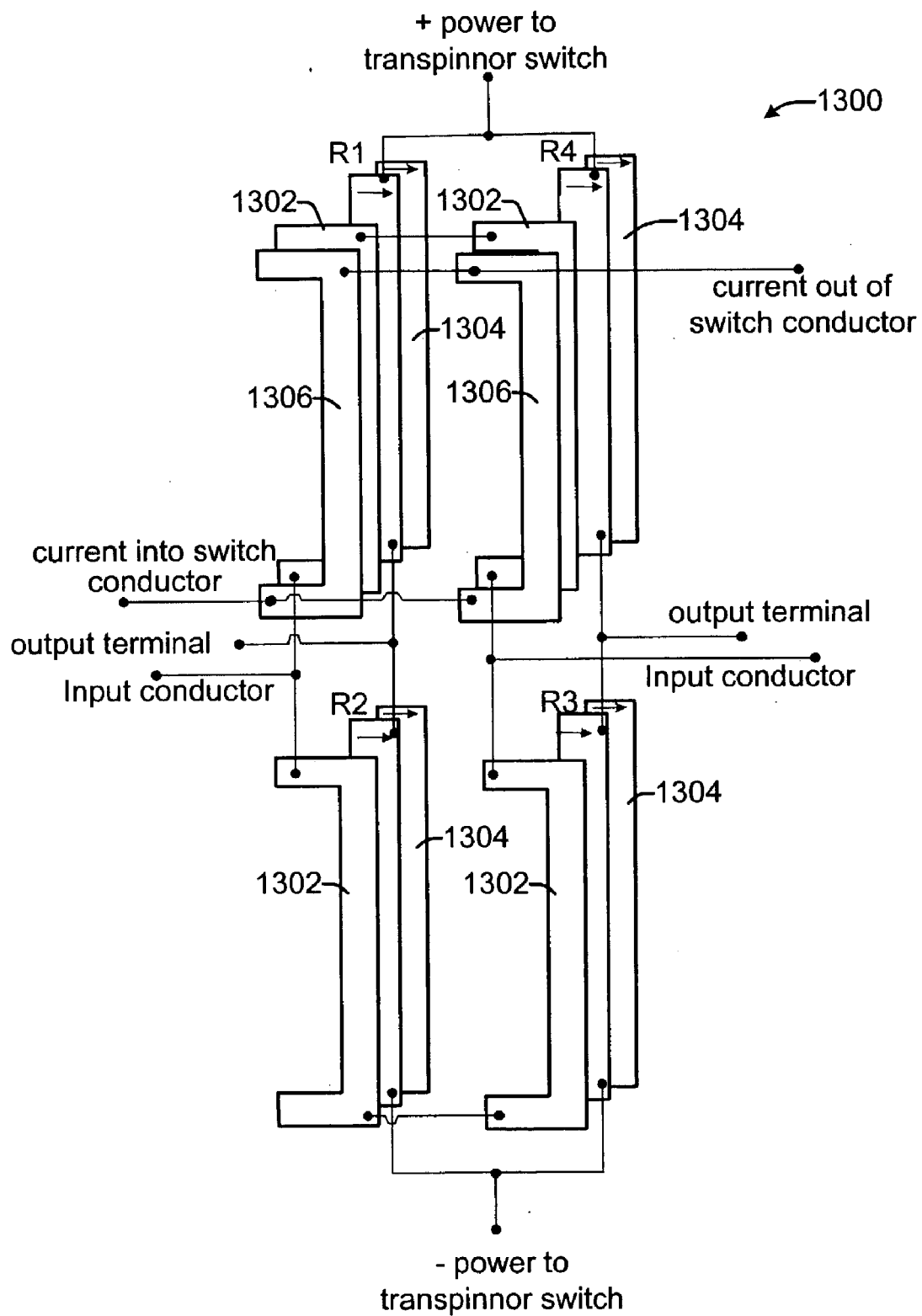

Transpinnor switch 1300 is shown in FIG. 13*b* with switch conductor 1306 inductively coupled to R1 and R4. This configuration passes both polarities of input current if the high-coercivity layers 1304 of all four thin-film elements are magnetized in the same direction, and blocks all polarities of input current when the magnetization of high-coercivity layers 1304 is reversed in R1 and R4. A similar embodiment (not shown) has the switch conductor associated with R2 and R3.

It should be noted that, according to various embodiments, the transpinnor switch of the present invention may be used for either digital or analog applications. According to an embodiment in which a transpinnor switch is employed to transmit analog signals, the switching field generated by the switching current is perpendicular to the easy-axis of the GMR elements rather than parallel. When the switch is enabled, the switching bias field is raised above the anisotropy field of the lower-coercivity layer. This causes the transpinnor to operate like a linear, nearly lossless transformer. When the bias field is turned off, there is no output unless the signal is large enough to exceed the coercivity of the lower-coercivity layer. In this way, analog signals may also be routed point-to-point according to the invention.

According to various embodiments of the invention, the transpinnor switch of the present invention may be configured to output an amplified version of the input. That is, using the techniques described above, transpinnor switches may be configured to provide a wide range of amplification factors including negative amplification factors, i.e., a transpinnor switch may be configured as an inverter. This amplification capability can be important for applications in which it is desirable to cascade transpinnor switches (see FIG. 14*b*).

Figure 14:
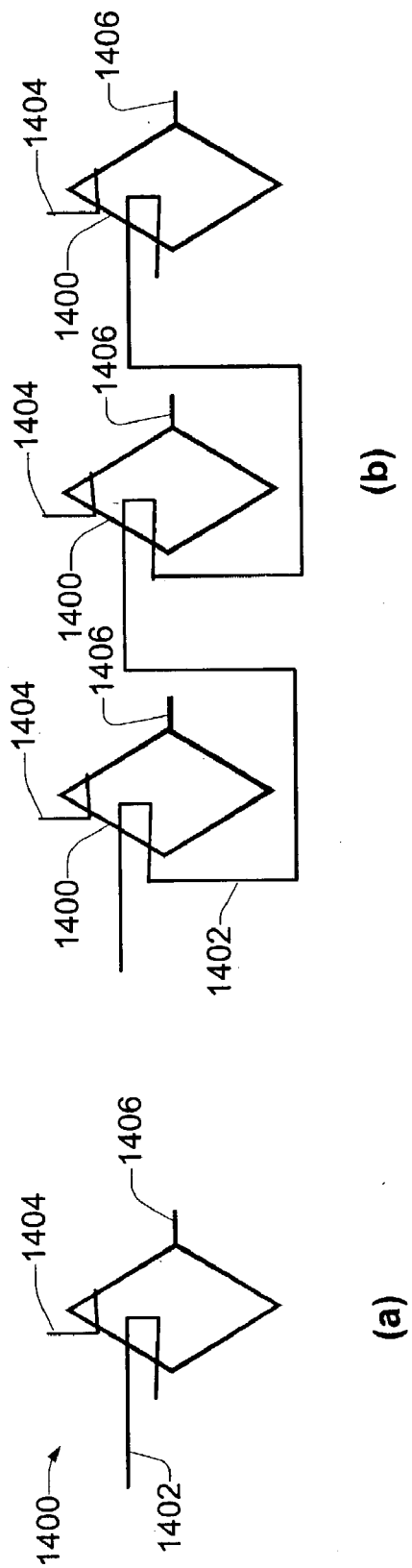
FIGS. 14a and 14b show a circuit symbol of a transpinnor switch and a circuit diagram of three transpinnor switches connected in series.

FIG. 14*a* shows a circuit symbol representing a transpinnor switch 1400 having an input conductor 1402, a switch conductor 1404, and an output 1406. FIG. 14*b* shows three such transpinnor switches 1400 sharing the same input conductor 1402 but with three separate outputs 1406, each of which can be turned on or off with the corresponding switch conductor 1404.

Figure 15:
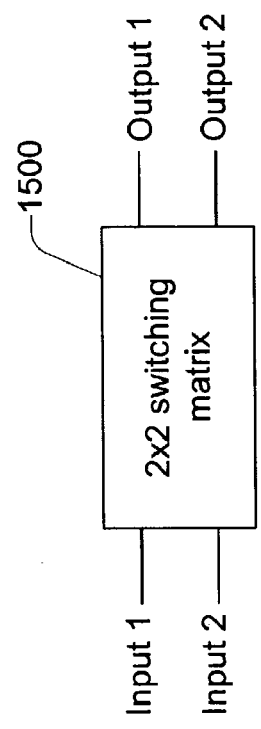
FIG. 15 is a simplified representation of a switching matrix.

The ability to cascade transpinnor switches is also advantageous for creating switching matrices such as the 2×2 switching matrix 1500 shown in FIG. 15. More specific implementations of some exemplary switching matrices will now be described with reference to FIGS. 16*a* and 16*b*. It will be understood that the switching matrices shown may be used in a wide variety of context to effect the interconnection of signal paths for any of a variety of purposes. It will also be understood that these basic switching matrices may be expanded beyond the sizes shown to selectively interconnect any of a first plurality of m signal lines with any of a second plurality of n signal lines, i.e., an m×n switching matrix. The relevance of this will become apparent with reference to applications of the transpinnor switch of the present invention described below.

Figure 16:
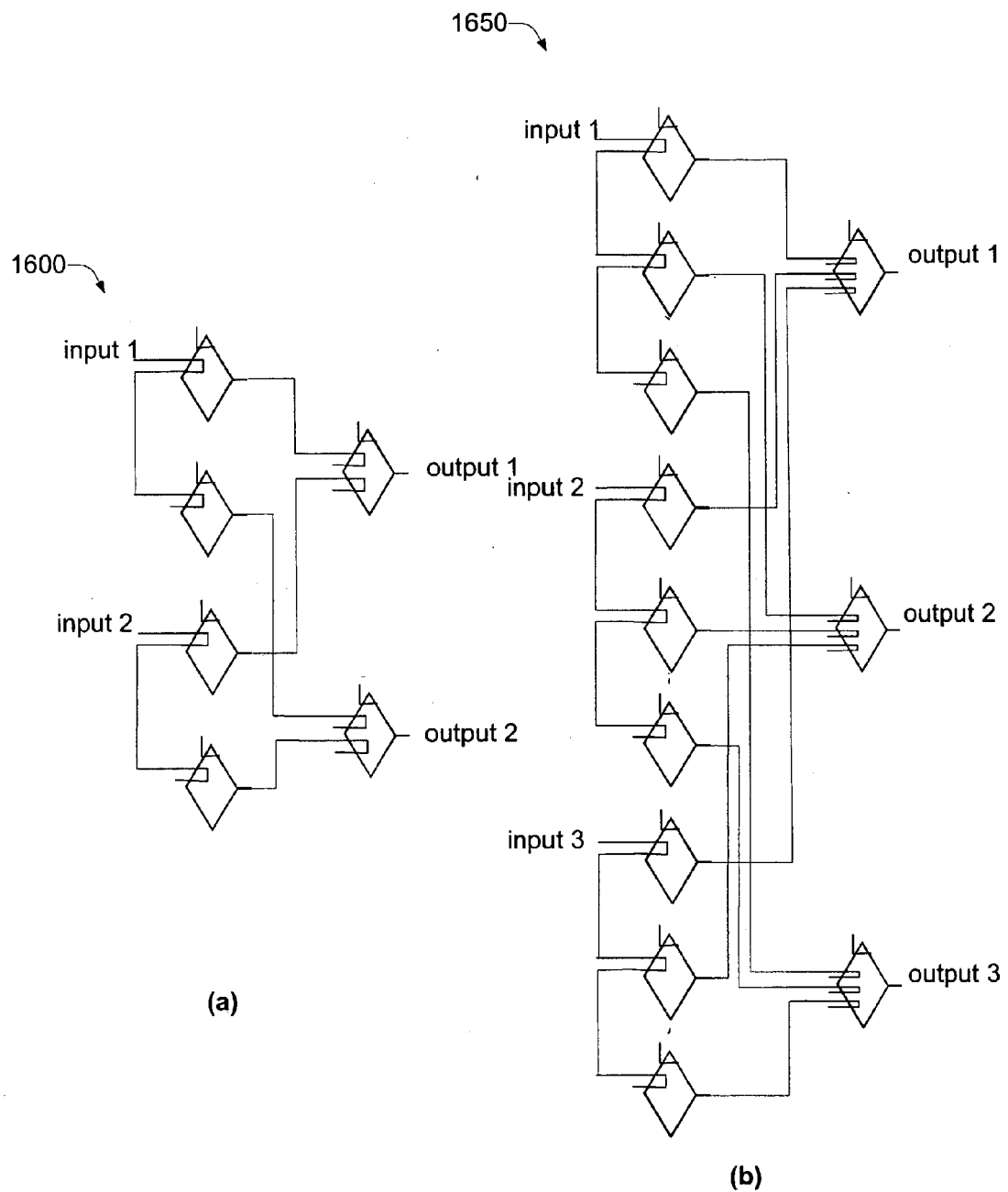
FIGS. 16a and 16b show 2 transpinnor-based switching matrices.

FIG. 16*a* shows a specific implementation of a 2×2 switching matrix 1600 corresponding to the simplified representation of FIG. 15. Each of the inputs can be switched into any of the outputs. Thus it is possible, for example, to connect input 1 to output 1, and input 2 to output 2, or, input 1 to output 2 and input 2 to output 1. One can have as many inputs to a transpinnor as desired, because an input line may be implemented as a stripline deposited above a GMR film and insulated therefrom, and one can have many such lines, one above another. FIG. 16*b* shows a specific implementation of a 3×3 switching matrix 1650, in which any input can be connected to any output.

Programmable logic devices (PLDs) are a class of circuits widely used in LSI and VLSI design to implement two-level, sum-of-products Boolean functions. PLDs include programmable array logic (PALs), field programmable gate arrays (FPGAs), programmable logic arrays (PLAs), and read only memories (ROMs). One of the advantages of PLDs is their highly regular layout structure. That is, a typical PLD includes an AND plane followed by an OR plane. The logic function performed by the device is determined by the presence or absence of contacts or connections at row and column intersections in a single conducting layer.

Figure 17:
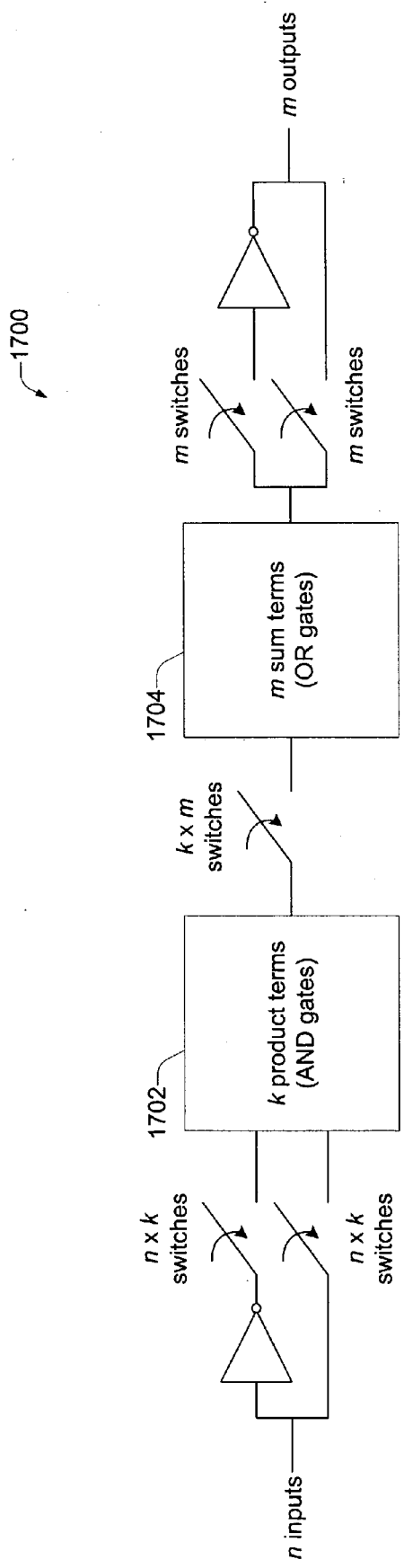
FIG. 17 is a simplified block diagram of a field programmable gate array.

FPGAs are the most flexible of the PLDs in that they can be reconfigured multiple times. In conventional semiconductor technology, FPGA implementations typically choose between two very different types of memories to control their switches, one which ensures nonvolatility, a one which ensures speed. A block diagram of a generic FPGA architecture is shown in FIG. 17. FPGA 1700 has n inputs, k product terms (AND array 1702), m sum terms (OR array 1704), m output, and (2nk+mk+2m) switches. In conventional semiconductor technology, the switches are typically implemented with MOSFETs in conjunction with either EEPROMs or SRAM which may be reloaded with different data to reconfigure the FPGA. A significant drawback with the MOSFET/SRAM combination is that if power is lost, the SRAM must be reloaded for the FPGA to function properly. On the other hand, although EEPROMs avoid this issue because they are nonvolatile, they are an order of magnitude slower than SRAM, limiting the reprogramming speed of an EEPROM-based FPGA accordingly.

Therefore, according to the present invention, an FPGA architecture is provided which employs any of the various embodiments of the transpinnor switches described herein (e.g., transpinnor switch 1200) as the basis for the switch matrices with which the product and sum terms of the FPGA may be interconnected. The nonvolatile nature of the state of these transpinnor switches, and the speed with which they may be accessed and switched results in a solution which has the best of both previous options without the attendant disadvantages. According to some of these embodiments, the product terms and sum terms of the FPGA (e.g., arrays 1702 and 1704) are implemented using transpinnor logic gates including, for example, those described above with reference to FIGS. 8–10.

According to various embodiments, an FPGA architecture designed according to the invention may conform to the conventional paradigm in which switches are controlled by associated memory elements. According to some of these embodiments, the memory elements may be implemented using any of the GMR-based memory cells described in U.S. Pat. No. 5,587,943 for NONVOLATILE MAGNETORESISTIVE MEMORY WITH FULLY CLOSED FLUX OPERATION issued Dec. 24, 1996, and U.S. Pat. No. 6,483,740 for ALL METAL GIANT MAGNETORESISTIVE MEMORY issued Nov. 19, 2002, the entire disclosures of both of which are incorporated herein by reference for all purposes. Such memory elements will be referred to herein generically as SpinRAM elements.

According to other embodiments, the nonvolatile nature of the transpinnor switch of the present invention obviates the need for controlling the switches with associated memory elements. That is, because the state of the switches designed according to the invention is nonvolatile, the switches themselves may be directly programmed as opposed to indirectly programming them via the associated memory elements.

Figure 18:
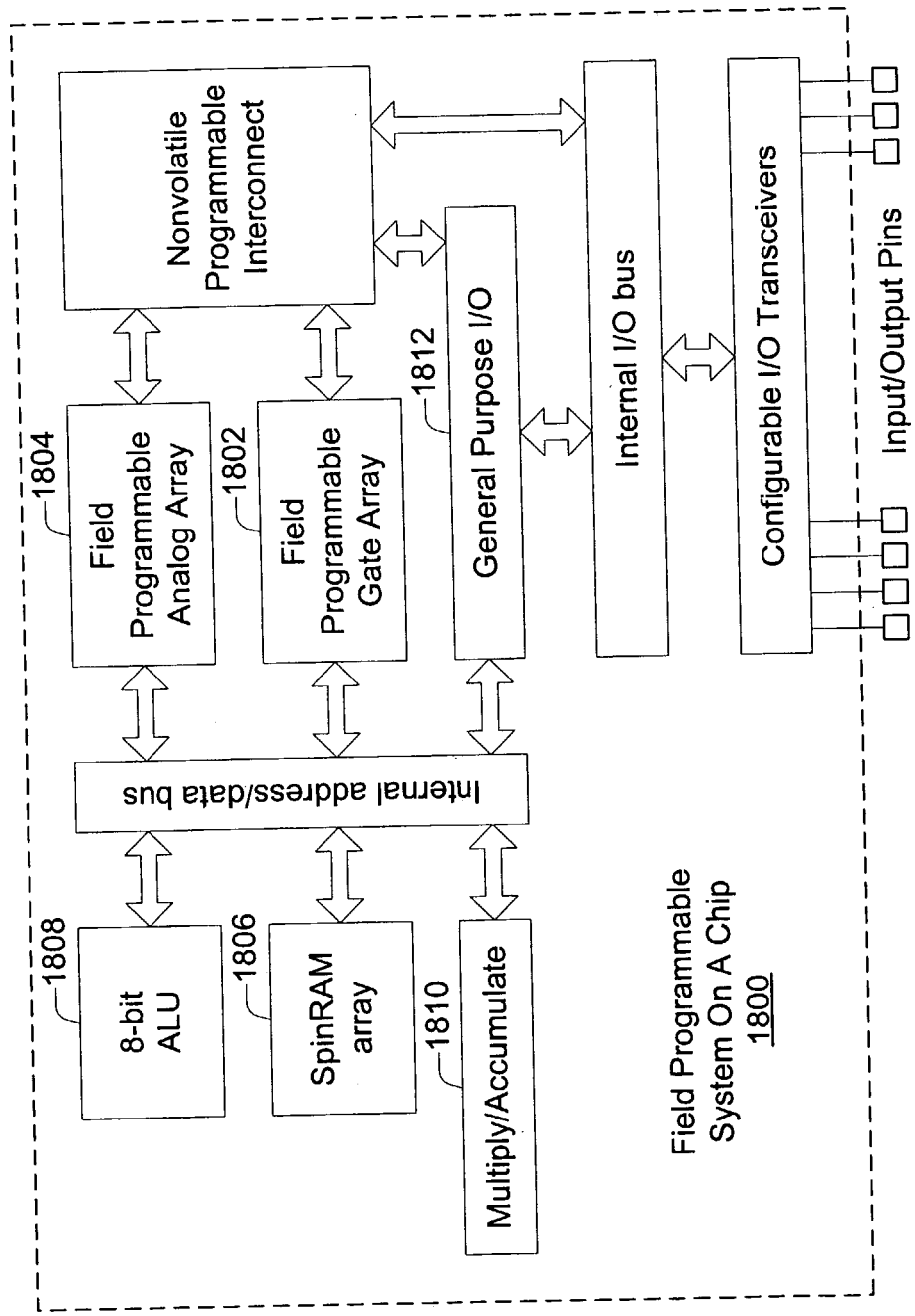
FIG. 18 is a simplified block diagram of a field programmable system on a chip.

According to still other embodiments, one or more FPGAs designed according to the present invention is included as part of a larger, field programmable system-on-a-chip (FPSOC). One such generalized embodiment is shown in FIG. 18. According to various embodiments, any or all of the system components of FPSOC 1800 may be based on all-metal GMR electronics. For example, FPGA 1802 may be implemented as described above using transpinnor switch matrices and transpinnor logic gates. Some or all of the mixed signal components of field programmable analog array 1804 (e.g., differential amplifiers, sample-and-hold circuits, etc.) may be implemented using transpinnor-based circuits. In addition, memory array 1806 may be implemented as a SpinRAM array. Arithmetic logic unit 1808, multiply/accumulate unit 1810, and general purpose I/O 1812 may all be implemented using transpinnor logic gates.

A common method of reconfiguring a FPSOC in conventional semiconductor technology employs logic gates for routing configuration signals. According to one embodiment of the invention, such a method can also be implemented using the transpinnor logic gates described herein. According to other embodiments, advantage is taken of the unique aspects of transpinnor technology to provide a simpler approach using transpinnor switches to reconfigure such FPSOCs.

Generally speaking, PLDs, FPGAs, and FPSOCs designed according to the invention may implement any of the wide variety of functions and be employed in any of the wide variety of applications and environments as any of their conventional counterparts. In addition, for embodiments in which all of the circuit components, functional blocks, and subsystems are based on the all-metal GMR technology described herein, several advantages over conventional semiconductor or hybrid implementations will be enjoyed. That is, such all-metal circuits and systems are intrinsically radiation-hard. From a manufacturing standpoint, fewer processing steps, lower processing temperatures, and fewer masks, make such all-metal implementations logistically and economically superior. Single transpinnor implementations of conventionally more complicated circuits, e.g., logic gates, differential amplifiers, sample-and-hold circuits, comparators, etc., and the closed-flux nature of some memory elements facilitate increased density as well improved more reliable performance.

Embodiments have been described above with reference to specific types of programmable devices. However, it will be understood that any type of programmable device may employ the transpinnor switch of the present invention. Even more generally, the transpinnor switch of the present invention may be used in any electronic or magnetoelectronic system to perform any type of switching for which the device is suited.

It should also be noted, for example, that the basic transpinnor topology of the present invention is not limited to any particular magnetic materials, bridge configuration, number of thin-film periods, etc. That is, any materials, configurations, periodicity, etc., of thin-film structures which are appropriate to enable the functions described herein are contemplated to be within the scope of the invention. It is also important to note that the transpinnor switch configurations described herein are merely exemplary and that many functionally equivalent configurations are within the scope of the invention. That is, for example, the input and switch conductors of a transpinnor switch may be coupled to different combinations of transpinnor bridge elements to achieve the effect described, i.e., an output signal representative of the input signal when the GMR films are in a first magnetization state, and substantially no output when the GMR films are in a second magnetization state.

As mentioned above, transpinnors are constructed with GMR elements that can be configured to exhibit memory characteristics. The inputs to such a transpinnor may then be used to set the transpinnor into one of two states, e.g., "0" or "1." Once the state has been set, the output of the transpinnor will follow this state whenever power is applied to the transpinnor bridge elements. The state of the transpinnor is only changed when the inputs to the transpinnor receive a current sufficient to flip the GMR elements to the opposite state.

The state retention capability of the transpinnor may be advantageously employed in a variety of applications. For example, as described above, such a transpinnor can be used directly as a storage device in a digital system. In addition, such a transpinnor can be used in synchronizing input signals. That is, multiple inputs to a bank of transpinnors may arrive at slightly different times. The signals are captured by the inputs to the transpinnors, and a power pulse applied to the bridges of all the transpinnors simultaneously synchronizes all the outputs.

In another exemplary application, such a transpinnor can be used to facilitate the use of narrow pulse logic circuits which is important in keeping power consumption down. That is, in many applications, it would be desirable to keep the power of the chip down by pulsing transpinnor bridges only when their outputs are needed. By using transpinnors which can store state, only short pulses sufficiently long to switch the input of succeeding logic stages are needed. In these succeeding stages, the inputs cause the state of the transpinnors to be set to the proper value. Once set, there is no longer a need for the driving input currents to continue to be applied.

In the interface circuits described below, a transpinnor capable of storing state can be used to stretch a derived logic signal so that only the one transpinnor output needs to be continuously powered. That is, for example, when interfacing transpinnor-based circuitry to external CMOS circuits it is necessary to generate a steady output signal. A transpinnor that is continuously powered can provide such a signal. However, the transpinnor logic preceding this output transpinnor need only be powered when the output transpinnor needs to be set to a new value. Therefore the internal logic circuitry preceding the output transpinnor can be operated in low power pulsed mode to conserve chip power.

The foregoing describes the basic theory of operation underlying the transpinnor and a few representative examples of the wide variety of applications for which the transpinnor is suited. As should be appreciated at this point, the transpinnor may be employed as the basic building block for virtually any type of electronic circuit or system currently implemented using conventional semiconductor technologies. However, as discussed above, given the ubiquitous nature of such conventional technologies, it is desirable to provide interface circuitry which is capable of translating signal between the transpinnor and semiconductor domains. Therefore, according to various specific embodiments of the invention described below, such interface circuitry is provided.

Figure 19:
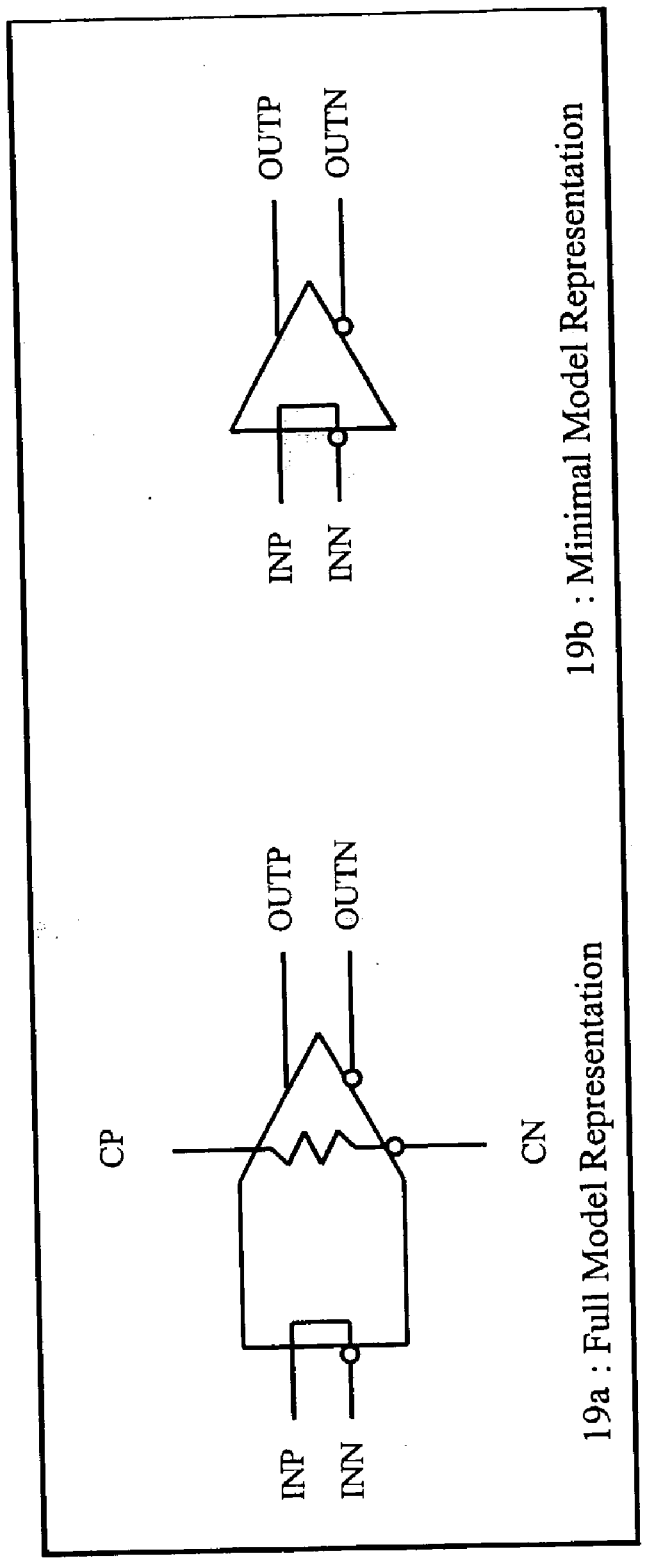

For the purpose of describing such embodiments, the transpinnor symbols shown in FIG. 19 will be employed. The full model symbol (FIG. 19a) is similar to that for a conventional operational amplifier or for a modified analog-to-digital converter. The changes emphasize that this is a transpinnor, with its associated properties. According to specific embodiments, the left side input terminals are the stripline inputs which are shown as shorted to emphasize that the stripline resistance is small compared to the resistances in the other part of the circuitry. One input has a bubble to indicate outflowing current. The names of the terminals are INP representing the positive input and INN representing the negative input. The output terminals OUTP (positive) and OUTN (negative) represent the output across the bridge terminals of the Wheatstone bridge with which the transpinnor is implemented. These are typically connected to the input terminals of succeeding stages of transpinnor logic. The center two terminals, CP (Clock Positive) and CN (Clock Negative), carry the current that powers the transpinnor. In some forms of logic, transpinnors can be electrically stacked to conserve power. The "C", standing for clock, is used because in some transpinnor logic systems, power may not necessarily be applied to transpinnors continuously. Rather, in such implementations, power clock pulses may be applied to activate transpinnor outputs only; the memory capability of succeeding stages being used to capture the pulsed output.

The minimal-model transpinnor representation (FIG. 19b) suppresses the power connections and considers them as global connections. This is a common convention in circuit diagrams and simulations. Also, the body of the symbol is shortened horizontally to conserve drawing space. Note also that the symbol indicates electrical isolation of the input and the output. This is a very positive attribute of transpinnors and is therefore emphasized symbolically.

Unlike semiconductor transistors, transpinnor logic levels are independent of feature size, which has important consequences for maintaining margin integrity as feature size decreases. Logic levels in semiconductor circuits are based on voltages. The ratio of resistances when voltage is applied in opposite directions in a basic element such as a diode is on the order of $10^4$. This difference in resistances translates directly into voltage differences, and hence into discrimination between logic levels. The same basically holds for other semiconductor devices. As is well understood, this presents problems with decreasing feature size.

By contrast, transpinnors are current-driven devices, and transpinnor logic levels are current-based. Signal discrimination in transpinnor circuits is implemented very differently than in semiconductor circuits, and the change in resistance due to the GMR effect does not translate directly into logic-level discrimination. The current output of a transpinnor is proportional to its resistive imbalance. Thus, discrimination between logic levels is given by the ratio $[gmr/(dR/R)]$ of magnetic imbalance produced by the GMR effect to that when the transpinnor is magnetically balanced but residually unbalanced due to fabrication imperfections. Here gmr is the fractional value of the GMR effect and dR is the difference in GMR-element resistances, of average value R, due to lack of fabrication precision. Level discrimination then comes down to the precision with which transpinnors can be balanced.

As previously mentioned, techniques for precisely balancing transpinnors referred to herein as "magnetoresistive trimming" (MT) and which involve the partial switching of the magnetization of selected layers of GMR films are described in U.S. Pat. No. 6,469,927, incorporated herein by reference above. MT has been applied manually to obtain resistance matching $(R/dR) \sim 10^4$. When implemented under computer control, a value of $(R/dR) \sim 10^5$ or better is likely realizable. Thus, for example, for gmr=0.1, the discrimination level would be $10^4$.

As mentioned above, an important issue facing semiconductor technology is the drop in voltages accompanying shrinking feature sizes, with an attendant decrease in logic-level margins defined by these voltages. Because transpinnor logic levels are determined by a ratio that depends on two effects—GMR and magnetoresistive trimming—both of which are independent of feature size, logic margins are expected to remain robust as feature sizes shrink.

There is a great deal of flexibility in the design and application of transpinnors, owing to the variety of magnetic properties that can be incorporated into the GMR films, the variety of GMR networks that can be realized, and the specific arrangement of the stripline(s) that can be designed.

Transpinnors may also be fabricated using standard semiconductor techniques. An exemplary process by which single input transpinnors may be fabricated using only four masking layers, i.e., GMR, $1^{st}$ Cu/keeper, via, and pad metal, will now be described. According to such implementations, the GMR is patterned using a $Si_3N_4$ hard mask. The GMR is then etched using an ion mill. An insulation layer of $Si_3N_4$ 40 mn thick is deposited to isolate the GMR from the next metal layer. A $1^{st}$ Cu/keeper layer is then deposited, 20 nm Cu/20 nm NiFe, patterned using a hard mask, and etched with an ion mill. This layer makes the stripline of the transpinnor. The stripline is insulated with 150 nm of PECVD $SiO_2$, which is deposited at 150° C. Vias are patterned and etched in this layer. The vias in this layer open contacts to both the GMR film and the Cu/keeper layers. The next layer is pad metal, 500 nm of patterned and etched AlSi. The pad metal connects the active device to bonding pads, and connects to both of the previous metal layers. The AlSi is etched using a wet etch in a pre-mixed etch solution. All materials in this process are sputter deposited unless otherwise noted.

There are numerous design variations on the basic single-input transpinnor. The dual-input transpinnor is similar to the single-input transpinnor, but with a second input stripline on top of the first. This requires five mask layers to fabricate: a second Cu layer in addition to the four layers detailed above for the single-input transpinnor. This Cu layer may be 25 nm Cu/25 nm NiFe. It may also be patterned using a hard mask and etched in an ion mill. As with the four-mask-layer process, one via mask may be used to open the contacts to the GMR and both Cu layers. As described above, a transpinnor with multiple inputs can be used in a wide variety of ways including, for example, for logic operations on multiple inputs, as a differential amplifier, and as a switch.

Figure 20:
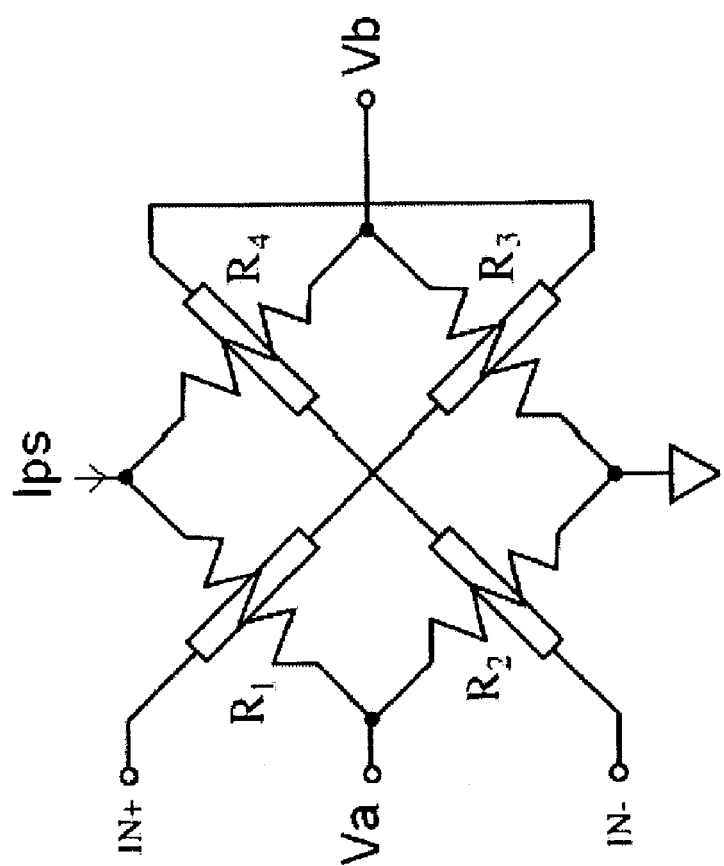

FIG. 20 shows the schematic of an exemplary single-input transpinnor powered by a constant-current power supply. Referring to this schematic, we give an expression for the output of a transpinnor. In a balanced transpinnor the four legs of the Wheatstone bridge (R1, R2, R3, R4) are equivalent and equal to Ro when the hard and soft layer magnetizations are aligned. Ips is a constant current entering the network at the node between R1 and R4 and exiting at the node between R2 and R3. The output (Vb−Va) is taken at the remaining 2 nodes of the network. In the absence of an input current the hard and soft layers stay aligned, the bridge is balanced and the output is zero.

Because of the complexity of transpinnor operation, the following simplified model may be employed. With a sufficient current in one direction, R1 and R3 will be switched to their peak resistance Ro(1+gmr), and R2 and R4 will stay at Ro. For the opposite current, R1 and R3 stay at Ro, and R2 and R4 are switched to Ro(1+gmr). (The appropriate orientations of the hard layers are part of the initial design characteristics.) The peak open circuit output voltage is then given by $$V_{oc} = \frac{I_{ps}R_o gmr}{2} \tag{8}$$

The equivalent series resistance of the transpinnor is $$R_s = R_o \frac{gmr+2}{2} \tag{9}$$

so that, when connected to a load $R_1$, we get for the output current and voltage $$I_{out} = I_{ps}\frac{gmr}{2+gmr+2\frac{R_1}{R_o}} \tag{10}$$

$$V_{out} = I_{ps}R_1\frac{gmr}{2+gmr+2\frac{R_1}{R_o}} \tag{11}$$

Thus we see that the peak output current or voltage of a transpinnor is proportional to the power current, Ips, of the transpinnor. However, the output may be limited by magnetic-field effects of the power current. In addition, too large a current in the GMR will result in electromigration. The electromigration limit for the GMR films described herein is given by $$I_{EM} \leq 2T_g W_g \tag{12}$$

where $T_g$ is the GMR thickness in nm (typically 27.5 nm) and $W_g$ is the width of the GMR in um. This translates into 5.5 mA/μm of GMR width or since the films are typically 5 ohm/square into 27.5 mV/um of GMR length. The power coupled into a load, $R_1$, is optimized for the load equal to the series resistance $R_s$ of the equivalent circuit. Putting the electromigration limit and optimal load resistance into the calculation of the power output we get $$P_{peak} = 10^{-8}(R_{square}T_g^2)4L_g W_g \frac{gmr^2}{8(2+gmr)} \tag{13}$$

where 4 LgWg is the total area of the transpinnor GMR films in $\mu m^2$; we note that because $R_{square}$ is itself inversely proportional to $T_g$, $R_{square}T_g^2$ is proportional to $T_g$. So the power capability of a transpinnor goes as the volume of the GMR films and increases as $gmr^2$ for gmr<1.

The balanced transpinnor discussed above gives bipolar output. It can be redesigned to give unipolar bipolar output by choosing an unbalanced transpinnor: R1=R3=Ro and R2=R4=Ro/(1+gmr) in their low-resistance states; we then get an output that is zero for one polarity of current, and for the opposite current direction we get $$V_{oc} = I_{ps}R_o\frac{(1+gmr)^2-1}{2(1+gmr)} \tag{14}$$

$$R_s = R_o\frac{(1+gmr)^2+1}{2(1+gmr)} \tag{15}$$

$$I_{out} = I_{ps}\frac{(1+gmr)^2-1}{2r(1+gmr)+(1+gmr)^2+1} \tag{16}$$

$$V_{out} = I_{out}R_1 \tag{17}$$

-continued $$P_{peak} = \frac{I_{ps}^2 R_o}{4} \frac{[(1+gmr)^2 - 1]^2}{2(1+gmr)[(1+gmr)^2 + 1]} \quad (18)$$

This results in twice as much output for the unipolar transpinnor design as for the bipolar one.

Some of the key issues to consider in interconnecting transpinnor and semiconductor circuits are represented in the characterization matrix of FIG. 21. Despite the applicability of the present invention to any of the existing semiconductor families, the examples described in the present application focus primarily on interface issues relating to CMOS given that it is currently the technology of choice, and given the fact that universal interface chips currently exist which can be used to interface CMOS to other logic families, e.g., TTL and ECL. It will be understood, however, that the present invention is not so limited.

The table of FIG. 21 summarizes characteristics for various semiconductor logic families as they relate to various issues associated with interconnecting transpinnor and semiconductor circuits. As mentioned above, the emphasis has been placed on interfacing transpinnor logic with CMOS logic, with only salient features of TTL and ECL logic families mentioned for comparison. Various combinations of transpinnor logic blocks and CMOS logic blocks are included in the table. Exemplary logic levels are shown. Exemplary operating speed and propagation delays are also indicated. Effects of interconnect-line resistances and capacitances are represented. Introduction of ground noise by the various logic combinations that can affect other parts of the circuit, especially low-level analog circuitry, are represented as well.

The first sets of entries are for transpinnor logic driving into transpinnor logic for the two cases of on-chip interfacing and between-chip interfacing. Only the case of transpinnors operating into a short-circuit load is included because the effect of line capacitors is very nearly eliminated (the logic becomes a type of current-steering logic), with much higher resulting speed. Typical logic levels of plus and minus 1 mA are assumed. The actual levels depend linearly on feature size, with 1 mA corresponding to about 1 micron features and permalloy coercivity of about 1 oe. Propagation delays of 0.5 ns have been measured. Assuming rise times on the same order results in operating frequencies in the range of 1 GHz or more.

As transpinnor size shrinks, the propagation delays are also expected to decrease. Ultimate limits may relate to gyromagnetic effects. Operation in shorted-output mode also minimizes voltage swing. Line resistances are expected to be significantly smaller than the transpinnor output resistance, thus minimizing any effect of voltage-swing problems. As line resistance becomes significant, performance may deteriorate because the increased output voltage swing causes larger capacitive effects.

More generally, ground-current spikes may be significantly reduced in transpinnor logic because of the symmetry of the two sides of the transpinnor bridge. That is, as the current on one part of the transpinnor increases, that on other part decreases, and the total current remains almost constant. This results in only minor disturbance to the ground currents and substantial reduction of switching spikes, reducing the ground noise significantly. Thus interference with low-level analog circuits becomes more manageable. Similar arguments apply for both on-chip and between-chip effects.

Between chips, significant slowdown can occur because of the substantially larger load capacitance associated with the I/O pins and longer signal lines. Short-circuit operation alleviates much of this effect because the signal voltage is small.

The second set of entries in the table of FIG. 21 are for CMOS driving CMOS. For the case of logic on the chip, interconnect resistances and capacitances are very low, especially for gates located near each other on the chip. This produces extremely fast response times, as indicated in the table. Smaller feature size produces even faster results. Logic levels are assumed to be the same as commercial parts. The primary difference between on-chip and between-chip performance is capacitances associated with long lines and I/O pin capacitances. CMOS switching is known to be very spiky and introduces noise onto the grounds. This in turn requires good grounding practice and ground structures in order to minimize the effects of noise on the grounds and still have low-level analog signals of good quality. A five-volt supply is assumed for exemplary reasons. Presently used CMOS power supplies may be as low as 1.0 volts with correspondingly lower threshold levels.

Next in the table of FIG. 21 are entries for transpinnor logic driving into a CMOS block. This case considers the transpinnor operating in short-circuit mode, which requires that the CMOS inputs present a shorted load to the transpinnor logic. This may be accomplished in a variety of ways according to various embodiments of the invention. For example, a CMOS op-amp summing-junction load (near-zero equivalent load resistance) may be employed. Alternatively, a CMOS cascade structure inputs (low impedance and high speed) may be employed. Another alternative employs a base-emitter junction of one of the bipolar transistor options often available in CMOS processes (a forward-biased junction presents a low impedance). For a suitably conditioned CMOS input, the nominal transpinnor logic levels of ±1 ma can be used.

The table of FIG. 21 indicates the 0.5 ns propagation delay and >1 GHz operation of the transpinnor side, although it may be difficult to obtain this performance on the CMOS side, especially if an I/O pin and appreciable path lengths are involved. The use of the low-impedance current-steering model should help in the CMOS design. The table assumes the CMOS input design has been accomplished. The effect of on-chip interconnect resistance and capacitance should present little problem for either the transpinnor or CMOS logic because of the short lines involved. Interconnects between chips can degrade performance somewhat due to line lengths increasing resistance and capacitance. The current-steering model with low-signal voltage swing may be used to alleviate this problem. Although there will be some performance degradation, it might be only a factor of two or less with proper design, so the same operating frequency and propagation delay are used in the table. As before, the CMOS logic will introduce significantly larger switching spikes into the ground system than the transpinnor logic and greater care must be used when intermingling CMOS logic with low-level CMOS analog signals. On the CMOS side, separation of analog and digital grounds is a strong need, while on the transpinnor side, separation of grounds is still a good idea but much less critical.

In the case where the transpinnor outputs are operated near open-circuit conditions, high performance may still be obtained but degraded from the shorted-output case. In such a case, the CMOS inputs need to present a higher impedance load to the transpinnor logic. The logic levels might be ±50 mV (differential outputs) from the transpinnors that the CMOS input must accommodate. Because of the increased effects of interconnect resistances and capacitances, lower operating frequencies and longer propagation delays result. On-chip interconnect resistances and capacitances are smaller than the between-chip case. Thus, for example, the on-chip performance might be 500 MHz and 1 ns and between-chip performance might be 100 MHz and 5 ns. Interconnect resistances and capacitances are significant. The same considerations apply to grounds and switching spikes.

The case of a CMOS logic block driving into a transpinnor logic block is straightforward. The CMOS logic levels are voltages. Transpinnor logic levels are currents. The simple solution is for the CMOS outputs to drive the transpinnor through resistors. This works but causes a tighter power-supply-range specification. An alternate method is to provide a CMOS output cell where the output uses a current-source structure such as an open-drain configuration mirrored to a reference current like a PTAT (see below). Such an approach results in a CMOS output cell with controlled short-circuit currents equal to the desired transpinnor logic levels. This, in turn, allows the widest range of power-supply swing without affecting operation. For this case, standard CMOS logic levels can be used to drive the standard transpinnor logic levels. On-chip interconnects would again be very fast because of short distances. Between-chip interconnects would be slower, again due to longer interconnects and I/O pins. Interference with analog signals would be the same as discussed previously.

Performance characteristics of older logic families, TTL and ECL, as obtained from vendor data sheets, are listed for comparison. These data include the highest-performance data available at typical operating conditions.

In interfacing an output of transpinnor logic to an input of semiconductor logic, the output impedance of a transpinnor should be considered to be high, typically in the range of 100 ohms. It should also be realized that a transpinnor output is intended for driving low impedance. Using available semiconductor technology, low-input impedance can be attained, for example, at the negative input of an operational amplifier with feedback and with its positive input grounded. One of the logic levels can be set by an adjusting process applied to the transpinnor output, and the logic swing can be set by a zener or other diode across the feedback resistor of the operational amplifier.

The conversion from GMR logic levels to CMOS or TTL levels requires a conversion translation from the GMR output. The GMR output may be characterized by a small open-circuit output voltage or a moderate short-circuit output current. The preferred output is the short-circuit load where the logic levels are currents. Short-circuit output has the advantage that output-load capacitance effects, which normally cause slower responses, are significantly reduced. Open-circuit output operation is also possible, but with load-capacitance effects present.

Figure 22:
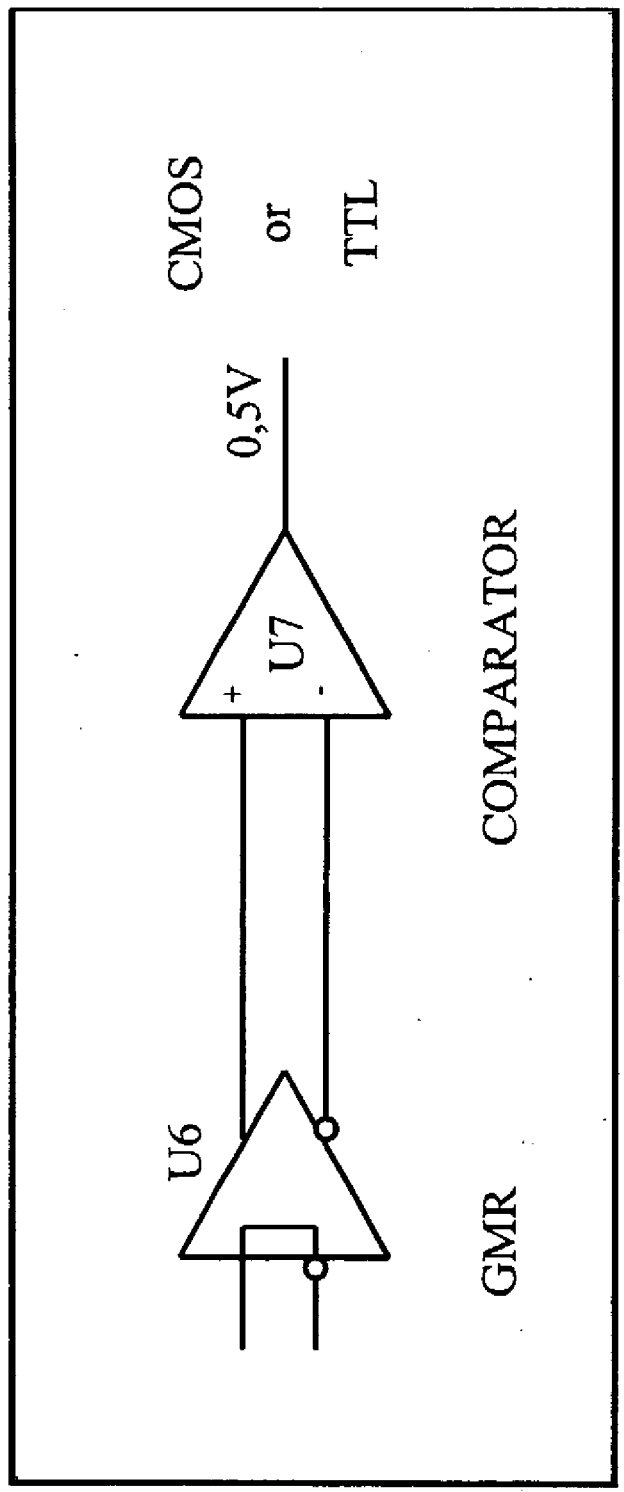

FIG. 22 shows the case where the GMR element U6 is operated with essentially open-circuit output. The GMR element U6 drives a high-impedance comparator U7 that converts the GMR output voltages to CMOS or TTL logic levels. An example comparator that may be employed for such an interface is the LM310. The advantage of this circuit is its simplicity. It can be used in applications where speed is not an issue and the GMR configuration has sufficient overdrive capability. One disadvantage is the capacitive loading effects (in cases where that is important). In GMR-element designs where the open-circuit output voltages are especially small, they might approach the differential offset voltage of the comparator. This may also cause significant speed reduction because of insufficient overdrive. In situations where these issues do not arise, the circuit should work satisfactorily with off-the-shelf parts.

Figure 23:
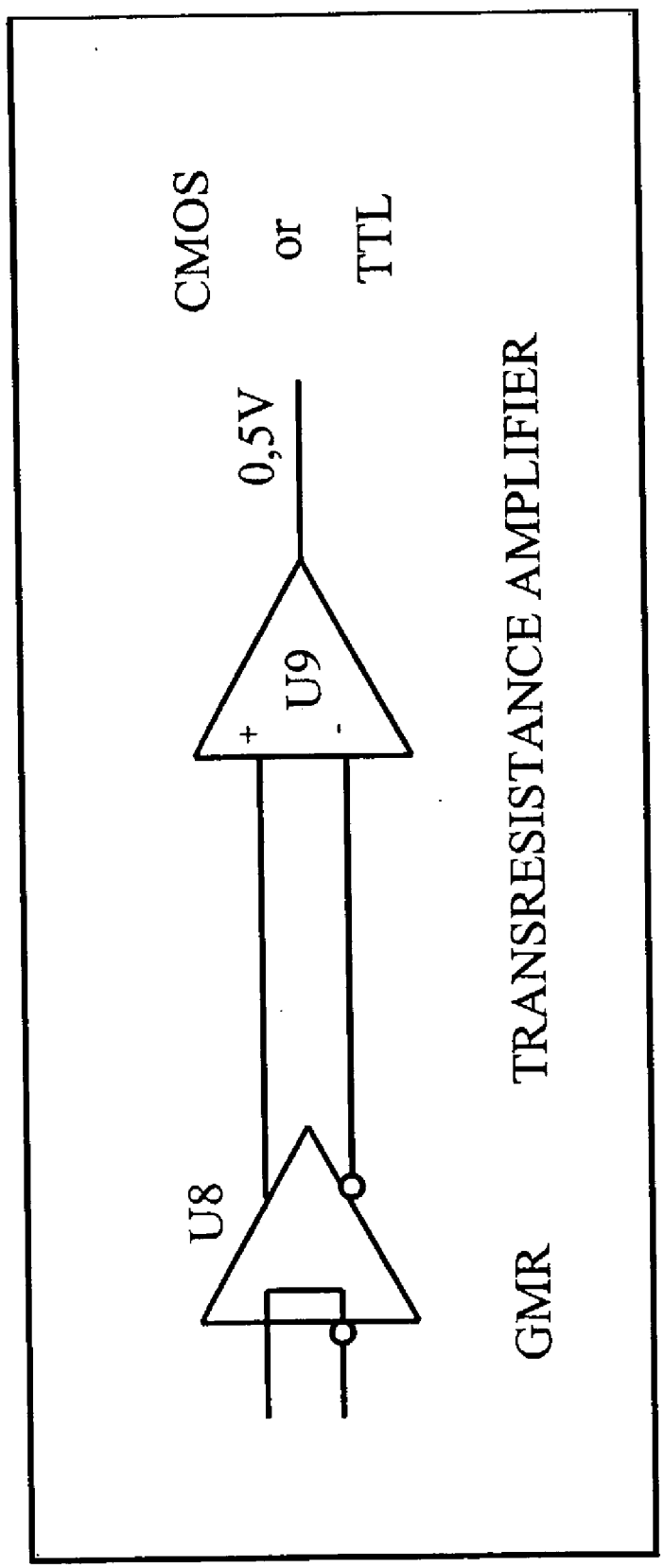

FIG. 23 shows the case where the output of GMR element U8 is operated in essentially short-circuit mode, and drives a transresistance amplifier U9. The characteristics of the transresistance amplifier U9 are short-circuit input and a gain characteristic described as output voltage per unit input current. Thus, transresistance amplifiers often have their gain expressed in ohms. An exemplary transresistance amplifier suitable for such an implementation is the LM359. In this case, transconductance amplifier U9 converts the GMR logic currents to CMOS or TTL voltages. An exemplary CMOS transresistance design is illustrated below in FIG. 26.

Figure 24:
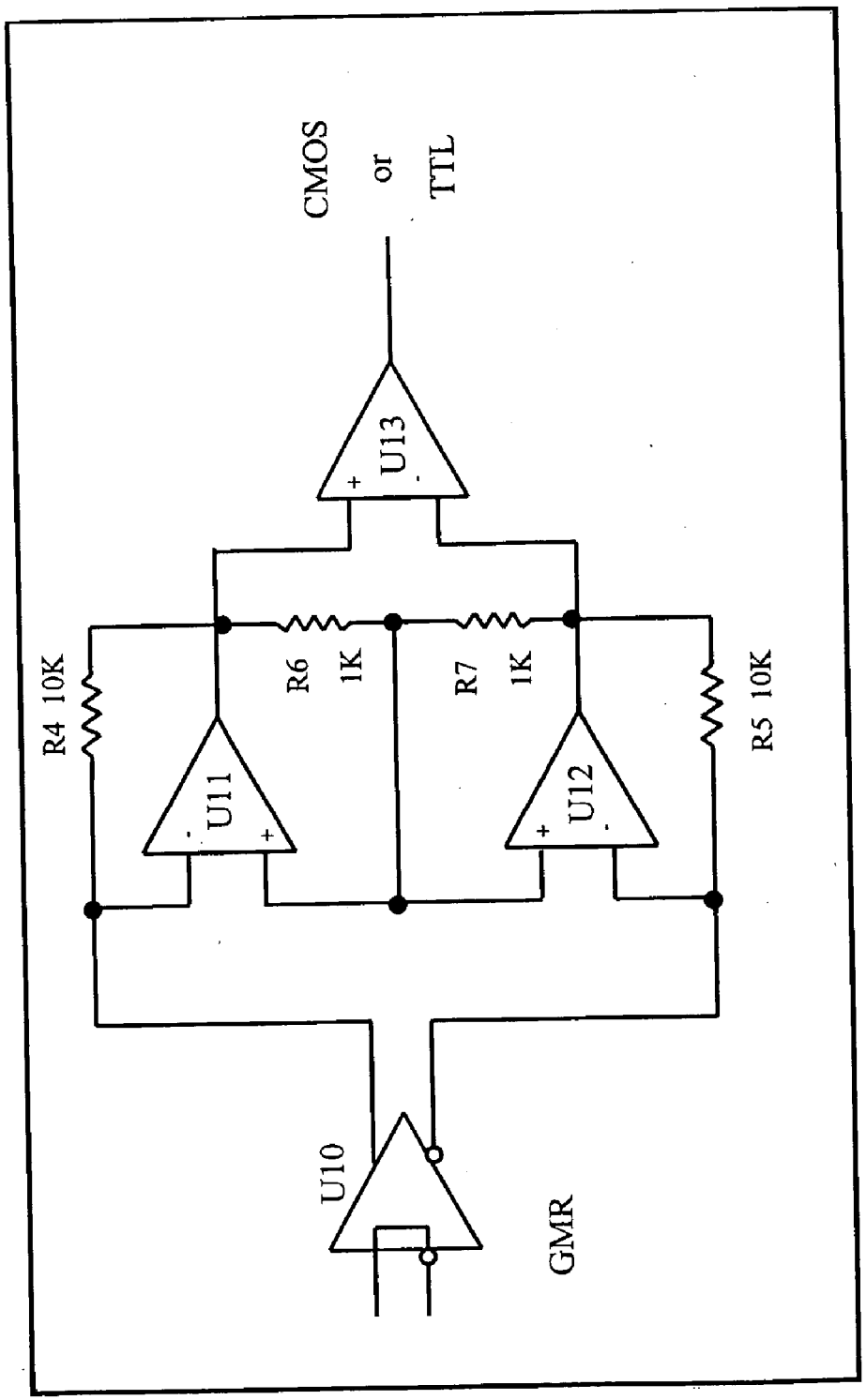

FIG. 24 is similar to FIG. 23 and shows a transresistance amplifier comprising op amps (U11, U12 and U13) connected to a GMR gate U10. In this case U11 and U12 are each connected in charge amp configurations with R4 and R5, so that they have very low input impedances. The charge amps reference terminals are centered with R6 and R7. The outputs of U11 and U12 can then be converted to CMOS or TTL outputs with a comparator U13. The circuit structure is similar to an "instrumentation amplifier." This circuit provides the GMR gate with a self-centering short-circuit load while using a high-speed comparator to obtain the CMOS or TTL logic voltages. It will be understood that other circuit structures are possible to achieve the same effect.

Figure 25:
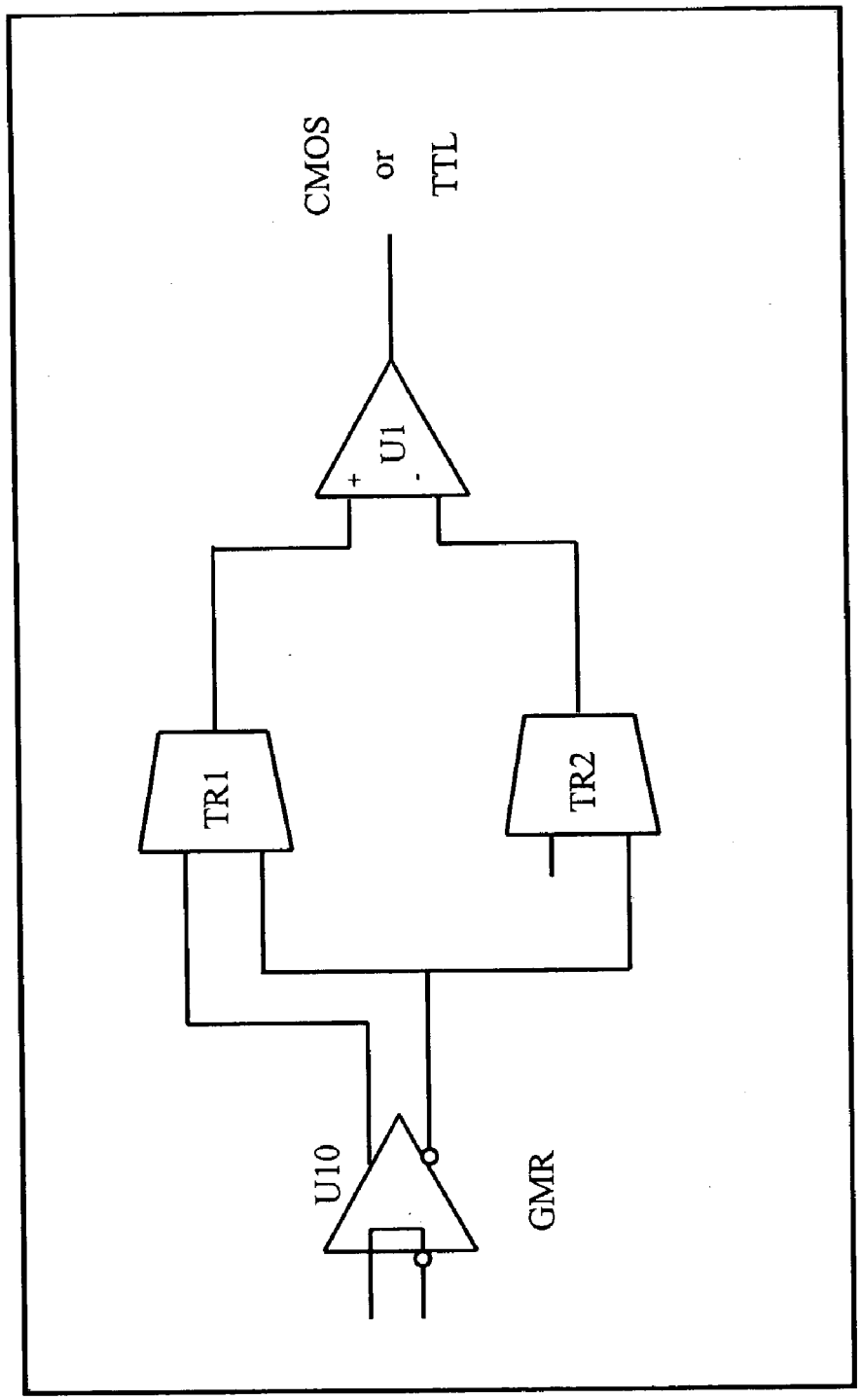

FIG. 25 shows a block diagram of an exemplary CMOS implementation of a transresistance interface to the transpinnor outputs. This example is based on the transresistor model described in *A Simple 2-Transistor Transresistor* by Schlarmann and Geiger, IEEE Electronics Letters, pp. 1386–87, December 2001, the entire disclosure of which is incorporated herein by reference for all purposes. The transresistor TR1 provides the short-circuit load required by the transpinnor. It uses one of the transpinnor pins as a reference point and has a built-in offset. TR2 is connected to the reference side of the transresistor, but its other input is open (zero current) so that it provides the zero output for use by the comparator U1.

Figure 26:
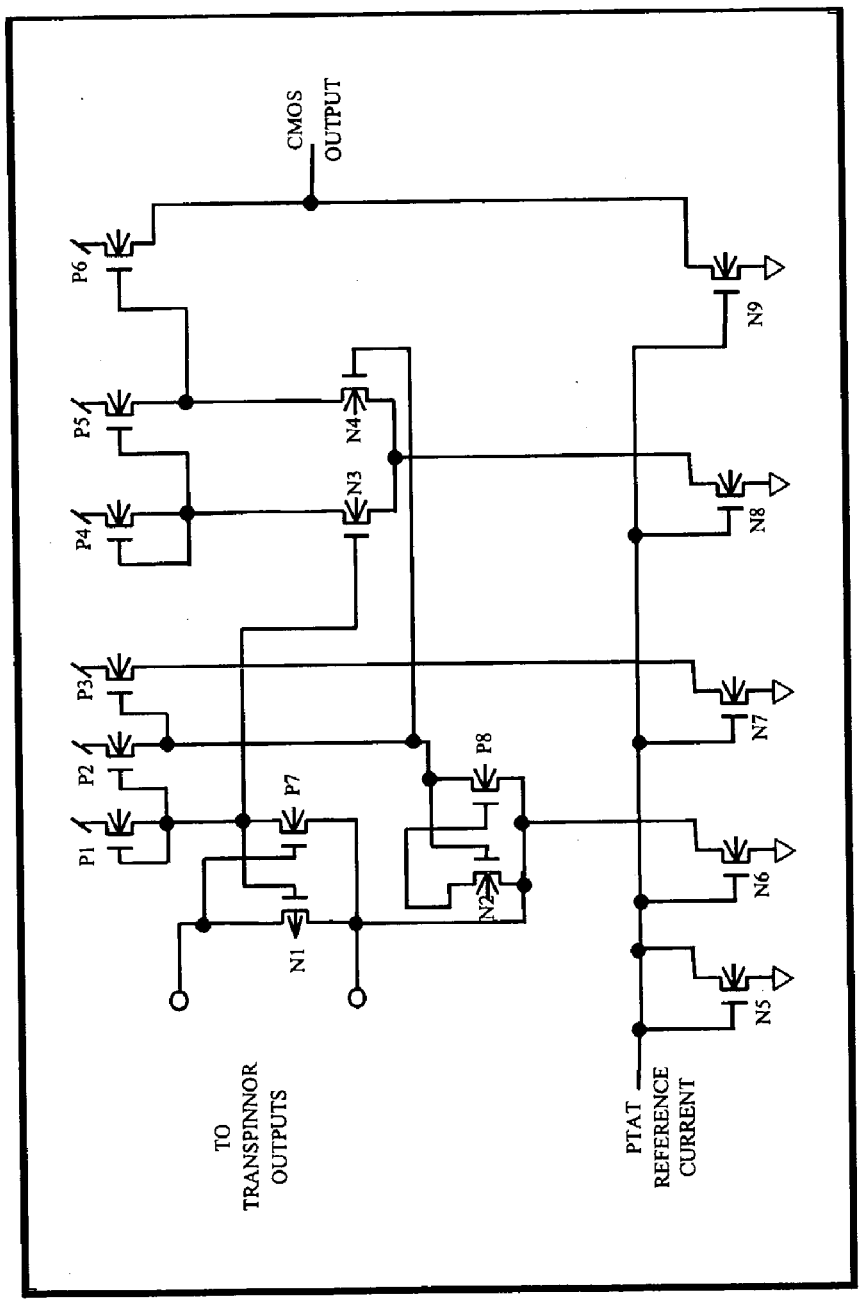

FIG. 26 shows an exemplary CMOS implementation of the circuit of FIG. 25. Transistors P1, P7, and N1 implement TR1. Transistors P2, P8, and N2 implement TR2. The comparator U1 is implemented with P4, P5, P6, N3, N4, N8, and N9.

Figure 27:
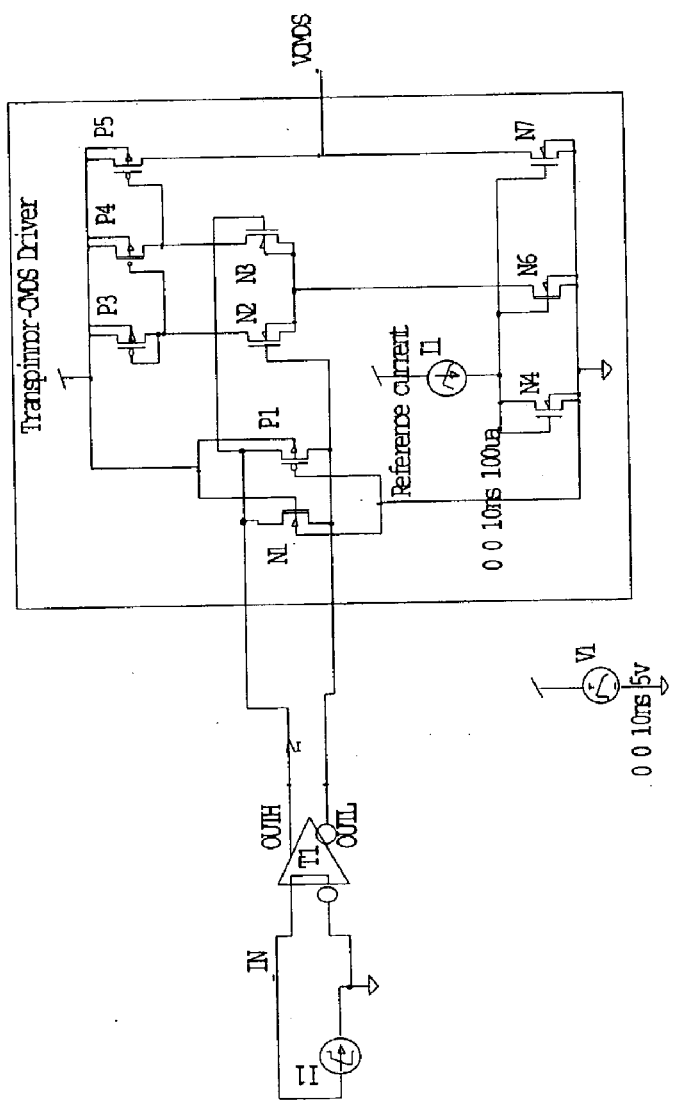

FIG. 27 illustrates yet another possible configuration similar to that in FIG. 26. In this case, the shorted load is implemented as a transmission gate, N1 and P1. The small voltage across the transmission gate is converted to CMOS levels by the standard CMOS comparator (N2 thru N7 and P3 thru P5).

Figure 28:
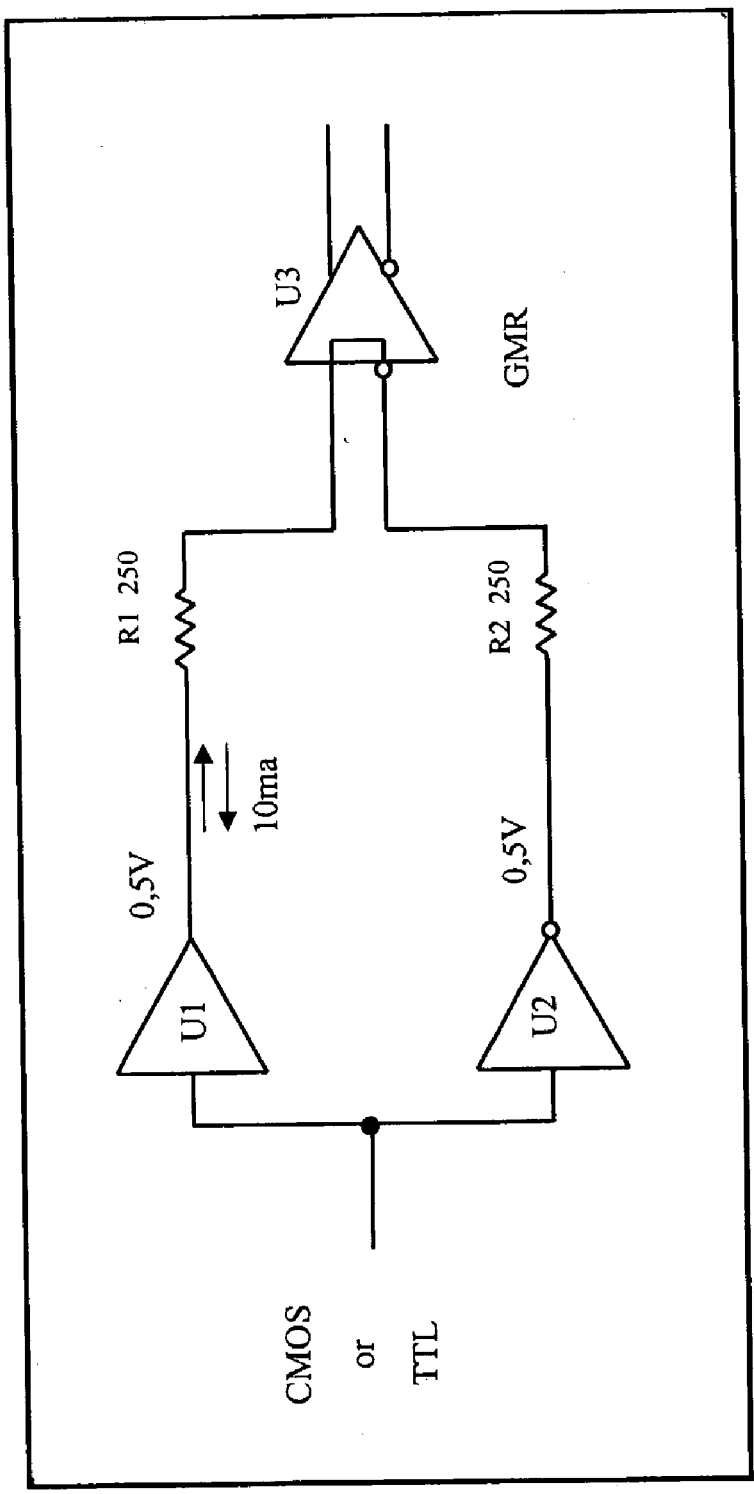

The conversion of CMOS or TTL logic signals to signals suitable for GMR logic is a simple operation in which the CMOS or TTL output voltages are converted to currents. FIG. 28 shows an exemplary arrangement that might be used when the GMR logic levels are +10 mA and −10 mA. In this case, the CMOS or TTL signal is used to drive a differential output using a buffer and inverter structure, U1 and U2. The CMOS or TTL voltages are converted to currents by resistors R1 and R2 and used as the input to the GMR gate U3. The input of U3 is a very low resistance and can be assumed to be zero ohms for calculations.

Figure 29:
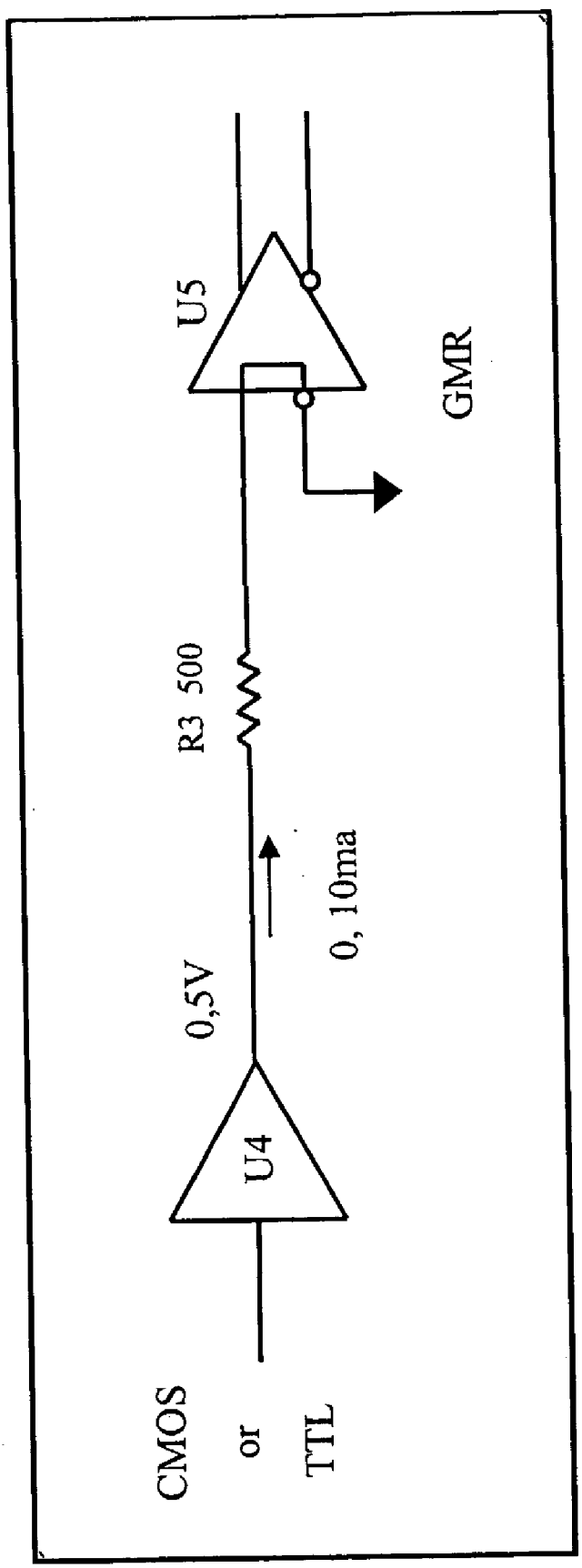

FIG. 29 shows another example, where the GMR logic levels are 0 and +10 ma. In this case a single CMOS or TTL gate U4 is used as a buffer. The resistor R3 is used to convert the CMOS or TTL output voltage to current as needed by the GMR gate U5. In this case, the GMR gate U5 can be returned to ground instead of being driven differentially.

A CMOS design can also make use of the excellent current-source capability of CMOS to fashion an output driver that provides the logic-level currents directly in a regulated fashion. The normal practice is to refer current sources to a bandgap-style regulator, which has a reference current output commonly called a PTAT.

"PTAT" is an abbreviation for Proportional To Absolute Temperature. PTAT is a commonly used term in CMOS design. In CMOS analog circuit design, the current practice is to design a power supply regulator commonly referred to as a bandgap regulator. A typical bandgap regulator includes a pair of diodes used to produce a reference current that is PTAT and used to compensate temperature variations to produce the bandgap voltage for the regulator. It is common practice to also use this PTAT current (since it is there already) as a reference to bias the rest of the chip through the extensive use of CMOS mirror circuits. Virtually everywhere a bias current is needed, a PTAT mirror is used—examples include amplifiers, comparators, digital-to-analog reference currents, external device biases, etc.

Figure 30:
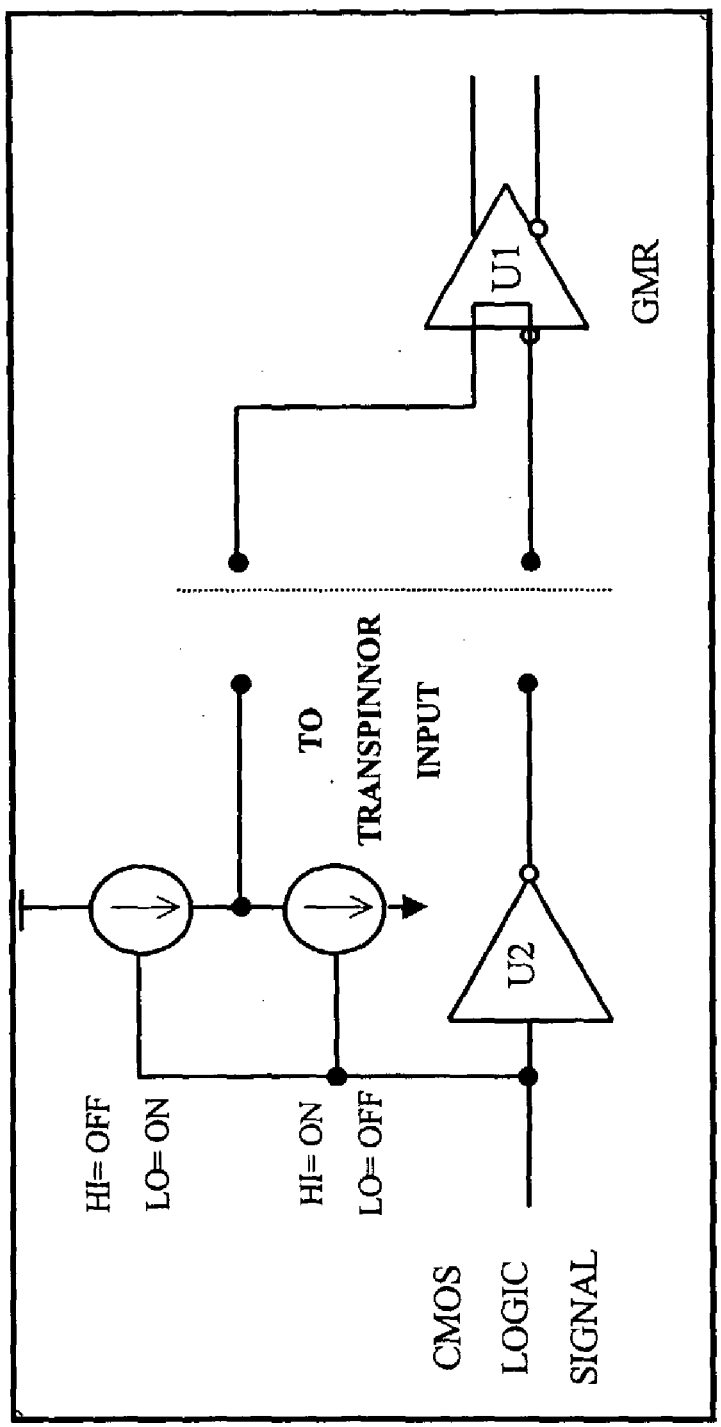
Figure 31:
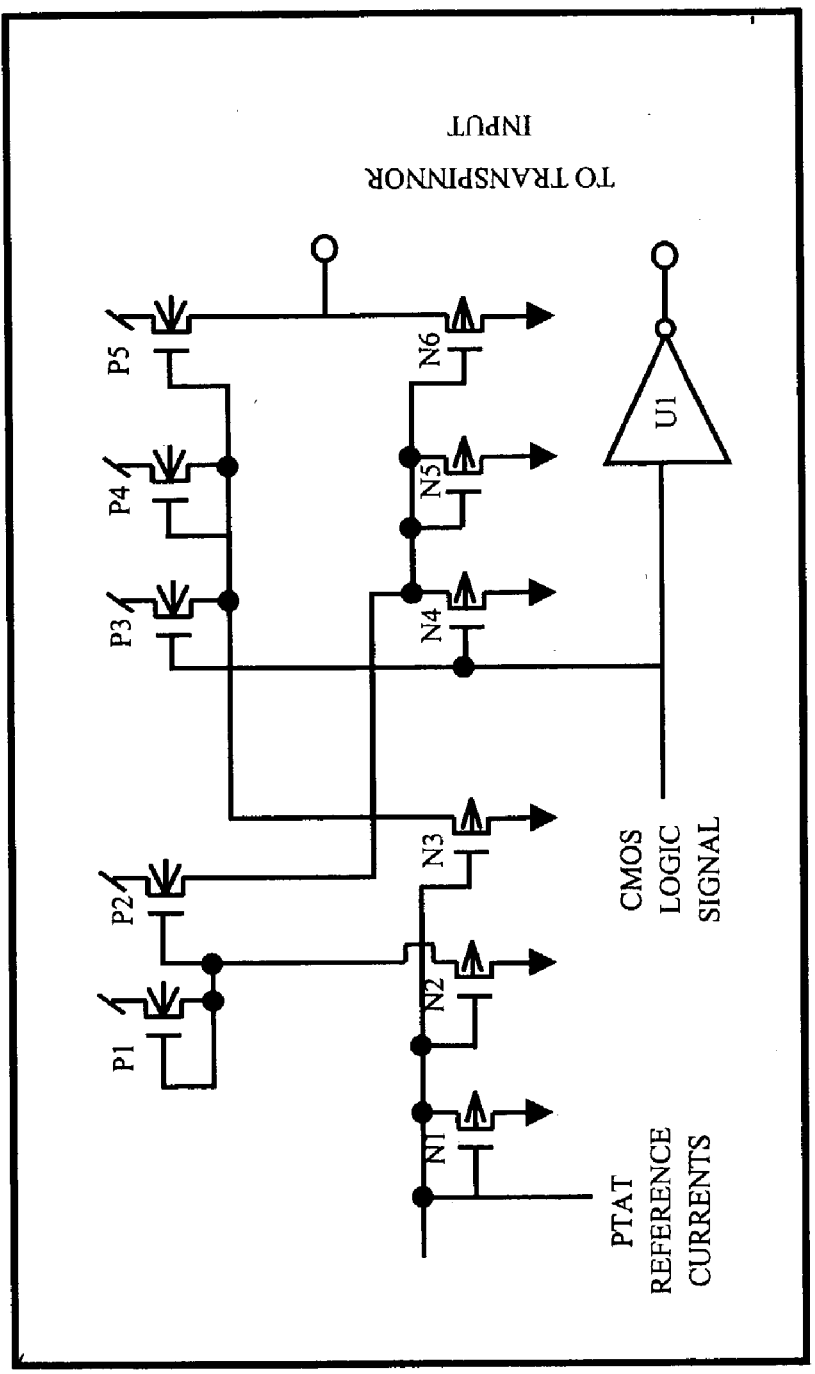

FIG. 30 shows a block diagram of a CMOS drive circuit for the transpinnor input of GMR element U1. FIG. 31 shows a more specific implementation of a design for such a circuit that assumes the presence of a PTAT to form the output currents. Once into the current regulating region, the currents hold very constant regardless of power supply voltage. FIG. 30 shows the transpinnor reference side (connected to inverter U2) being high if the lower current source is ON and low if the upper current source is ON.

In FIG. 31, transistor N1 is the main PTAT mirror from which the other current sources are derived. N2, P1 and P2 provide a current reference to N4, N5, and N6. N4 is a switch that turns N5, N6 ON and OFF. N5 is the mirror for N6. N6 is the output current source. N3 provides a reference current to P3, P4, and P5. P3 is a switch that turns P4, P5 ON and OFF. P4 is the mirror for P5. P5 is the upper output current source. Since the switches are interconnected as shown, the CMOS logic signal will turn one ON while the other is OFF, so that only one output current source is ON at a time. Since both current outputs are referred to the PTAT, the output-logic current levels will hold proper values as long as the power supply is greater than the sum of p- and n-thresholds, typically about 1.5 volts or greater.

Figure 32:
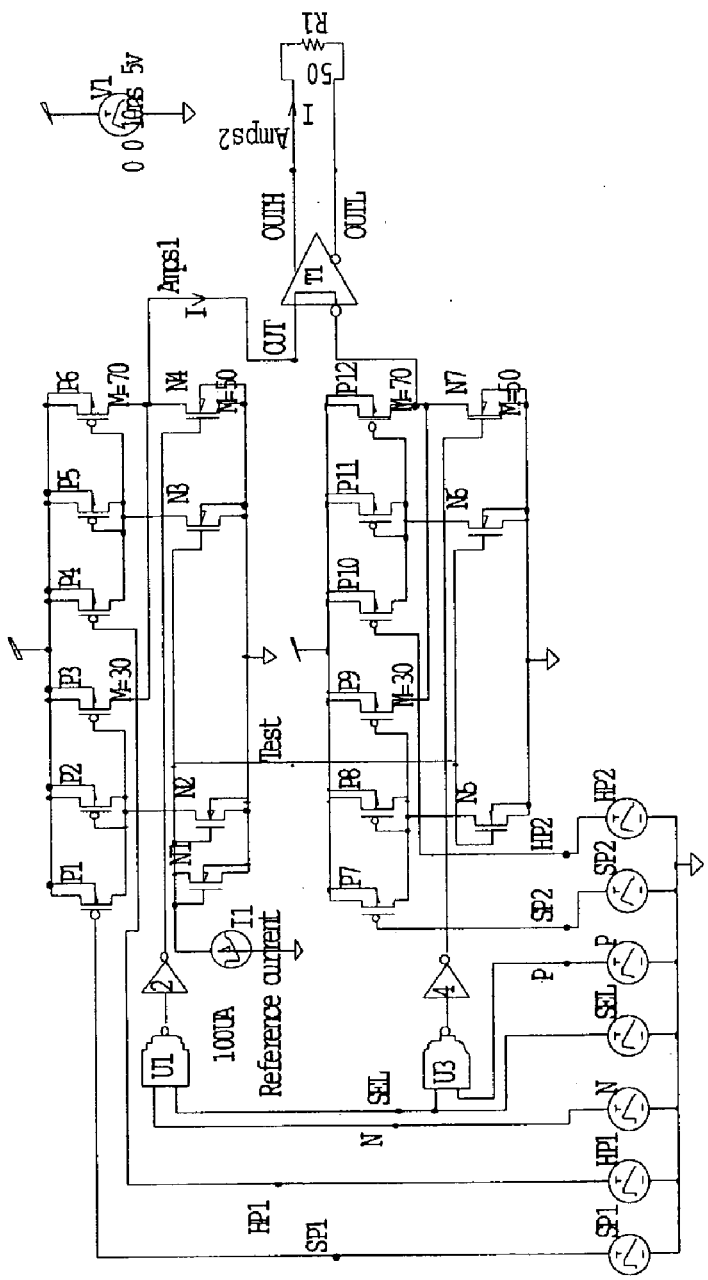

FIG. 32 shows a more detailed representation of the CMOS to transpinnor driver shown in FIG. 31, how it receives simulation control, how it interacts with the transpinnor that receives the input, and how it is driven by simulated voltage sources. This driver provides two levels of current, one for read-level currents, and another for write-level currents. Two complete sets of mirrors are included, one for each drive current.

Figure 33:
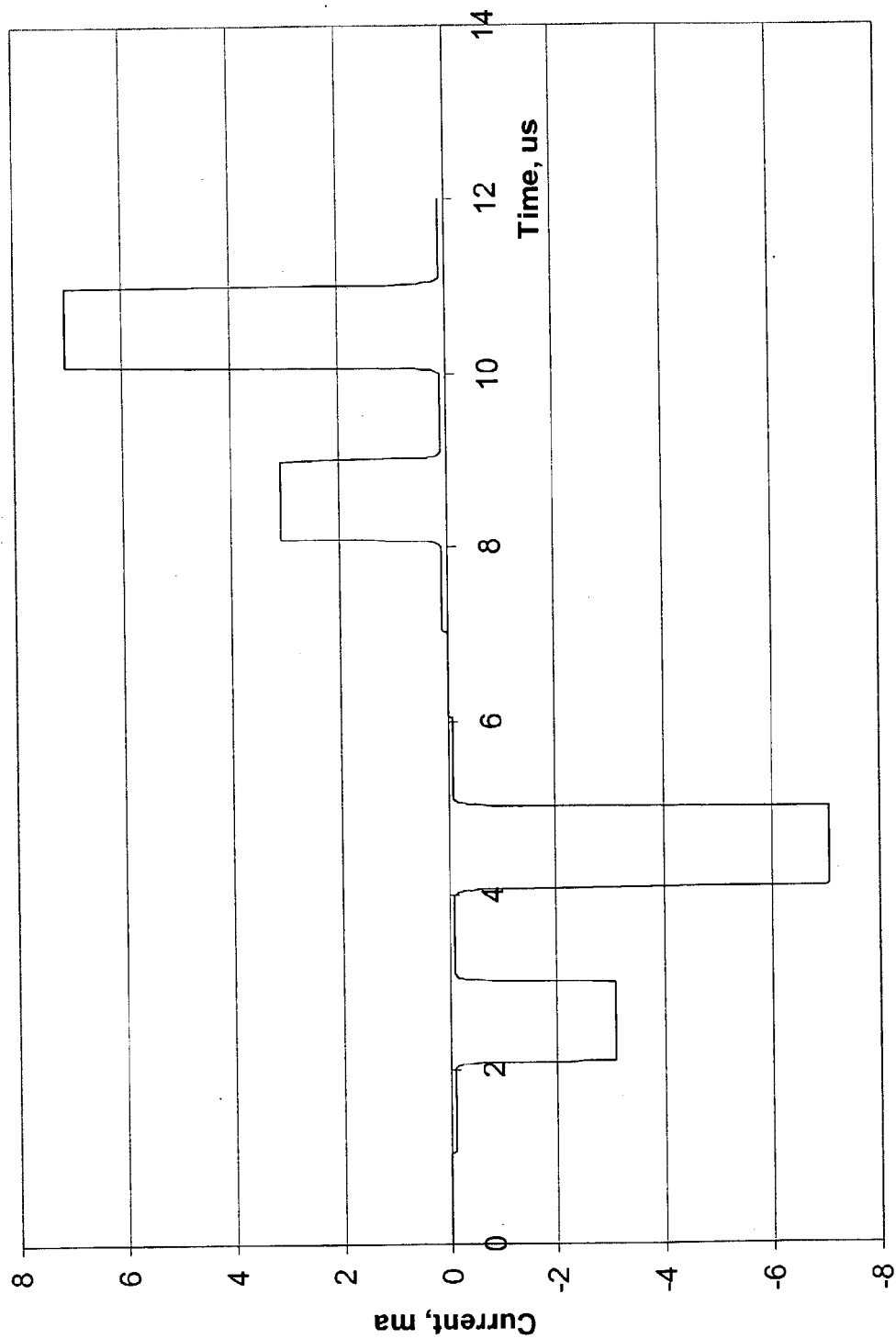

A simulation of the output of the circuit of FIG. 32 is shown in FIG. 33 which illustrates the two-level currents provided to the transpinnors. The lower-level current is needed to switch only the soft layer, without switching the hard layer, and the higher-level current is needed to switch the hard layer. Note that in many GMR circuits the hard layer never needs to be switched.

Referring to FIG. 32, the current intensity and direction are controlled by the CMOS logic signals SP1 (soft layer switching, positive), HP1 (hard layer switching, positive), SP2 (soft layer switching, negative) and HP2 (hard layer switching, negative), N (negative going current), P (positive going current) and SEL (drive select). When the SEL signal is 0, no current flows into the transpinnor. To produce a negative read current (low amplitude) SEL is on along with N and SP2 producing the first negative pulse in the trace of FIG. 33. For a write negative current (which requires switching the hard layer), SEL is on along with N and HP2 to produce the second stronger negative trace. The first positive trace is with SEL, P and SP1 on, and the second, stronger positive current trace (for hard layer switching) is with SEL, P and HP1 on.

A variety of practical issues arise in connecting transpinnor circuits with CMOS circuits. Some of these issues are related to breadboarding, prototyping and production. One such issue is whether the all-metal transpinnor circuits should be integrated on the same chip as the CMOS circuits or if the two should be kept as separate chips.

In a mixed-technology chip the CMOS and all-metal transpinnor circuits are placed on the same chip. Some CMOS processing steps need to be performed at high temperatures (>800° C.), while the all-metal transpinnor circuits are typically processed at much lower temperatures (200°–250° C.). Therefore, the CMOS processing must be done first on the chip. Otherwise, the high CMOS processing temperatures could damage or destroy the transpinnor circuits.

One strategy is to place all CMOS circuits on one part of the chip or leave holes on the chip for the all-metal circuits. According to one such embodiment, a planarizing layer is first deposited for the GMR films to deal with the fact that the semiconductor processing tends to leave the surfaces of the CMOS circuits too rough to deposit defect-free and uniform GMR characteristics.

One advantage of a mixed-technology chip is that because the two types of circuits are on the same chip, a large number of interconnections between the CMOS and the all-metal circuits can be employed. In addition, interconnects which are common for both types of circuits can be made during a final metal-layer deposition, and the interconnects can be the same size as the internal-circuit interconnects. Multiple islands of all-metal areas (such as SpinRAM) can potentially be on one chip, with the CMOS interfacing to the outside world common to multiple areas. These advantages should be weighed against the complexities of processing the CMOS circuits and the all-metal circuits together.

When the interfacing is done on separate chips, all of the GMR SpinRAM and transpinnor circuits are on one or more all-metal chips and the CMOS interfacing circuitry is on a separate CMOS chip. The main advantage of this approach is that the semiconductor chip processing is totally separated from the all-metal chip processing. Because of the relatively small number of processing steps and the lower temperatures, the manufacturing of the all-metal chip will be a lot less costly.

Another advantage of a separate chip approach relates to the creation of standard CMOS parts for all-metal interfacing similar to the level-shifter products now used for converting between different voltage levels in CMOS. In addition, such multi-chip systems can be placed in hybrid packages. GMR-based circuits (e.g., SpinRAM) can appear to the user as any other CMOS part with the internal advantages of GMR nonvolatility and speed.

These advantages should be weighed against the fact that pad-to-pad wire interconnects between the CMOS chip(s) and the all-metal chip(s) are needed, and that the number of such interconnects is limited because of the size of the pads. In addition, if the chips have to be separately mounted, all connections must be brought outside and routed to the other chip. In any case, whether the mixed-chip or separate-chip approach is selected will depend largely upon the particular application.

Whether a mixed chip technology or separate chips are used for semiconductor-to-transpinnor interfacing, there are a number of common hardware issues.

1. Pads: The area of each of the pads cuts down on the usable active chip area. The tradeoffs involve contact and placement reliability vs. area used. Typically, standard sized pads may be used, depending on the equipment used for bonding.

2. Pinout count: If standard packages are used, there are strong constraints on the pinouts of the chips.

3. Protection components: Components for over-voltage or over-current protection may need to be added, especially when the chip is connected to a sensor or a controller.

4. Pad-performance degradation: By introducing pads between interconnects we may also be introducing contact resistive and capacitive coupling. Even operated in the current mode rather than the voltage mode, this will likely reduce the performance of the interconnection.

There also may be system-level integration issues when transpinnor circuits are interfaced with CMOS to make the transpinnor circuits appear as CMOS subsystems connected to other parts of a larger system. For example, an all-metal SpinRAM chip may be connected to a CMOS interface chip. This chip should make the SpinRAM appear as a standard FLASH chip (which the SpinRAM replaces) to the rest of the system. For this type of integration, not only are the electrical characteristics important, but the basic characteristic of SpinRAM and/or transpinnor logic must also be factored in to meet system requirements. Some of the characteristics may be transparent from a system perspective, but others require taking the characteristics of the all-metal circuits into account.

Figure 34:
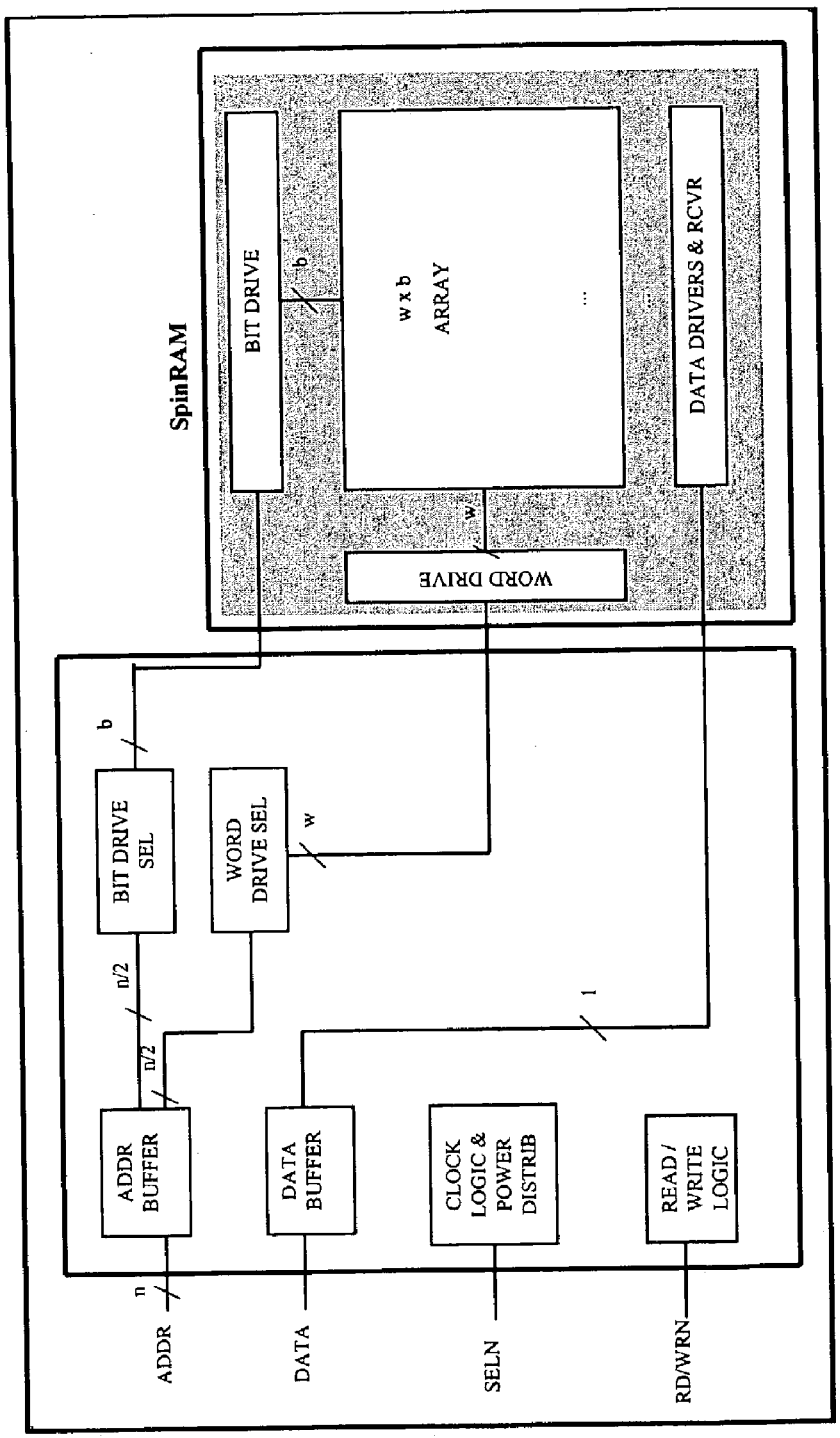

As mentioned above, a variety of SpinRAM designs have been developed. According to various specific embodiments of the invention, a semiconductor chip that interfaces with such SpinRAM chips is provided to facilitate characterization of those designs. According to one such embodiment, the chip is CMOS and makes the SpinRAM look like a conventional SRAM chip to the rest of the system. A simplified block diagram of such a SpinRAM/CMOS interface chip is shown in FIG. 34.

The input interface to external chips is shown on the left-hand side and corresponds to a CMOS SRAM set of controls. The address lines ADDR come from the memory bus system and are controlled by the processing unit in the system. The one-bit data line DATA is tri-stated and receives the input value for a write and sends the output value during a read. The chip select SELN (active low) enables this pair of chips to perform a read or write operation. In a memory system with many banks only one bank is selected at a time. A high signal for the read and write control RD/WRN indicates a read, and a low a write. The memory-operation cycle starts when SELN is pulled low or the RD/WRN signal changes. During changes, the signals on the ADDR lines must be stable.

The blocks in the interface perform the following functions. The ADDR BUFFER block is a buffer register with gating logic to capture the address when a read or write operation starts. The register holds the address stable during the operation. The BIT DRIVE SEL block is an address decoder and an analog current generator that produces the half-select bit (column) drive currents for the SpinRAM column-driver transpinnors. Only one of these drivers is active at a time. The currents generated are dual polarity and two levels corresponding to the read currents for switching the SpinRAM soft layer and corresponding to the write currents for switching the SpinRAM hard layer.

The WORD DRIVE SEL block is an address decoder and an analog current generator that produces the half-select word (row) drive currents for the SpinRAM row-driver transpinnors. It operates similarly to the BIT DRIVE SEL circuitry. The DATA BUFFER block is a 1-bit buffer register with logic to control write-operation currents and to receive the bit read during a read operation. During a read, the tri-stated input line is activated to output the bit read.

The READ/WRITE LOGIC block receives the read or write request along with the SELN signal to start a read or write operation sequence. A state machine sequences through a set of states to drive the SpinRAM memory selectors. For reads, a sequence of operations are performed to determine whether the selected bit is a 1 state or a 0 state. The proper timing sequences for applying the select currents and gating the output onto the DATA line are also generated in this block. The CLOCK LOGIC & POWER DISTRIB block receives control from the SELN signal going low and initiates a sequence of actions conditioned by the RD/WRN pin state.

Figure 35:
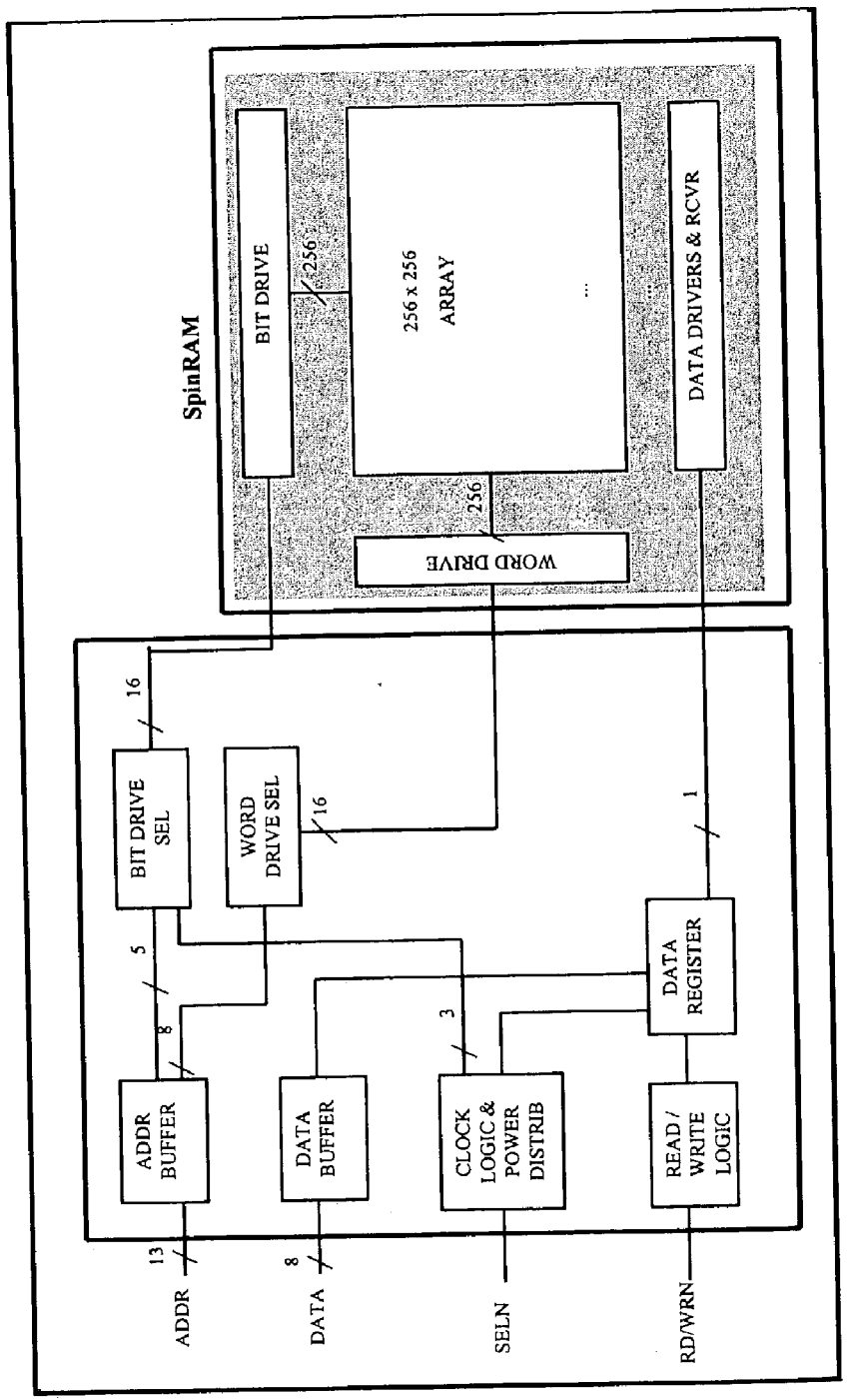

From a higher-level system perspective, this interfaced SpinRAM chip set looks like one slice of a memory subsystem. To make a usable system at least 8 of these subsystems would be put together to make an 8-bit wide memory. For wider memories, more bit slices would be added. For smaller controller or data-logger systems, where not much memory is needed but where the properties of SpinRAM are important (i.e. long retention, fast write, no wearout and no long erase cycles), the above interface chip could be modified to include an 8-bit-wide data path, as shown in FIG. 35. The main difference between the two interface designs is that in FIG. 35 there is an additional 8-bit DATA REGISTER block and the address lines are reduced by 3 bits. Whenever a read or write cycle is started the SpinRAM chip is actually accessed 8 times. The clock-generation logic takes care of generating the least significant 3 bits of the bit address. This is then a 2-chip (one all-metal and one semiconductor) version of an 8 KB memory module. This is the size of modules that will be expected to fit into many control and data logging subsystems that are close to the equipment being controlled or monitored.

Figure 36:
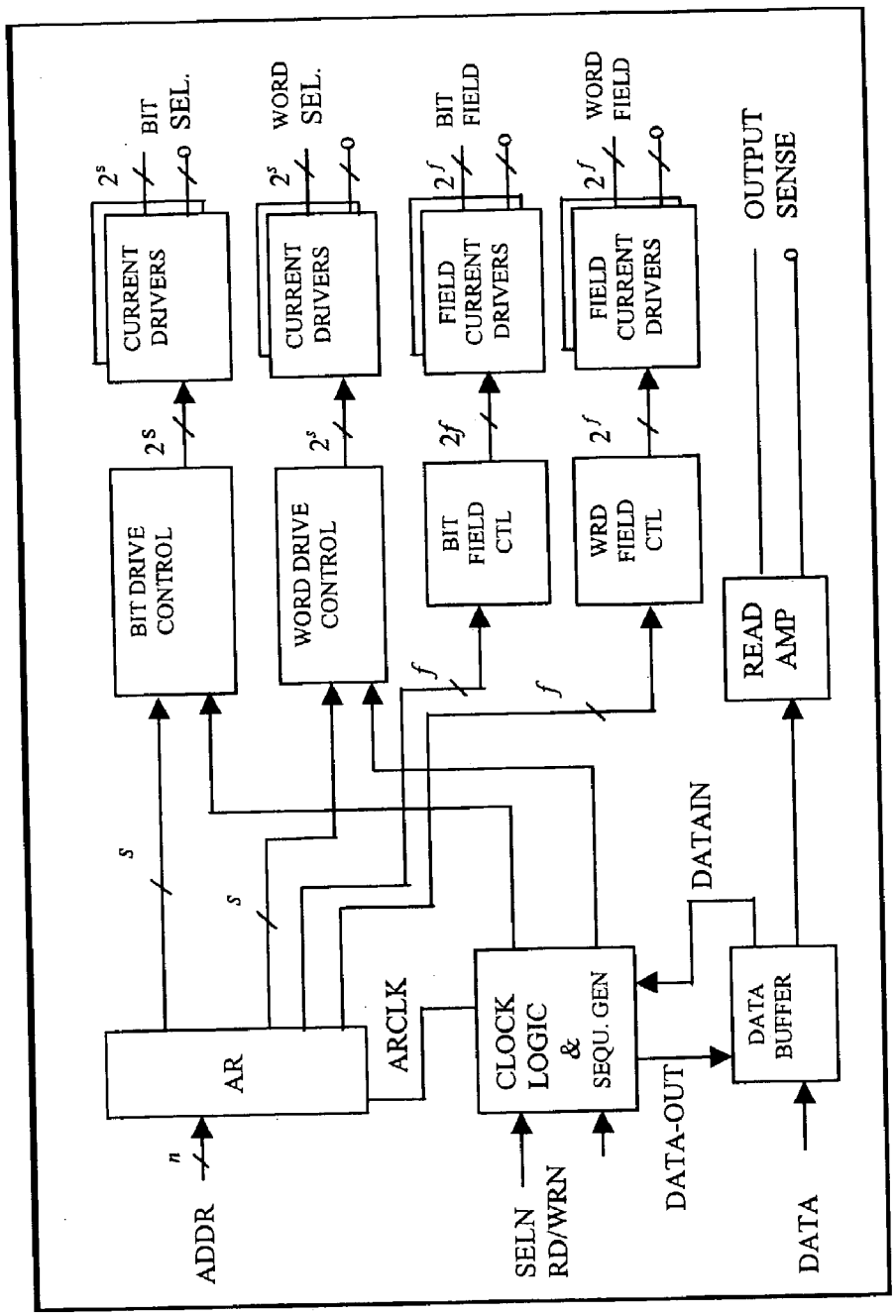

Embodiments of the invention will now be described which provide interface circuitry for more general SpinRAM array sizes. In the following description, the size of the SpinRAM array is left unspecified since the same principles apply, no matter what the size of these larger memory arrays. FIG. 36 is a simplified block diagram illustrating such a design. The external CMOS signals are the same as for the basic SpinRAM interface discussed above and the internal blocks are similar but showing more detail.

The AR block is a holding register for the address coming in. It is assumed that the address is gated into this register at the start of a memory read or write cycle. The width of the incoming address is assumed to be n bits. This interface is applicable for a large range of memory sizes.

Each CURRENT DRIVERS block is a bank of current sources that drive the bit and word select lines in the SpinRAM chip. The size of the currents needed depends on the GMR of the SpinRAM chip and on the size of the memory array. During one read or write operation, only one current source is active for the bit select and another for the word select. Even though there may be many drivers on the chip, the fact that only two are active at any one time keeps the power to the chip down. However, depending on the GMR of the SpinRAM chip, the drive current may be substantial. For example, with a GMR of 20%, micron feature size, a soft-layer switching current of 2 ma, and a hard-layer switching current of 10 ma in the memory array, the current needed in the selector transpinnors is 12.2 and 61 ma for the respective layers. Since the bit lines and word lines need to provide only half-select currents, the current drive needed for read is 6.1 mA (soft-layer switching), and for write is 30.5 mA (hard-layer switching). Note that currents scale down with feature size.

Each FIELD CURRENT DRIVERS block is a bank of current sources that drive the bit field lines and the word field lines in the selected transpinnors. The number of these is relatively small compared to the bit-select and word-select current drivers. Also, the bit field drives the transpinnor input stripline, which is very low resistance, and therefore the drive power needed for the bit field and word field is negligible compared to the bit-select and word-select power. Also, if multiple field lines are used (always a power of 2), all selector transpinnors that may be on must be powered. This multiplies the select driver current needed by the number of field lines used.

The BIT DRIVE CONTROL block is an address decoder and a small amount of logic that controls the CURRENT DRIVERS block for the bit-select lines in the SpinRAM chip. The logic ensures that only one of the current sources for bit selection is on and that the current is the proper strength for soft-layer or hard-layer switching and the proper polarity for writing and reading a 0 or 1. Similarly, the WORD DRIVE CONTROL block is an address decoder which controls the CURRENT DRIVERS block for the word-select lines, and has logic similar to the BIT DRIVE CONTROL block.

The BIT FIELD CTL block is an address decoder and a small amount of logic that controls the FIELD CURRENT DRIVERS block for the bit-field lines in the SpinRAM all-metal chip. The logic ensures that only one of the current sources for bit field activation is on. Similarly, the WORD FIELD CTL block is an address decoder that controls the FIELD CURRENT DRIVERS block for the word-field lines, and has logic similar to the BIT FIELD CTL block.

The CLOCK LOGIC & SEQ GEN block receives the read or write request along with the SELN signal to start a read or write operation sequence. A state machine sequences through a set of states to drive the SpinRAM memory selectors. For read commands a sequence of SpinRAM operations are performed to determine whether the selected bit is a 1 state or a 0 state. The proper timing sequences for applying the select currents and gating the output onto the DATA line are also generated in this block. Note that for a write, the data-bit input is used by the logic to generate either negative or positive bit and word select pulses, depending on whether a 0 or a 1 is written. For a read, the output in the DATA BUFFER is activated to gate the value of the bit read to the external data pin.

The DATA BUFFER block is a 1-bit buffer register with logic to control write operation currents and to receive the bit read during a read operation. During a read, the tri-stated input line is activated to output the bit that was read.

Figure 37:
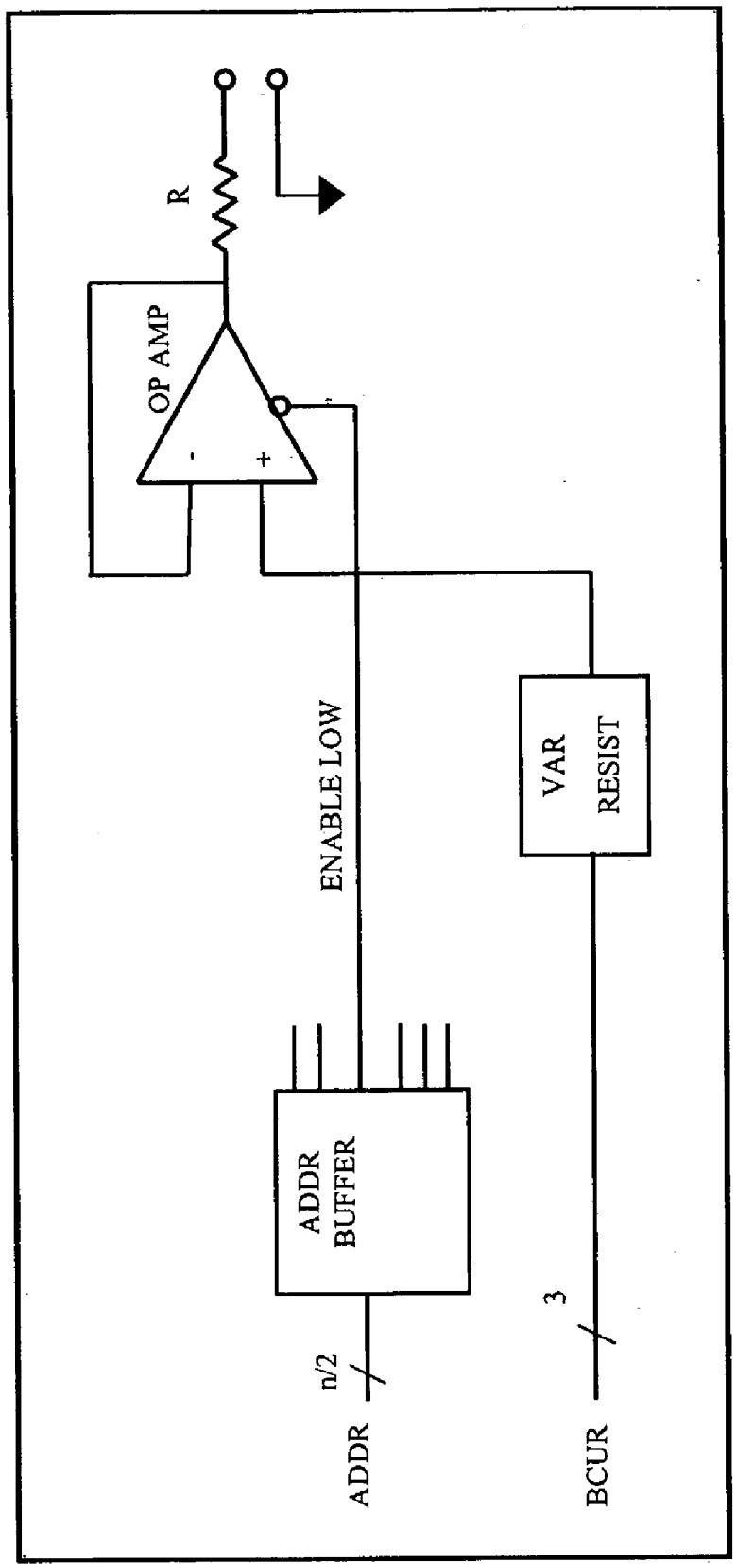

The drive power of the SpinRAM interface is provided by the current drivers and their controls. If a large current is needed, the current drivers will take the largest part of the chip area and will also contribute heavily to propagation delay. The current driver circuitry can be represented as standard CMOS components, as shown in FIG. 37.

Starting with the input signal, an operational amplifier (OP AMP) generates a current for the transpinnor selectors through the resistor R. The return current goes to ground. The OP AMP is controlled by a variable resistor (VAR RESIST) that produces a reference voltage for the four currents needed: +hard, −hard, +soft and −soft. The ENABLE LOW signal from the decoder (ADDR BUFFER) activates the OP AMP selected and keeps all other unselected OP AMPs (not shown) at an output level of 0, so that no current flows in the corresponding selector transpinnors. The input address to the decoder ensures that the specifically addressed current driver is the only one active.

The above is a simplified version of how the current could be generated with off-the-shelf parts. However, on a real CMOS interface chip, the currents will be generated by transistors using reference currents to get precise current values. A possible CMOS current driver is shown in FIG. 38.

Figure 38:
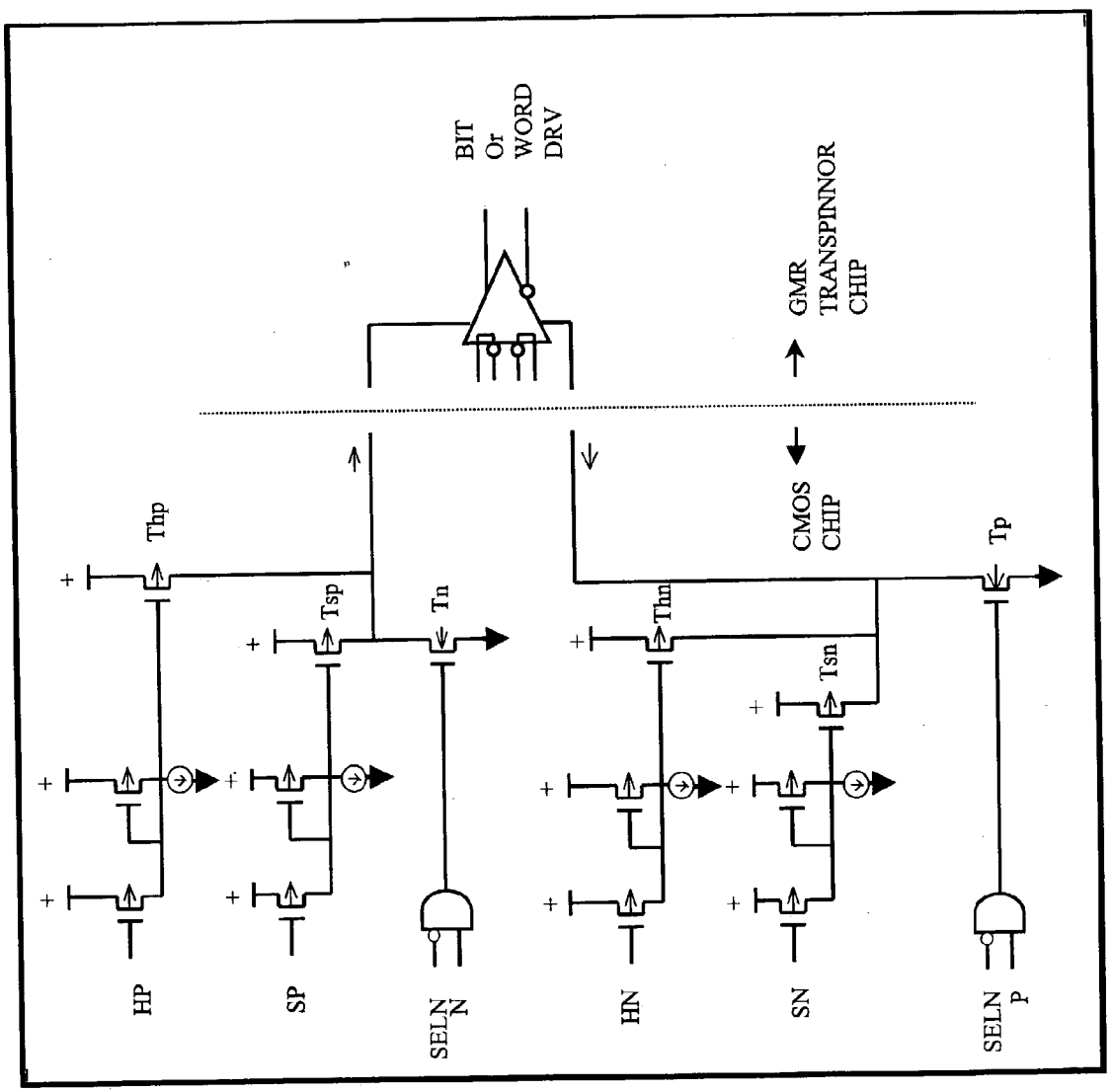

The circuit of FIG. 38 uses field effect transistors (FETs) to control current switching and direction. The overall circuit is like an H bridge, which can either push current into the load transpinnors or pull current out of the load. If a positive current (say soft-switching current) is to be generated, the input control SP (soft positive) is activated to force FET Tsp to generate the proper current to send to the transpinnors. At the same time, the select is activated and the active control P (positive current) forces the FET Tp to sink the return current to ground.

If a negative current (say hard-switching current) is to be generated, the input control HN (hard negative) is activated to force FET Thn to source the right amount of current. At the same time, the select is activated and the active control N (negative current) forces the FET Tn to sink the return current to ground.

Figure 39:
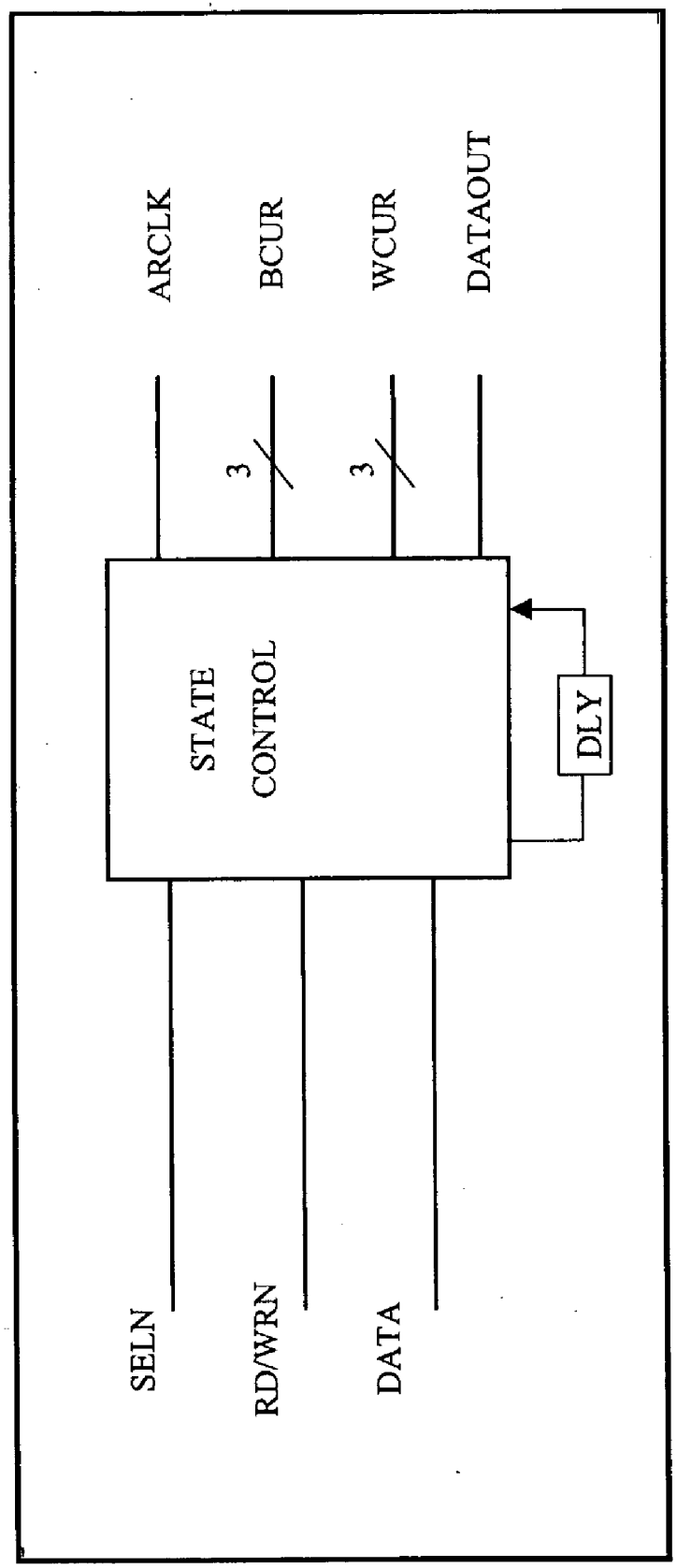

An exemplary implementation of the Clock Logic and Sequence control block is shown in FIG. 39. The main point about this logic block is that timed state changes are used for sequence timing. The state changes that are initiated by the start of read- or write-cycle signals are then distributed as outputs to the rest of the chip as properly timed signals.

Figure 40:
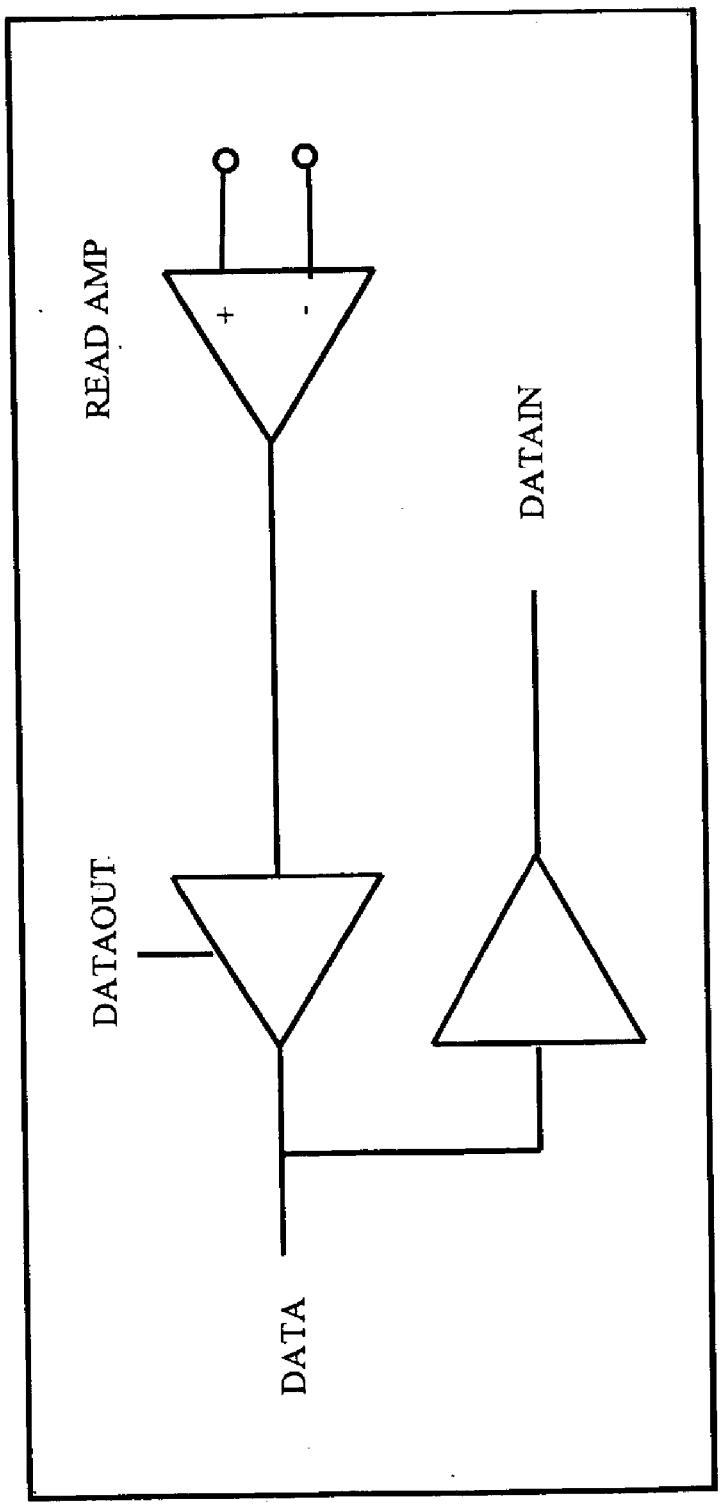

Exemplary implementations of the data buffer and read amplifier blocks are shown in FIG. 40. During a write, the DATA input is gated to DATAIN to control the memory write using hard select transpinnor currents. During a read, the output of the read amplifier, properly timed, is captured, buffered and output onto the DATA bus via an activated tri-state driver.

Figure 41:
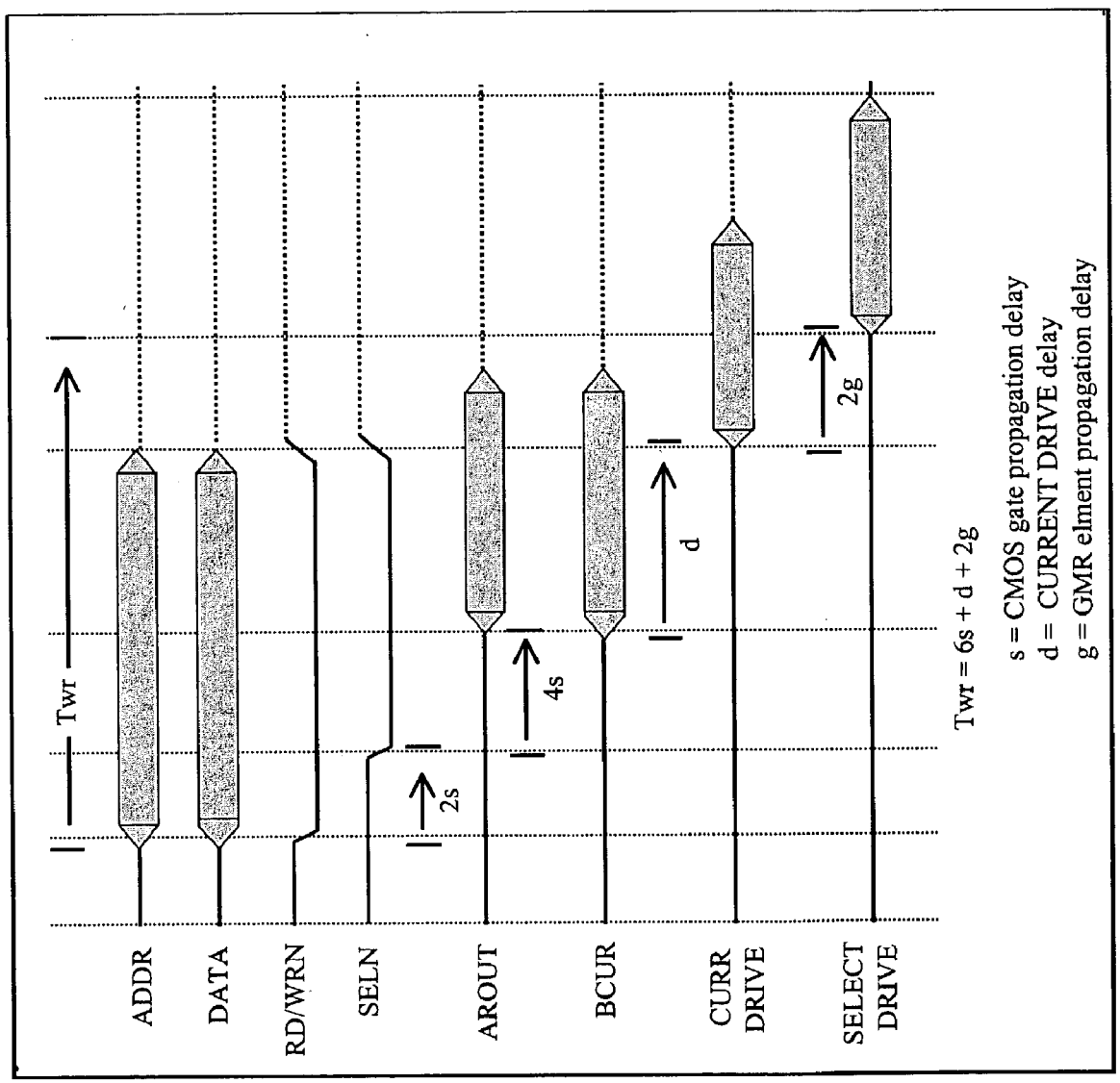

To provide some insight into memory write-cycle timing, an exemplary sequence of traces are provided in FIG. 41. The example illustrated involves both the CMOS interface chip and the all-metal GMR chip. On the CMOS chip each gate is assumed to have a propagation delay of "s" and the current driver a delay of "d." In the GMR chip, the GMR element delay is "g." For a semiconductor-gate propagation time of 1 ns (s=1), a driver delay of 8 ns (d=8), and a GMR-element propagation delay of 2 ns (g=2), the calculated write cycle time Twr is 18 ns.

Figure 42:
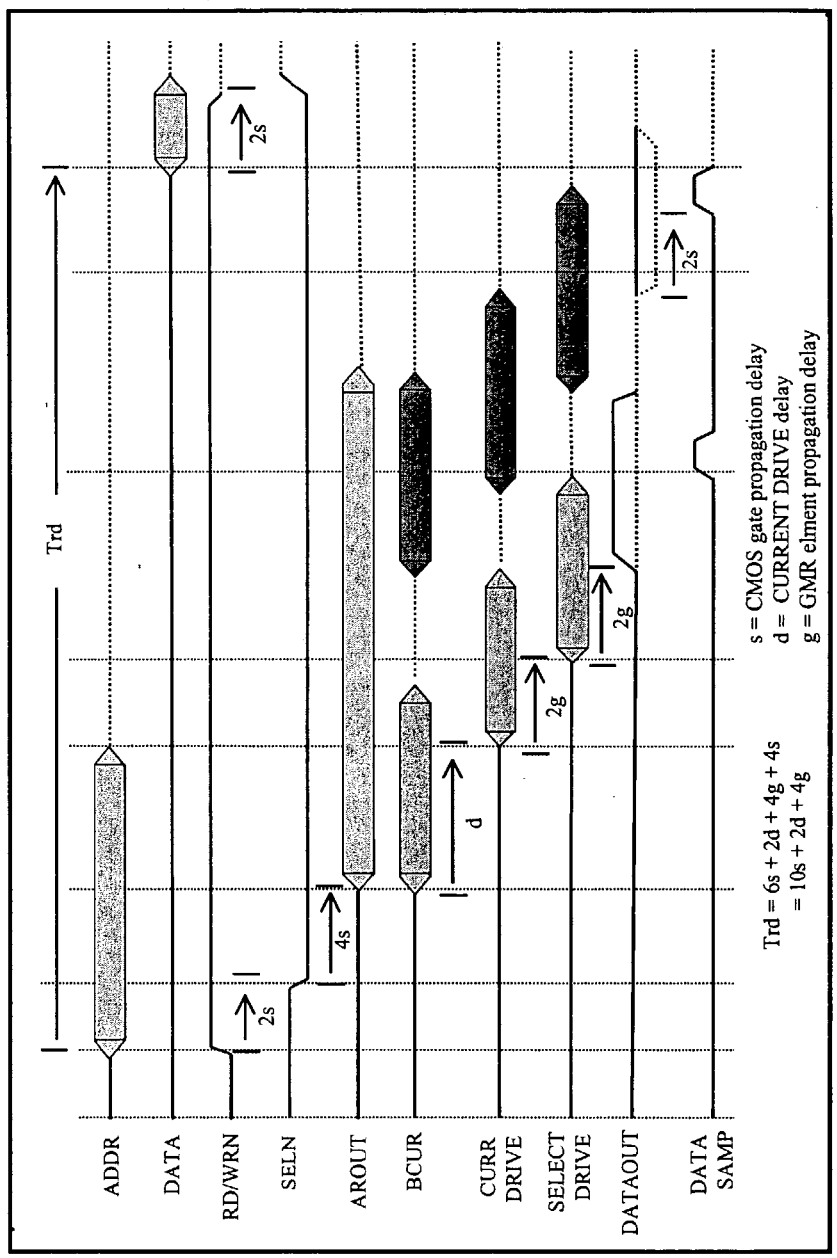

As described in U.S. Pat. No. 6,483,740 incorporated herein by reference above, there are multiple SpinRAM designs, which differ in their speeds and densities: SpinRAM1 as replacement for SRAM; SpinRAM2 as replacement for flash and DRAM; and SpinRAM3 as replacement for hard disks. The read-cycle timing for an exemplary SpinRAM2 is shown in FIG. 42. The read is again being performed by both the CMOS interfacing chip and the all-metal SpinRAM chip with the same conventions as for the write cycle diagram.

The formulas in the diagram are an approximation of the components of the delays. For a semiconductor-gate propagation time of 1 ns (s=1), a driver delay of 4 ns (d=4), and a GMR element propagation delay of 2 ns (g=2) the calculated read cycle time Trd is 26 ns. Note that a smaller driver delay was used for the read than the write since the drive currents for the read are significantly smaller than for writes. FIG. 42 also shows that if the target system can use read pipelining, significant improvements in read speed are possible.

From the foregoing description, it should be apparent that all-metal electronics is an enabling technology that transcends applications. It will have significant performance and cost advantages over most of the devices in the electronics and storage markets presently held by the semiconductor and hard-drive technologies. The transpinnor/semiconductor interfaces described herein make possible a successful market transition to such all-metal technology.

In the near-term, the interface technology of the present invention may be employed to provide SpinRAM memory interfacing to conventional systems. These interfaces may also be employed for controlling and monitoring all-metal chip components while they are operating, to better characterize them and to get more experimental data, thus contributing to the maturation of this nascent technology. In the long-term, the interface technology described herein may be employed to provide all-metal subsystem interfaces to inputs and outputs, and to incorporate SpinRAM subsystems as nonvolatile memory in systems.

More generally, the potential of transpinnor electronics and SpinRAM to replace conventional electronic systems is exceedingly high. That is, virtually every kind of electronic system conceivable may be constructed using these elements. Thus, the interface technology described herein may be employed to facilitate the integration of systems and subsystems employing transpinnors and SpinRAM with more conventional semiconductor technologies.

While the invention has been particularly shown and described with reference to specific embodiments thereof, it will be understood by those skilled in the art that changes in the form and details of the disclosed embodiments may be made without departing from the spirit or scope of the invention. For example, several embodiments described herein refer specifically to the interfacing of transpinnors and SpinRAM with CMOS technology. However, as described above, such embodiments are intended to be illustrative rather than restrictive. That is, one of ordinary skill in the art would readily be able to apply the techniques described herein to implement interfaces to other semiconductor families, e.g., TTL and ECL. Thus, such interfaces are contemplated to be within the scope of the invention. In addition, the specific circuits described herein are intended to be exemplary. Many variations of these circuits within the skill of one familiar with the art can achieve the required functionality. Therefore, such variations are also within the scope of the present invention.

Finally, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. An electronic system, comprising:
   semiconductor circuitry characterized by first signals;
   all-metal circuitry characterized by second signals and comprising a plurality of solid-state devices, each solid-state device comprising a network of thin-film elements, at least one thin-film element in each solid-state device exhibiting magnetoresistance, each solid-state device further comprising a conductor magnetically coupled to the at least one thin-film element for controlling operation of the solid-state device, wherein each solid-state device is operable to generate an output signal which is a function of a resistive imbalance among the thin-film elements and which is proportional to a power current in the network of thin-film elements; and
   interface circuitry for connecting the semiconductor circuitry to the all-metal circuitry and converting between the first signals and the second signals.

2. The electronic system of claim 1 wherein the interface circuitry includes a first interface circuit for converting the second signals to the first signals.

3. The electronic system of claim 2 wherein the second signals comprise short-circuit output currents, and the first interface circuit presents a low input impedance to the all-metal circuitry.

4. The electronic system of claim 3 wherein the first interface circuit comprises an operational amplifier with feedback and having the non-inverting input grounded, the low input impedance being at the inverting input.

5. The electronic system of claim 3 wherein the first interface circuit comprises a transresistance amplifier.

6. The electronic system of claim 5 wherein the transresistance amplifier comprises an LM359 amplifier.

7. The electronic system of claim 5 wherein the transresistance amplifier comprises two operational amplifiers connected in charge amplifier configurations which present a self-centering short-circuit load to the all-metal circuitry, and a comparator for converting output signals from the operational amplifiers to the first signals.

8. The electronic system of claim 5 wherein the transresistance amplifier comprises first and second transresistors, and a comparator, the first transresistor presenting the low input impedance to the all-metal circuitry and an output signal to the comparator, and the second transresistor providing a reference signal to the comparator.

9. The electronic system of claim 2 wherein the second signals comprise open-circuit output voltages, and the first interface circuit presents a high input impedance to the all-metal circuitry.

10. The electronic system of claim 9 wherein the first interface circuit comprises a comparator.

11. The electronic system of claim 2 wherein the first signals and second signals comprises first and second logic signals.

12. The electronic system of claim 11 wherein the first logic signals comprise any of CMOS logic signals, TTL logic signals, and ECL logic signals.

13. The electronic system of claim 2 wherein the first signals and second signals comprises first and second analog signals.

14. The electronic system of claim 1 wherein the interface circuitry includes a first interface circuit for converting the first signals to the second signals.

15. The electronic system of claim 14 wherein the first signals comprise voltages and the second signals comprise currents, the first interface circuit being operable to convert the voltages to currents.

16. The electronic system of claim 15 wherein the first interface circuit comprises a buffer and an inverter for converting a first one of the voltages to a differential signal, and resistors for converting the differential signal to a first one of the currents.

17. The electronic system of claim 15 wherein the first interface circuit comprises a buffer for converting a first one of the voltages to a single-ended signal, and a resistor for converting the single-ended signal to a first one of the currents.

18. The electronic system of claim 15 wherein the first interface circuit comprises first and second current sources which are operable to alternately provided first and second ones of the currents to the all-metal circuitry.

19. The electronic system of claim 18 wherein the first and second current sources employ a PTAT circuit.

20. The electronic system of claim 15 wherein the all-metal circuitry further comprises a plurality of magnetoresistive memory elements, and the first signals comprise read signals and write signals, the first interface circuit being operable to generate first ones of the currents having a first level sufficient to effect reading of the memory elements, and second ones of the currents having a second level sufficient to effect writing to the memory elements.

21. The electronic system of claim 14 wherein the first signals and second signals comprises first and second logic signals.

22. The electronic system of claim 21 wherein the first logic signals comprise any of CMOS logic signals, TTL logic signals, and ECL logic signals.

23. The electronic system of claim 14 wherein the first signals and second signals comprises first and second analog signals.

24. The electronic system of claim 1 wherein the semiconductor circuitry and the all-metal circuitry are integrated on a single substrate.

25. The electronic system of claim 1 wherein the semiconductor circuitry and the all-metal circuitry are on different substrates.

26. The electronic system of claim 1 wherein the resistive imbalance among the thin-film elements in selected ones of the solid-state devices corresponds to an input current flowing in the conductor.

27. The electronic system of claim 26 wherein the power current is continuously applied to the network of thin-film elements in the selected solid-state devices.

28. The electronic system of claim 1 wherein the resistive imbalance among the thin-film elements in selected ones of the solid-state devices corresponds to a state stored in the selected solid-state devices.

29. The electronic system of claim 28 wherein the power current is applied as discrete pulses to the network of thin-film elements in the selected solid-state devices.

30. An electronic system, comprising:
semiconductor circuitry characterized by first logic signals comprising voltages;
all-metal circuitry characterized by second logic signals comprising currents, the all-metal circuitry comprising a plurality of solid-state devices, each solid-state device comprising a network of thin-film elements, at least one thin-film element in each solid-state device exhibiting magnetoresistance, each solid-state device further comprising a conductor magnetically coupled to the at least one thin-film element for controlling operation of the solid-state device to generate the currents; and
interface circuitry for connecting the semiconductor circuitry to the all-metal circuitry and converting the first logic signals to the second logic signals.

31. An electronic system, comprising:
semiconductor circuitry characterized by first logic signals comprising voltages;
all-metal circuitry characterized by second logic signals comprising short-circuit output currents, the all-metal circuitry comprising a plurality of solid-state devices, each solid-state device comprising a network of thin-film elements, at least one thin-film element in each solid-state device exhibiting magnetoresistance, each solid-state device further comprising a conductor magnetically coupled to the at least one thin-film element for controlling operation of the solid-state device to generate the short-circuit output currents; and
interface circuitry for connecting the semiconductor circuitry to the all-metal circuitry and converting the second logic signals to the first logic signals, the interface circuitry presenting a low input impedance to the all-metal circuitry.

32. An electronic system, comprising:
semiconductor circuitry characterized by first logic signals comprising first voltages;
all-metal circuitry characterized by second logic signals comprising open-circuit output voltages, the all-metal circuitry comprising a plurality of solid-state devices, each solid-state device comprising a network of thin-film elements, at least one thin-film element in each solid-state device exhibiting magnetoresistance, each solid-state device further comprising a conductor magnetically coupled to the at least one thin-film element for controlling operation of the solid-state device to generate the open-circuit output voltages; and
interface circuitry for connecting the semiconductor circuitry to the all-metal circuitry and converting the second logic signals to the first logic signals, the interface circuitry presenting a high input impedance to the all-metal circuitry.

33. An electronic system, comprising:
semiconductor circuitry characterized by first read and write signals;
all-metal circuitry characterized by second read and write signals, the all-metal circuitry comprising an array of memory elements, and a plurality of solid-state devices configured to facilitate reading of and writing to the memory elements using the second read and write signals, each solid-state device comprising a network of thin-film elements, at least one thin-film element in each solid-state device exhibiting magnetoresistance, each solid-state device further comprising a conductor magnetically coupled to the at least one thin-film element for controlling operation of the solid-state device; and
interface circuitry for connecting the semiconductor circuitry to the all-metal circuitry and converting between the first read and write signals and the second read and write signals.

34. The electronic system of claim 33 wherein the interface circuitry comprises address buffer circuitry, bit drive selection circuitry, word drive selection circuitry, data buffer circuitry, read/write logic circuitry, and clock and power distribution circuitry.

35. The electronic system of claim 34 wherein the memory elements comprise multi-layer thin-film structures exhibiting magnetoresistance, and wherein each memory element is operable to store at least one bit of information using magnetization orientations of pairs of layers.

36. The electronic system of claim 35 wherein the bit drive selection circuitry is operable to convert selected ones of the first read signals and selected ones of the first write signals to effect switching of the memory elements in corresponding columns in the array.

37. The electronic system of claim 36 wherein the bit drive selection circuitry comprises a plurality of bit line drivers, each bit line driver being operable to generate four bit line currents to effect switching of various combinations of the pairs of layers in a corresponding column.

38. The electronic system of claim 37 wherein each bit line driver comprises an operational amplifier, a fixed resistor, and a variable resistor, the variable resistor being operable to provide reference voltages to the operational amplifier corresponding to each of the bit line currents.

39. The electronic system of claim 35 wherein the word drive selection circuitry is operable to convert selected ones of the first read signals and selected ones of the first write signals to effect switching of the memory elements in corresponding rows in the array.

40. The electronic system of claim 39 wherein the word drive selection circuitry comprises a plurality of word line drivers, each word line driver being operable to generate four word line currents to effect switching of various combinations of the pairs of layers in a corresponding row.

41. The electronic system of claim 40 wherein each word line driver comprises an operational amplifier, a fixed resistor, and a variable resistor, the variable resistor being operable to provide reference voltages to the operational amplifier corresponding to each of the word line currents.

42. In an electronic system comprising semiconductor circuitry and all-metal circuitry comprising a plurality of solid-state deviers, each solid-state deviers comprising a network of thin-film elements, at least one thin-film element in each solid-state deviers exhibiting giant magnetoresistance, each solid-state deviers further comprising a conductor solid-state deviers coupled to the at least one thin-film element for controlling operation of the solid-state deviers, a method for controlling and monitoring the all-metal circuitry, comprising:

generating first control signals using the semiconductor circuitry;

converting the first control signals to second control signals for controlling operation of the all-metal circuitry, thereby resulting in first operation signals;

converting the first operation signals to second operation signals suitable for use by the semiconductor circuitry; and monitoring the second operation signals.

* * * * *

UNITED STATES PATENT AND TRADEMARK OFFICE
CERTIFICATE OF CORRECTION

PATENT NO. : 7,224,566 B2  Page 1 of 1
APPLICATION NO. : 10/419282
DATED : May 29, 2007
INVENTOR(S) : Barna et al.

It is certified that error appears in the above-identified patent and that said Letters Patent is hereby corrected as shown below:

In line 3 of claim 42 (column 38, line 5) change "deviers" to --devices--.

In line 3 of claim 42 (column 38, line 5) change "deviers" to --device--.

In line 5 of claim 42 (column 38, line 7) change "deviers" to --device--.

In line 5 of claim 42 (column 38, line 7) delete "giant".

In line 6 of claim 42 (column 38, line 8) change "deviers" to --device--.

In line 7 of claim 42 (column 38, line 9) change "solid state deviers" to --magnetically--.

In line 8 of claim 42 (column 38, line 10) change "deviers" to --device--.

Signed and Sealed this

Twenty Second Day of April, 2008

JON W. DUDAS
*Director of the United States Patent and Trademark Office*